United States Patent
Xie et al.

(10) Patent No.: US 12,489,059 B2
(45) Date of Patent: Dec. 2, 2025

(54) VERTICAL MEMORY DEVICES AND METHOD OF FABRICATION THEREOF

(71) Applicant: Yangtze Memory Technologies Co., Ltd., Hubei (CN)

(72) Inventors: Jingtao Xie, Wuhan (CN); Bingjie Yan, Wuhan (CN); Wenxi Zhou, Wuhan (CN); Di Wang, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 664 days.

(21) Appl. No.: 17/848,008

(22) Filed: Jun. 23, 2022

(65) Prior Publication Data

US 2023/0420372 A1    Dec. 28, 2023

(51) Int. Cl.

| | |
|---|---|
| H01L 23/522 | (2006.01) |
| H01L 21/768 | (2006.01) |
| H01L 23/532 | (2006.01) |
| H01L 23/535 | (2006.01) |
| H01L 27/11556 | (2017.01) |
| H01L 27/11582 | (2017.01) |
| H10B 43/27 | (2023.01) |

(52) U.S. Cl.
CPC ........... *H01L 23/535* (2013.01); *H10B 43/27* (2023.02)

(58) Field of Classification Search
CPC ........ H10B 43/30; H10B 41/30; H10B 43/27; H10B 41/27; H01L 23/535; H01L 23/528; H01L 23/5283; H01L 23/5286
See application file for complete search history.

(56) References Cited

U.S. PATENT DOCUMENTS

| 2017/0243881 A1* | 8/2017 | Shin ........................ H10B 43/30 |
| 2019/0378857 A1* | 12/2019 | Lee ....................... H10D 64/258 |
| 2021/0074720 A1 | 3/2021 | Son et al. |

FOREIGN PATENT DOCUMENTS

| TW | 2021 45524 A | 12/2021 |
| TW | 202215547 A | 4/2022 |

OTHER PUBLICATIONS

Combined Taiwanese Office Action and Search Report issued on Mar. 6, 2024 in Taiwanese Patent Application No. 111149586 (with English Translation of Category of Citied Documents), 5 pages.

* cited by examiner

Primary Examiner — John A Bodnar
(74) Attorney, Agent, or Firm — Oblon, McClelland, Maier & Neustadt, L.L.P.

(57) ABSTRACT

Aspects of the disclosure provide a semiconductor device. The semiconductor device includes a stack structure and a contact structure. The stack structure comprises interleaved gate layers and insulating layers. The contact structure comprises a conductive structure and one or more insulating structures. The conductive structure can extend through the stack structure and form a conductive connection with one of the gate layers. The one or more insulating structures surround the conductive structure and electrically isolate the conductive structure from remaining ones of the gate layers. The one or more insulating structures further include one or more first insulating structures. Each of the one or more first insulating structures is disposed between an adjacent pair of the insulating layers, and the one or more first insulating structures are disposed on a first side of the one of the gate layers.

20 Claims, 68 Drawing Sheets

VERTICAL MEMORY DEVICES AND METHOD OF FABRICATION THEREOF

BACKGROUND

Semiconductor manufacturers developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in a stair-step form to facilitate forming contacts on the respective gate layers. The contacts are used to connect driving circuitry to the respective gate layers for controlling the stacked memory cells.

SUMMARY

Aspects of the disclosure provide a semiconductor device. The semiconductor device comprises a stack structure and a contact structure. The stack structure comprises interleaved gate layers and insulating layers. The contact structure comprises a conductive structure and one or more insulating structures. The conductive structure extends through the stack structure and forms a conductive connection with one of the gate layers, and the one or more insulating structures surrounds the conductive structure and electrically isolates the conductive structure from remaining ones of the gate layers.

In an embodiment, the contact structure further comprises a core structure disposed within the conductive structure. The core structure extends through the stack structure, and a material of the core structure is different from a material of the conductive structure.

In an embodiment, the one or more insulating structures further include one or more first insulating structures, each of the one or more first insulating structures is disposed between an adjacent pair of the insulating layers, and the one or more first insulating structures are disposed on a first side of the one of the gate layers.

In an embodiment, the one or more insulating structures further include a second insulating structure, and the second insulating structure extends through one or more of the gate layers that are on a second side of the one of the gate layers.

In an example, the conductive structure further includes protrusions, and each of the protrusions is surrounded by a respective one of the one or more first insulating structures.

In an embodiment, the one or more insulating structures further include a second insulating structure, and the second insulating structure extends through one or more of the gate layers that are on a second side of the one of the gate layers.

In an example, each of the gate layers further comprises a high dielectric constant (high-k) gate insulator layer and a metal layer.

In an embodiment, the stack structure includes pairs of gate layers and insulating layers formed along a vertical direction. Each pair includes a gate layer and an adjacent insulating layer that is on a first side along the vertical direction. The pairs of gate layers and insulating layers are stacked in a stair-step form such that for each pair, an adjacent pair that is on the first side along the vertical direction extends beyond the pair along a direction that is perpendicular to the vertical direction. The conductive structure forms the conductive connection with the one of the gate layers at a stair-step portion of the one of the gate layers.

Aspects of the disclosure provide a method of forming a semiconductor device. The method comprises forming a hole through a stack structure comprising interleaved first layers and insulating layers of the semiconductor device. The hole is surrounded by and adjacent to one or more insulating structures and an electrical connection structure that is in one of the first layers. The method includes depositing one or more conductive materials into the hole to form a conductive structure that is conductively connected to the electrical connection structure.

In an embodiment, the method further comprises forming the stack structure, and replacing the first layers with gate layers. The first layers are sacrificial layers, and the forming the hole further includes: forming a first portion of the hole where the first portion penetrates into the one of the sacrificial layers; forming a first recessed region in the one of the sacrificial layers where the first recessed region is connected to the first portion of the hole; forming the electrical connection structure in the first recessed region; removing remaining portions of the sacrificial layers and the insulating layers that are beneath the first portion of the hole to form a second portion of the hole that extends through the stack structure. The forming the hole further includes forming one or more first insulating structures of the one or more insulating structures by oxidizing one or more of the sacrificial layers that are adjacent to the second portion of the hole, or forming one or more second recessed regions in respective sacrificial layers that are adjacent to the second portion of the hole and forming the one or more first insulating structures in the respective one or more second recessed regions.

In an example, the method further comprises forming a core structure within the conductive structure where the core structure extends through the stack structure, and a material of the core structure is different from a material of the conductive structure.

In an example, the method further comprises for each sacrificial layer, removing portions of the sacrificial layers and the insulating layers that are above a first edge of the sacrificial layer such that the sacrificial layers and the insulating layers are stacked in a stair-step form.

In an example, the first layers are gate layers, and the one of the first layers is one of the gate layers. The forming the hole further includes: forming sacrificial layers that are to be replaced by the gate layers and the insulating layers; forming an initial hole throughout the sacrificial layers and the insulating layers where the initial hole is surrounded by and adjacent to the one or more insulating structures and a sacrificial structure that is in one of the sacrificial layers to be replaced by the one of the gate layers; filling the initial hole with one or more sacrificial materials that cover sidewalls of the one or more insulating structures and the sacrificial structure; replacing the sacrificial layers and the sacrificial structure with the gate layers where the gate layers include high dielectric constant (high-k) gate insulator layers and corresponding metal layers and a portion of the high-k gate insulator layer in the one of the gate layers is adjacent to the one or more sacrificial materials; and removing the one or more sacrificial materials and the portion of the high-k gate insulator layer in the one of the gate layers to form the hole.

In an example, the method further comprises for each sacrificial layer, removing portions of the sacrificial layers and the insulating layers that are above a first edge of the sacrificial layer such that the sacrificial layers and the insulating layers are stacked in a stair-step form.

In an example, the conductive structure further includes protrusions, and each of the protrusions is surrounded by a respective one of the one or more insulating structures that is disposed beneath the electrical connection structure.

Aspects of the disclosure provide a memory system that includes a controller coupled with the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
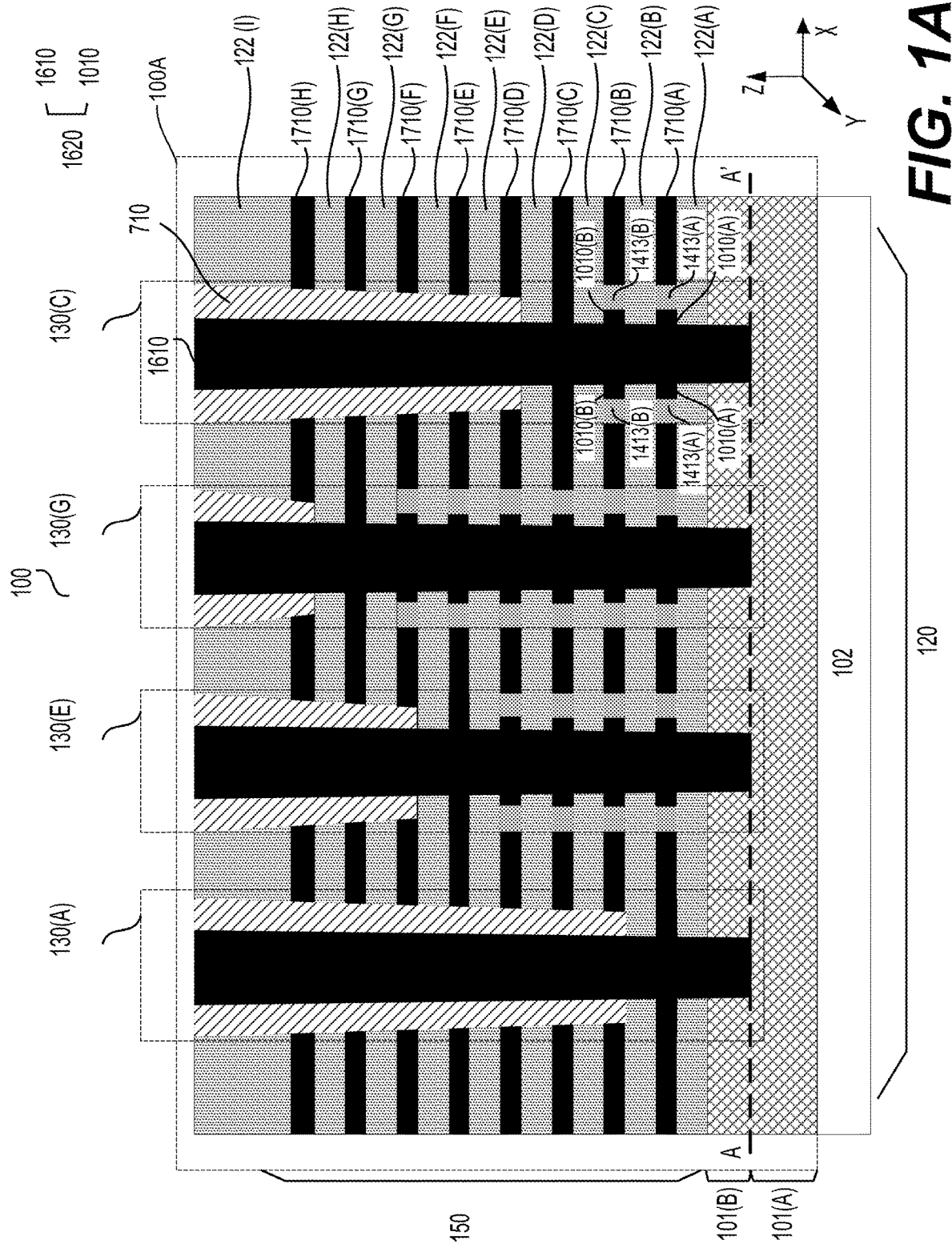
FIG. 1A shows a vertical cross-sectional view of a portion 100A of a semiconductor device 100 according to an exemplary embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A vertical memory device (e.g., a 3D NAND memory device) can include core region(s) having vertical memory cell strings and staircase region(s) for making connections to gates of memory cells in the vertical memory cell strings. Contacts are formed in the staircase region(s) to connect driving circuitry in periphery circuitry to the gates of the memory cells via gate layers.

Various fabrication technologies, such as gate-first fabrication technology, gate-last fabrication technology, and the like are developed to fabricate the vertical memory device. The gate-first fabrication technology forms the gates of the memory cells earlier than channels of the memory cells. The gate-last fabrication technology uses sacrificial layers (also referred to as sacrificial gates) to facilitate the formation of the channels for the memory cells; and replaces the sacrificial layers with real gates for the memory cells after the formation of the channels. The replacement of the sacrificial layers with the real gates includes a removal of the sacrificial layers, and then a formation of the real gates. To support the staircase region from collapse when the sacrificial layers are removed, dummy channels (also referred to as dummy channel structures) can be formed in the staircase region.

In related technologies, a contact and a dummy channel in the staircase region(s) are two structures physically separated within an X-Y plane parallel to a surface of the vertical memory device. In an example, the surface is of the substrate of the vertical memory device.

Aspects of the disclosure provide a contact structure that includes a dummy channel (DCH) and a contact (CT) DCH-CT in the staircase region of a semiconductor device.

The contact structure that includes the dummy channel and the contact can also be referred to as a combined DCH-CT structure or a DCH-CT structure. The combined DCH-CT structure connects the driving circuitry to one gate of the memory cells, and thus functions as the contact structure while providing support for the staircase region, for example in the gate-last fabrication technology, and functioning as the dummy channel. The semiconductor device includes a stack structure comprising interleaved gate layers and insulating layers. The combined DCH-CT structure can include a conductive structure extending through the stack structure, for example, extending in a Z direction (also referred to as a vertical direction) that is perpendicular to the X-Y plane, and forming a conductive connection with one of gate layers. The combined DCH-CT structure can include insulating structure(s) that surround the conductive structure and electrically isolate the conductive structure from remaining one(s) of the gate layers.

In an example, the combined DCH-CT structure further includes a core structure within the conductive structure. The core structure extends through the stack structure, for example, in the Z direction through the gate layers and the insulating layers. A material of the core structure can be different from a material of the conductive structure. In an example, each of the gate layers further comprises a high dielectric constant (high-k) gate insulator layer and a metal gate (MG) electrode (or a metal layer). The MG electrode (or the metal layer) can be formed using any suitable deposition process but not limited to, chemical vapor deposition (CVD), physical vapor deposition (PVD), atomic layer deposition (ALD), an e-beam evaporation, a sputtering, a diffusion, or any combination thereof.

The insulating structure(s) can further include first insulating structure(s) where each of the first insulating structure(s) is disposed between an adjacent pair of the insulating layers. The first insulating structure(s) can be disposed on a first side of the one of the gate layers, for example, beneath or above the one of the gate layers.

The insulating structure(s) can further include a second insulating structure that extends through one or more of the gate layers that are on a second side of the one of the gate layers where the second side is opposite to the first side. For example, the first insulating structure(s) are disposed beneath the one of the gate layers, and the second insulating structure(s) are disposed above the one of the gate layers.

In an example, the stack structure includes pairs of gate layers and insulating layers formed along the Z direction. Each pair includes a gate layer and an adjacent insulating layer that is on the first side along the Z direction. The pairs of gate layers and insulating layers are stacked in a stair-step form in the staircase region such that, for each pair, an adjacent pair that is on the first side along the Z direction extends beyond the pair along a direction that is perpendicular to the vertical direction, and the conductive structure forms the conductive connection with the one of the gate layers at a stair-step portion of the one of the gate layers.

As conductive material(s), such as metal material(s) (e.g., W) in the conductive structure have a larger Young's modulus than material(s) used in dummy channels in related technologies, the combined DCH-CT structure can provide stronger support and mitigate bending of the gate layers. Combining multiple structures (e.g., a dummy channel and a contact) into a single structure (i.e., the contact structure or the combined DCH-CT structure) can relax a design window associated with the dummy channels and the contacts, resulting in simpler structures, a reduction of manufacturing steps, and thus cost reduction. Further, the combined DCH-CT structure can be formed on a face-side of the vertical memory device.

FIG. 1A shows a vertical cross-sectional view of a portion 100A of a semiconductor device (or a memory device) 100 according to an exemplary embodiment of the disclosure.

FIG. 1A shows a vertical cross-sectional view of a semiconductor device 100 in accordance an exemplary embodiment of the disclosure. An X-Y plane of an insulating layer 101 extends in an X direction and a Y direction. The Z direction is perpendicular to the X-Y plane. A vertical cross-section (e.g., an X-Z plane) is perpendicular to the X-Y plane.

The semiconductor device 100 can refer to a memory device. The semiconductor device 100 can include a structure 102 that is adjacent to the insulating layer 101. In an example, the structure 102 is a semiconductor layer 102, such as a polysilicon layer. In an example, the structure 102 is a substrate 102. The substrate 102 can be any suitable substrate, such as a silicon (Si) substrate, a germanium (Ge) substrate, a silicon-germanium (SiGe) substrate, and/or a silicon-on-insulator (SOI) substrate. A material of the substrate 102 may include, for example, a Group IV semiconductor, a Group III-V compound semiconductor, or a Group II-VI oxide semiconductor. The Group IV semiconductor may include Si, Ge, or SiGe. The substrate 102 may be a bulk wafer or an epitaxial layer. In some embodiments, the substrate 102 can be a semiconductor layer, such as a polysilicon layer.

In various embodiments, the semiconductor device 100 includes three dimensional (3D) NAND memory device formed on the structure 102 and the semiconductor device 100 can be referred to as a vertical memory device. The semiconductor device 100 can include other suitable circuitry, such as logic circuitry, power circuitry, and the like that is formed on the structure 102, and is suitably coupled with the 3D NAND memory circuitry. Generally, the 3D NAND memory circuitry includes a memory array and peripheral circuitry (e.g., address decoder, driving circuits, sense amplifier and the like). The memory array is formed in a core region as an array of vertical memory cell strings. In an example, the peripheral circuitry is formed in a peripheral region. Besides the core region and the peripheral region, the semiconductor device 100 includes a staircase region 120 to facilitate making contacts to the gates of the memory cells in the vertical memory cell strings. The gates of the memory cells in the vertical memory cell strings correspond to word lines for the NAND memory architecture.

In the core region, a plurality of channel structures is formed in gate layers and insulating layers that are stacked alternatingly in the Z direction. In some embodiments, each channel structure has a pillar shape that extends in the Z direction. The plurality of channel structures can be disposed separate from each other along the X direction and the Y direction, and can be disposed in some suitable array shape, such as a matrix array shape along the X direction and the Y direction, a zig-zag array shape along the X or Y direction, a beehive (e.g., hexagonal) array shape, and the like.

In some embodiments, each of the channel structures includes a gate dielectric layer, a semiconductor layer, and an insulating layer that have a circular shape in the X-Y plane, and extend in the Z direction. The gate dielectric layer is formed on a sidewall of the channel structure, and includes multiple layers, such as a tunnel insulating layer (e.g., silicon oxide), a charge storage layer (e.g., silicon nitride), and a blocking insulating layer (e.g., silicon oxide) that are sequentially stacked from the sidewall. In an example, the gate dielectric layer has an oxide-nitride-oxide (ONO) stack structure. The semiconductor layer can be any suitable semiconductor material, such as polysilicon or monocrystalline silicon, and the semiconductor material may be un-doped or may include a p-type or n-type dopant. The insulating layer is formed of an insulating material, such as silicon oxide and/or silicon nitride, and/or may be formed as an air gap.

Referring to the FIG. 1A, the staircase region 120 includes a stack 150 (also referred to as a stack structure 150) of gate layers 1710 (e.g., 1710(A)-1710(H)) and insulating layers 122 (e.g., 122(A)-122(I)) that are stacked alternatingly in the Z direction. In the core region, transistors are stacked vertically through the gate layers and the insulating layers 122. In some examples, the stack of transistors includes memory cells and select transistors, such as a ground select transistor, a string select transistor and the like. The gate layers 1710 correspond to and electrically connect to gates of the transistors. In an example, the gate layer 1710(A) corresponds to a gate of a ground select transistor, the gate layer 1710(11) corresponds to a gate of a string select transistor, and the other gate layers 1710(B)-1710(G) correspond to the gates of memory cells that are stacked vertically with the ground select transistor and the string select transistor. The gate layers 1710(B)-1710(G) can also be referred to as word lines (WL) in the memory architecture. The gate layers 1710 are made of a gate stack material, such as an MG electrode (or a metal layer), and the like. The insulating layers 122 are made of insulating material(s), such as silicon nitride, silicon dioxide, and the like.

Referring to FIG. 1A, the gate layers 1710 do not include a high dielectric constant (high-k) gate insulator layer (or a high-k insulating layer) in the staircase region 120. The high-k gate insulator layer can be formed in the core region. In an example, prior to forming the gate dielectric layer (e.g., the ONO stack structure) of the channel structure in the core region of the semiconductor device 100, the high-k gate insulator layer is formed in the core region. The channel structure including the gate dielectric layer, the semiconductor layer, and the insulating layer can be formed over the high-k insulating layer. The high-k insulating layer can include any suitable material(s) that provide the relatively large dielectric constant, such as $HfO_2$, $HMfSi_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, and the like. In an example, the high-k insulating layer includes $Al_2O_3$. The high-k insulating layer can, for example, enhance the blocking insulating layer of the gate dielectric layer.

Further, in the FIG. 1A example, contact structures or combined dummy channel (DCH) and contact (CT) structures 130 (e.g., combined dummy channel and contact structures 130(A), 130(C), 130(E), and 130(G)) are formed in the stack 150 in the staircase region 120 to conductively connect to the gate layers 1710 (e.g., 1710(A), 1710(C), 1710(E), and 1710(G)). The combined DCH and CT structures 130 can be referred to as the combined DCH-CT structures 130 and are used to connect driving circuitry, such as word line driving circuitry, ground select driving circuitry, string select driving circuitry, and the like in the periphery circuitry to the respective gates of the transistors in the core region. In FIG. 1A, the combined DCH-CT structures 130 are electrically connected to the respective gate layers 1710. For example, the combined DCH-CT structures 130(A), 130(C), 130(E), and 130(G) are electrically connected to the gate layers 1710(A), 1710(C), 1710 (E), and 1710(G), respectively. Note that each of the combined DCH-CT structures 130 is electrically connected to only one of the gate layers 1710 and is electrically isolated from remaining ones of the gate layers 1710.

An example of the combined DCH-CT structures 130, such as the combined dummy DCH-CT structure 130(C), is described below. The combined DCH-CT structure 130(C) is electrically connected to the gate layer 1710(C) and is electrically isolated from the gate layers 1710(A)-1710(B) and 1710(D)-1710(M).

The combined DCH-CT structure 130(C) can include a conductive structure 1620 extending in the Z direction. The conductive structure 1620 can include a metal pillar 1610. The metal pillar 1610 can extend in the Z direction and form a conductive connection with one of the gate layers (e.g., the gate layer 1710(C)). Referring to FIG. 1A, the metal pillar 1610 extends through the gate layers 1710 (e.g., 1710(A)-1710(H)) and the insulating layers 122 (e.g., 122(A)-122(I)). The metal pillar 1610 can further penetrate into the insulating layer 101. In an example, the metal pillar 1610 reaches to a depth AA' into the insulating layer 101. An upper portion 101(B) of the insulating layer 101 is above the depth AA' and a bottom portion 101(A) of the insulating layer 101 is below the depth AA'. The metal pillar 1610 can penetrate through the upper portion 101(B) of the insulating layer 101. In an example shown in FIG. 1A, the metal pillars 1610 (or the combined DCH-CT structures 130) extend through the entire stack 150 along the Z direction. Thus, when sacrificial layers are being replaced by the gate layers 1710 in a gate-last fabrication technology (e.g., at S1928 of the process 1900), the combined DCH-CT structures 130 can provide stronger support to the staircase region 120 as compared to structures (e.g., dummy channels) that only extend through a portion of the stack 150.

In an embodiment, the conductive structure 1620 can further include protrusions 1010 (e.g., 1010(A)-1010(B)) between the insulating layers 122 that are between the gate layer 1710(C) that is electrically connected to the combined DCH-CT structure 130(C) and the insulating layer 101. In an example shown in FIG. 1A, the protrusion 1010(A) is between the insulating layers 122(A)-122(B), and the protrusion 1010(B) is between the insulating layers 122(B)-122 (C). The protrusions 1010 extend out from the metal pillar 1610 into the respective gate layers 1710. The metal pillar 1610 and the protrusions 1010 can be formed in a same process, and can include identical material(s), such as one or more metallic materials (e.g., tungsten (W), copper (Cu)).

The combined DCH-CT structure 130(C) can include first insulating structures 1413 (e.g., 1413(A)-1413(B)). The first insulating structures 1413 electrically isolate any protrusions 1010 of the conductive structure 1620 from a respective gate layer of the gate layers 1710. Each of the first insulating structures 1413 can be between each pair of the insulating layers 122 that are between the gate layer 1710(C) and the insulating layer 101. The first insulating structures 1413 are disposed on a first side of the gate layer 1710(C), for example, beneath the gate layer 1710(C). Each of the first insulating structures 1413 can surround the conductive structure 1620 and electrically isolate the conductive structure 1620 from a respective one of the gate layers 1710. In an example, the first insulating structures 1413 extend out from the respective protrusions 1010 into the respective gate layers 1710. Referring to FIG. 1A, the first insulating structure 1413(A) is between the insulating layers 122(A)-122(B) and electrically isolates the conductive structure 1620 from the gate layer 1710(A), and the first insulating structure 1413(B) is between the insulating layers 122(B)-122(C) and electrically isolates the conductive structure 1620 from the gate layer 1710(B).

In an example of FIG. 1A, the first insulating structures 1413 can surround the respective protrusions 1010 and electrically isolate the conductive structure 1620 from the respective ones of the gate layers 1710. The first insulating structure 1413(A) surrounds the protrusion 1010(A) and electrically isolates the protrusion 1010(A) (and the conductive structure 1620) from the gate layer 1710(A), and the first insulating structure 1413(B) surrounds the protrusion 1010(B) and electrically isolates the protrusion 1010(B) (and the conductive structure 1620) from the gate layer 1710(B). The first insulating structures 1413 can include one or more suitable insulating materials, such as silicon oxide, silicon oxynitride (SiON), and/or the like.

The combined DCH-CT structure 130(C) can include a second insulating structure 710 that surrounds the conductive structure 1620 (and the metal pillar 1610) and electrically isolates the conductive structure 1620 (and the metal pillar 1610) from any gate layer of the gate layers 1710 that is above the insulating layer 101 and the gate layer 1710 (e.g., the gate layer 1710(C)) that is electrically connected to the combined DCH-CT structure 130(C). The second insulating structure 710 can extend through one or more of the gate layers 1710 and the insulating layers 122 that are on a second side of the gate layer 1710(C) where the second side is opposite to the first side. For example, the second insulating structure 710 extends through the gate layers 1710 (D)-1710(H) and the insulating layers 122(E)-122(H) that are above the gate layer 1710(C). Referring to FIG. 1A, the gate layers that are above the gate layer 1710(C) and the insulating layer 101 include the gate layers 1710(D)-1710 (H), and the second insulating structure 710 electrically isolates the conductive structure 1620 from the gate layers 1710(D)-1710(H). In an example, the second insulating structure 710 is disposed above the insulating layer 101 and the gate layer 1710 (e.g., the gate layer 1710(C)) that is electrically connected to the combined DCH-CT structure 130(C), and the first insulating structures 1413 are between the insulating layer 101 and the gate layer 1710 (e.g., the gate layer 1710(C)) that is electrically connected to the combined DCH-CT structure 130(C).

Referring to FIG. 1A, the combined DCH-CT structure 130(C) comprises insulating structures that include the first insulating structures 1413 and the second insulating structure 710 that are disposed on opposite sides of the gate layer 1710 (e.g., the gate layer 1710(C)) that is electrically connected to the combined DCH-CT structure 130(C).

The above descriptions for the combined DCH-CT structure 130(C) can be suitably adapted to other combined DCH-CT structures in the semiconductor device 100 (e.g., 130(A), 130(E), and 130(G) shown in FIG. 1A), and detailed descriptions are omitted for purpose of brevity. Note that each of the combined DCH-CT structures 130 is conductively connected to a different gate layer. For example, the combined DCH-CT structure 130(A) is conductively connected to the gate layer 1710(A), the combined DCH-CT structure 130(E) is conductively connected to the gate layer 1710(E), and the combined DCH-CT structure 130(G) is conductively connected to the gate layer 1710(G).

A number of first insulating structures in one of the combined DCH-CT structures 130 can be different from another one of the combined DCH-CT structures 130 and is identical to a number of gate layers between the substrate 101 and the gate layer that is conductively connected to the one of the combined DCH-CT structures 130. For example, the combined DCH-CT structure 130(E) includes four first insulating structures, and the combined DCH-CT structure 130(G) includes six first insulating structures. The combined DCH-CT structure 130(A) includes no first insulating structures because the gate layer 1710(A) that is conductively connected to the combined DCH-CT structure 130(A) is a bottommost gate layer in the gate layers 1710.

Referring to FIG. 1A, the combined DCH-CT structures 130 can serve multiple purposes in the semiconductor device 100 and/or in manufacturing the semiconductor device 100: (i) serving as contacts to the corresponding gate layers 1710 and (ii) serving as dummy channels that support the staircase region 120, for example, during a gate-last process.

For example, the combined DCH-CT structure 130(C) serves as a contact to the gate layer 1710(C) and is electrically isolated from remaining ones of the gate layers 1710 (e.g., 1710(A)-1710(B) and 1710(D)-1710(H)). The combined DCH-CT structure 130(C) is electrically isolated from gate layers (e.g., 1710(D)-1710(H)) that are above the gate layer 1710(C) by the second insulating structure 710 and from gate layers (e.g., 1710(A)-1710(B)) that are below the gate layer 1710(C) by the first insulating structures 1413. Further, the combined DCH-CT structure 130(C) is formed through the entire stack of the staircase region 120, and thus provides relatively strong support to the staircase region 120, for example, during the gate-last process.

In related semiconductor 3D memory devices or vertical memory devices, contacts and dummy channels in a staircase region are disposed in different areas in the X-Y plane, and contacts need to land on corresponding staircase structures (or stairs) in the staircase region. Thus, how to arrange and manufacture the contacts, the dummy channel, and the staircase structures in the staircase region can be challenging. A top selective (TS) silicon nitride process can be used to provide a stopping layer that satisfies the requirement that the contacts land on the corresponding gate layers (or WLs). To provide the support for the staircase region, a design or an arrangement of the dummy channels and the contacts need to satisfy certain requirements. In an example, a maximum sustain distance requirement requires a maximum distance between two dummy channels to be smaller than a pre-defined limit to ensure sufficient support without collapse. In an example, the design of the dummy channels is to be within a space window constrained by bending of the gate layers and is to provide an adequate space window for the contacts, such as a distance between a dummy channel and a contact. The alternating structure of sacrificial layers and insulating layers in the staircase region can induce stress to the semiconductor device. As a number of layers increases in the semiconductor device, lengths of the staircases increase and the staircases occupy a larger area. Accordingly, stress can increase and make it more challenging to design and manufacture the contacts and dummy channels in the staircase region.

According to some embodiments of the disclosure, the combined DCH-CT structure 130 can offer advantageous solutions to the challenges described above. Referring to FIG. 1A, a staircase structure, a dummy channel, and a contact that are separated in a related technology can be combined into a single structure (e.g., the combined DCH-CT structure 130(A), 130(C), 130(E), or 130(G)). The combined DCH-CT structure 130 in FIG. 1A can also be referred to as a stair-DCH-CT structure or a combined stair-DCH-CT structure. The combined DCH-CT structure 130 significantly simplifies a structure of a vertical memory device by combining multiple (e.g., three) different structures into a single structure, thus reducing a footprint of the staircase structure, the dummy channel, and the contact. The manufacturing process and the design of the single structure can be simplified and more flexible, reducing a number of manufacturing steps and cost.

As the multiple structures are combined into the single structure, design windows among the multiple structures are relaxed or no longer need to be considered, such as design windows associated with CTs and DCHs (e.g., a distance between a CT and a DCH, a distance between two DCHs, and/or the like), a design window associated with CTs and SS (e.g., CTs are to be landed on respective SS to connect to respective gate layers).

In FIG. 1A, the supporting structure is the combined stair-DCH-CT structure 130 where conductive (e.g., metallic material(s)) (e.g., W) are filled through the conductive structure 1620. As the conductive (e.g., metal material(s)) (e.g., W) have a larger Young's modulus than material(s) (e.g., insulating material(s)) used in dummy structures in a related technology, the combined stair-DCH-CT structure 130 can provide stronger support and mitigate bending of the gate layers. Further, the combined stair-DCH-CT structure can be formed on a face side above the substrate 102, and thus the process is performed on one side.

Referring to FIG. 1A, the combined stair-DCH-CT structure 130(C) includes a first portion above the gate layer (e.g., the gate layer 1710(C)) that is electrically connected to the combined stair-DCH-CT structure 130(C), a second portion that is connected to the gate layer 1710(C), and a bottom portion below the gate layer 1710(C). The bottom portion below the gate layer 1710(C) includes the protrusions 1010 and the first insulating structures 1413 that surround the metal pillar 1610. The bottom portion has a structure that resembles a "screw thread" structure. In an example, the protrusions 1010 and/or the first insulating structures 1413 resembles "screw threads" of the bottom portion such that the bottom portion is fastened into the gate layers 1710(A)-1710(B) and the insulating layers 122(A)-122(C). The "screw thread" structure of the bottom portion can better support the staircase region 120, for example, during a gate-last process.

The first portion and the second portion can be referred to as a top portion of the combined stair-DCH-CT structure 130(C). The top portion is also referred to as a contact to the gate layer 1710(C) and the top portion (e.g., a sidewall of the top portion) is isolated from the gate layers that are disposed above the gate layer 1710(C) (e.g., 1710(D)-1710(H)). The bottom portion can be referred to as a dummy channel and is isolated from the gate layers that are disposed below the gate layer 1710(C) (e.g., 1710(A)-1710(B)). Both the top portion and the bottom portion can provide support to the staircase region 120, for example, during the gate-last process.

Figure 18:
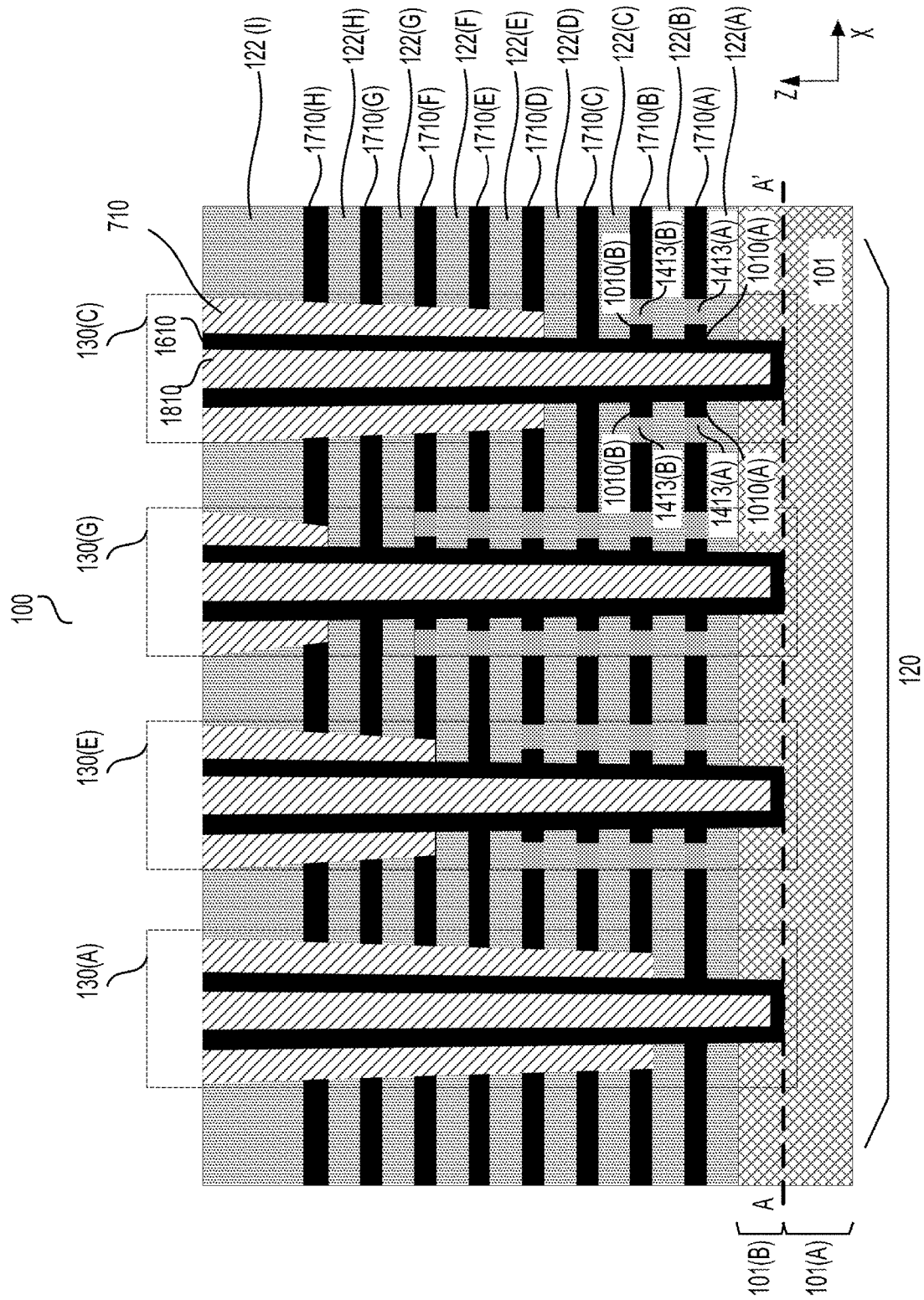

The combined DCH-CT structures 130 can be suitably adapted to include additional structure(s), to omit structure(s), to modify structure(s), and/or the like. In an example, the combined DCH-CT structures 130 can include respective core structures. The core structures can be disposed within the respective conductive structure 1620, such as within the respective metal pillars 1610. The core structures can extend through the respective conductive structures 1620, for example, in the Z direction and through a subset of the gate layers 1710 and the insulating layers 122. A material of the core structure can be different from a material of the conductive structure 1620. Referring to FIG. 18, the combined DCH-CT structures 130 include core structures 1810 within the metal pillars 1610. The core structures 1810 extend in the Z direction and through the gate layers 1710 and the insulating layers 122. In an example, the core structures 1810 include insulating material(s), such as silicon oxide and are referred to as oxide cores. Having an oxide core or other insulating cores can reduce cost of metal deposition (e.g., W deposition) and mitigate issues associated with metal voids (e.g., voids in W), such as fluorine attack risk associated with voids in W.

Figure 1B:
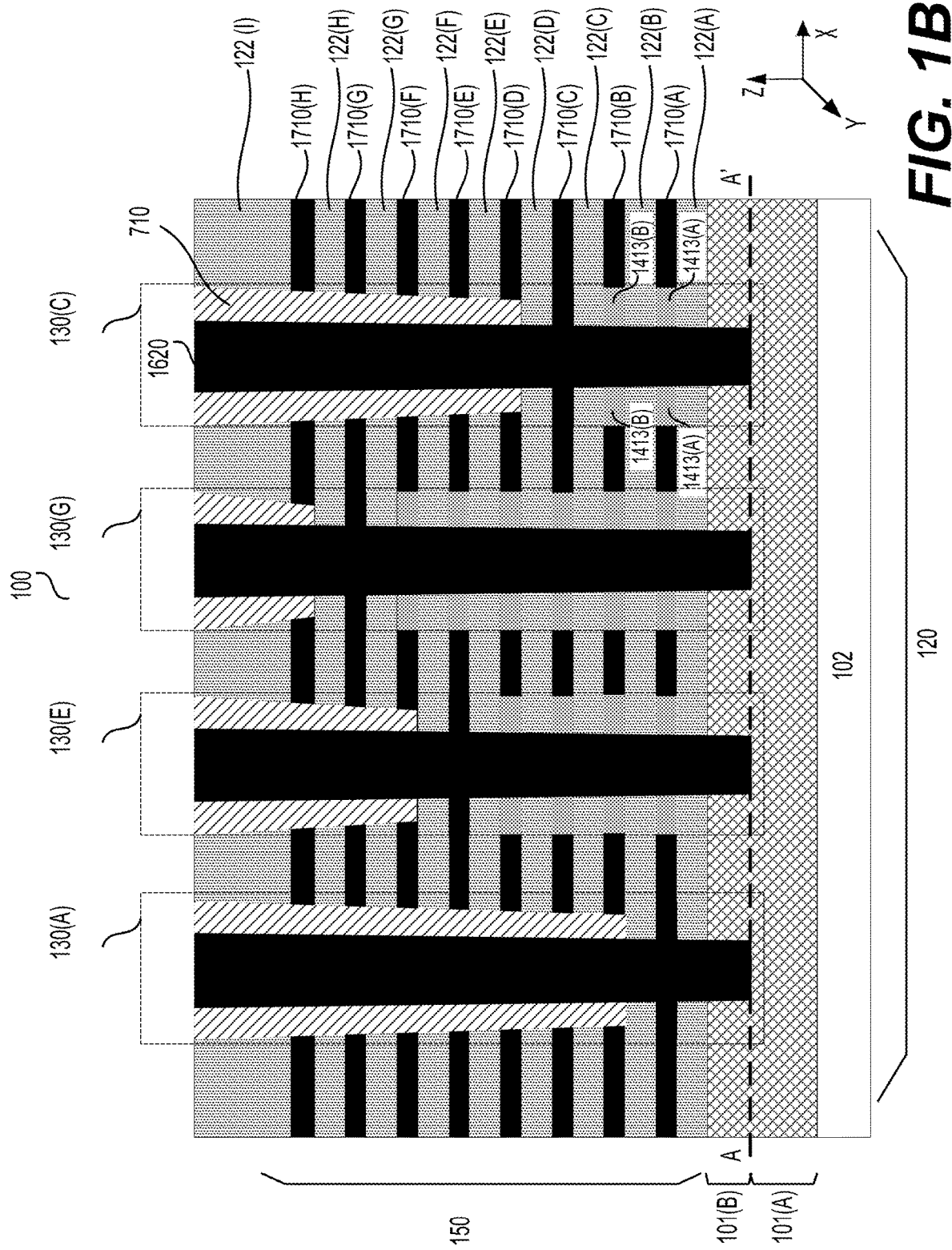
FIG. 1B shows a vertical cross-sectional view of a portion 100A of the semiconductor device 100 according to an exemplary embodiment of the disclosure.

Suitable material(s) including metal(s) other than W can be used in the conductive structure 1620. The suitable material(s) can also include insulating material(s), such as shown in FIG. 18. In an example, conductive material(s) (e.g., W, copper, aluminum) can completely fill the metal pillar 1610 as shown in FIGS. 1A-1B. In an example, conductive material(s) (e.g., W, copper, aluminum) partially fill the metal pillar 1610 and insulating material(s) (e.g., silicon oxide, SiON) form the core structures 1810 within the metal pillar 1610 as shown in FIG. 18.

In an example, the conductive structure 1620 does not include protrusions, as shown in FIG. 1B. The conductive structure 1620 is a metal pillar. FIG. 18 shows a variation to the vertical cross-sectional view of the portion of the semiconductor device 100 according to an exemplary embodiment of the disclosure where the conductive structure 1620 does not include protrusions. Referring to FIG. 1B, the first insulating structures 1413 electrically isolate the conductive structure 1620 (or the metal pillar) from respective gate layers of the gate layers 1710. Each of the first insulating structures 1413 can surround the conductive structure 1620 (or the metal pillar) and electrically isolate the conductive structure 1620 from a respective one of the gate layers 1710. In an example, the first insulating structures 1413 extend out from the conductive structure 1620 (or the metal pillar) into the respective gate layers 1710.

Referring to FIG. 1B, the combined stair-DCH-CT structure 130(C) includes a bottom portion below the gate layer 1710(C). The bottom portion below the gate layer 1710(C) includes the first insulating structures 1413 that surround the conductive structure 1620 (or the metal pillar). The bottom portion has a structure that resembles a "screw thread" structure. In an example, the first insulating structures 1413 resembles "screw threads" of the bottom portion such that the bottom portion is fastened into the gate layers 1710(A)-1710(B) and the insulating layers 122(A)-122(C). The "screw thread" structure of the bottom portion can better support the staircase region 120, for example, during a gate-last process.

FIGS. 2-18 show vertical cross-sectional views of the semiconductor device 100 at various steps of a process according to exemplary embodiments of the disclosure. For purposes of brevity, the structure 102 is not shown in FIGS. 2-18.

Figure 19A:
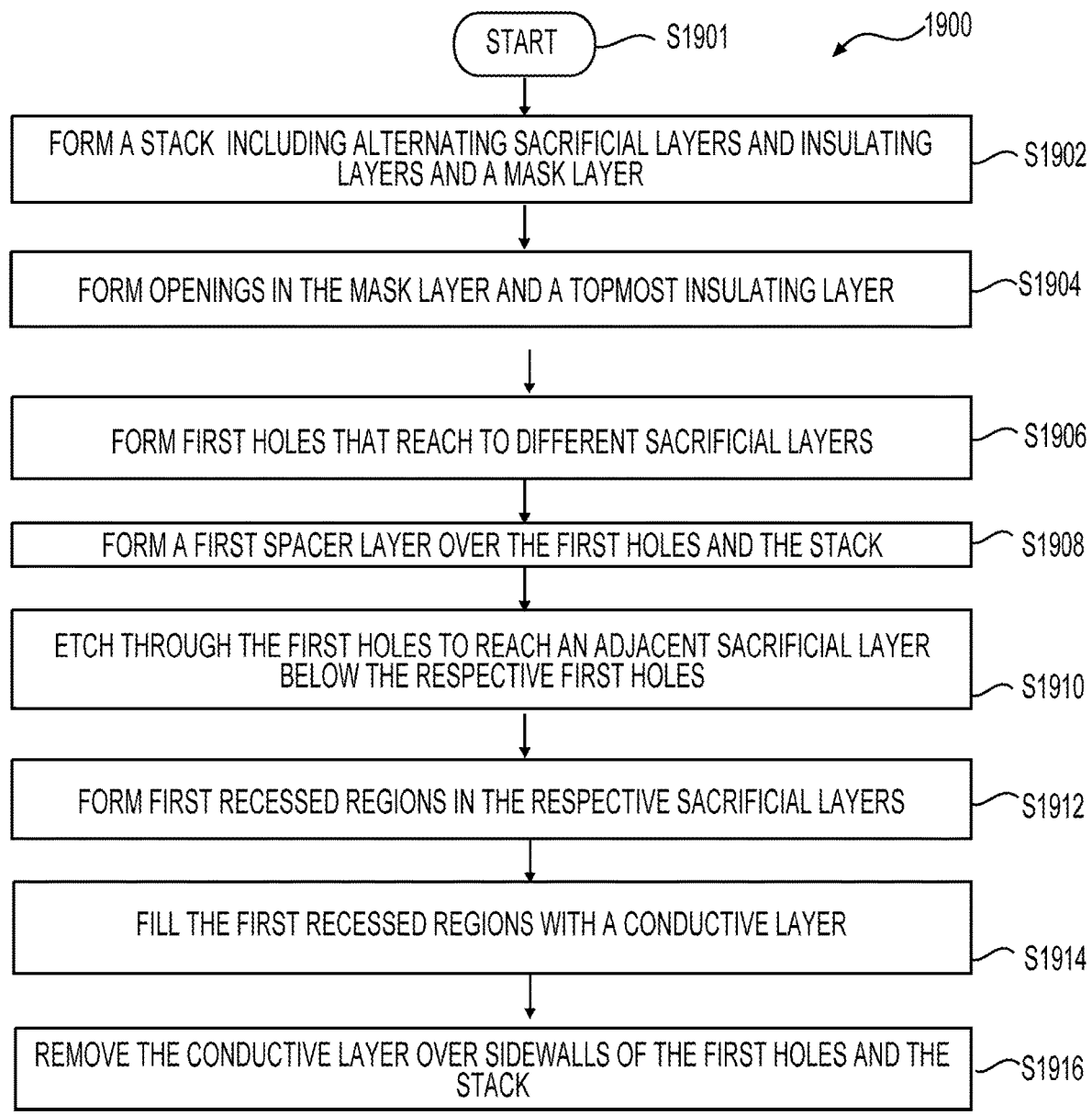
FIGS. 19A-19B show a flow chart outlining a process 1900 example to manufacture the semiconductor device 100 according to an exemplary embodiment of the disclosure.
Figure 19B:
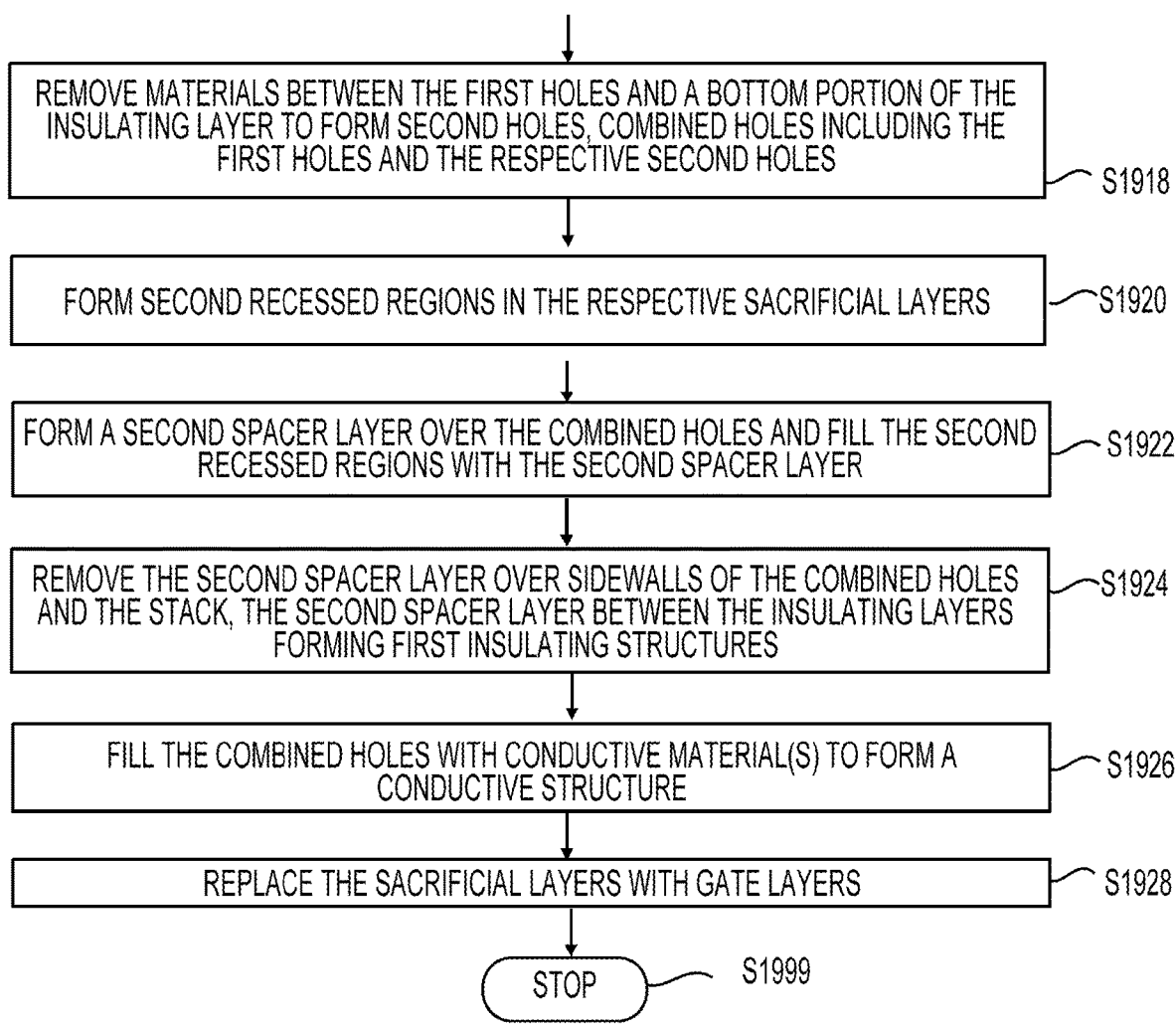

FIGS. 19A-19B show a flow chart outlining a process 1900 example to manufacture the semiconductor device 100 according to an embodiment of the disclosure. The process 1900 starts at S1901 where the plurality of channel structures, such as described above, is formed in the core region of the semiconductor device 100. In some embodiments, holes are formed in the core region. Prior to forming the gate dielectric layer (e.g., the ONO stack structure) of the channel structure, a high-k insulating layer is formed to cover sidewalls of the holes. Subsequently, the channel structure including the gate dielectric layer, the semiconductor layer, and the insulating layer can be formed within the holes over the high-k insulating layer. The high-k insulating layer can include any suitable material(s) that provide the relatively large dielectric constant, such as $HfO_2$, $HfSiO_4$, $HfSiON$, $Al_2O_3$, $La_2O_3$, $Ta_2O_5$, $Y_2O_3$, $ZrO_2$, $SrTiO_3$, $ZrSiO_4$, $HfZrO_4$, and the like. In an example, the high-k insulating layer includes Al$_2$O$_3$. The high-k insulating layer can, for example, enhance the blocking insulating layer of the gate dielectric layer.

For clarity purposes, FIGS. 2-18 illustrate the staircase region 120 of the semiconductor device 100 and show a process used to form the combined DCH-CT structures 130 in the staircase region 120.

Figure 2:
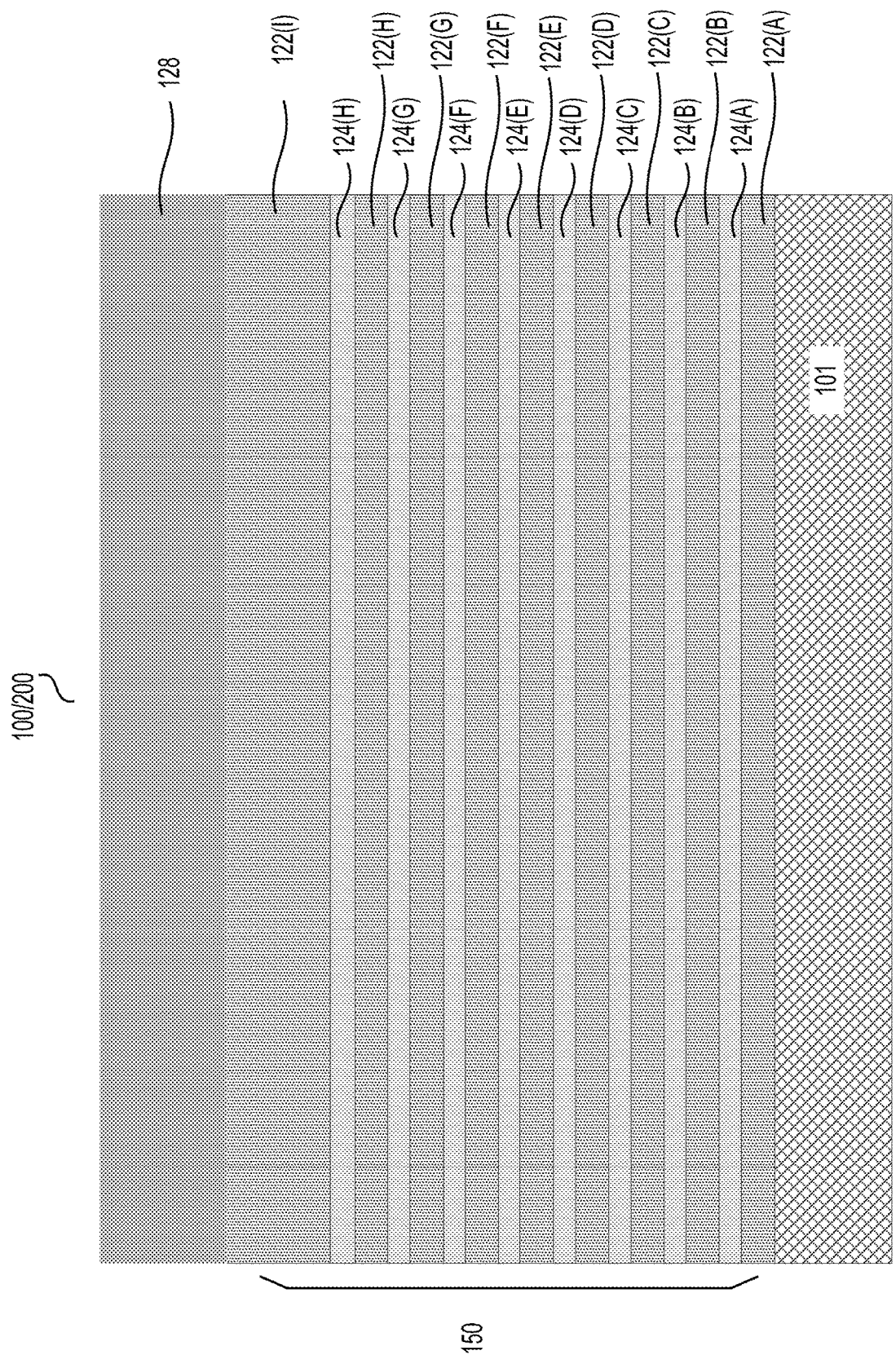
FIGS. 2-18 show vertical cross-sectional views of the semiconductor device 100 at various steps of a process according to exemplary embodiments of the disclosure.

Referring to FIGS. 2 and 19A, at S1902, the stack 150 including alternating sacrificial layers 124 (e.g., 124(A)-124(H)) and the insulating layers 122 are formed over the insulating layer 101 of the semiconductor device 100.

The stack 150 can be manufactured using a variety of semiconductor processing techniques, such as photolithography, CVD including furnace CVD, low pressure CVD, PVD, ALD, an e-beam evaporation, a sputtering, a diffusion, dry etching, wet etching, chemical mechanical planarization (CMP), ion implantation, and the like.

The stack 150 can further include one or more additional layers (not shown), such as insulating layer(s) between the insulating layer 101 and the lowermost insulating layer 122 (e.g., 122(A)).

The sacrificial layers 124 and the insulating layers 122 are alternately formed over the insulating layer 101 and can include, for example, any suitable dielectric materials that have different etch rates. For example, the sacrificial layers 124 can be formed with silicon nitride, the insulating layers 122 can be formed by using a dielectric material, such as SiO$_2$, that has a different etch rate from that of the sacrificial layers 124. In various embodiments, the sacrificial layers 124 are removed and replaced with the respective gate layers 1710 in subsequent step(s) (e.g., S1928 in FIG. 19B), for example, the sacrificial layers 124(A)-124(H) are removed and replaced with the gate layers 1710(A)-1710(H).

Thicknesses of the sacrificial layers 124 can be different from or identical to each other. In an example, the thicknesses of the sacrificial layers 124 range from 20 to 50 nm, for example, the thickness of the sacrificial layers 124 can be about 35 nm. Any suitable deposition process, such as CVD, PVD, ALD, an e-beam evaporation, a sputtering, a diffusion, or any combination thereof, can be applied to form the sacrificial layers 124.

The insulating layers 122 can have any suitable thicknesses, such as between 20 and 40 nm, and can be formed by performing CVD, PVD, ALD, an e-beam evaporation, a sputtering, a diffusion, or any combination thereof. Thicknesses of the insulating layers 122 can be different from or identical to each other. In an example shown in FIG. 1A, the thickness of the topmost insulating layer 122(I) is larger than remaining insulating layers (e.g., 122(A)-(H)). In an example, the thickness of the insulating layers 122(A)-(H) is 25 nm.

In an example, a thickness of the stack 150 can be about 1-10 microns, such as 4-6 microns. Any suitable number of transistors or memory cells can be formed in the core region, such as 16, 32, 64, 96, and the like. Accordingly, a number of the sacrificial layers 124 may vary according to the number of the memory cells in the core region.

A mask layer (e.g., a hardmask layer) 128 can be formed over the topmost insulating layer 122(I) of the stack 150 to protect the semiconductor device 100 during subsequent processing. The mask layer 128 can include one or more hardmask sublayers, such as silicon nitride and silicon oxide. In various embodiments, the mask layer 128 can be patterned according to any suitable techniques, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Figure 3:
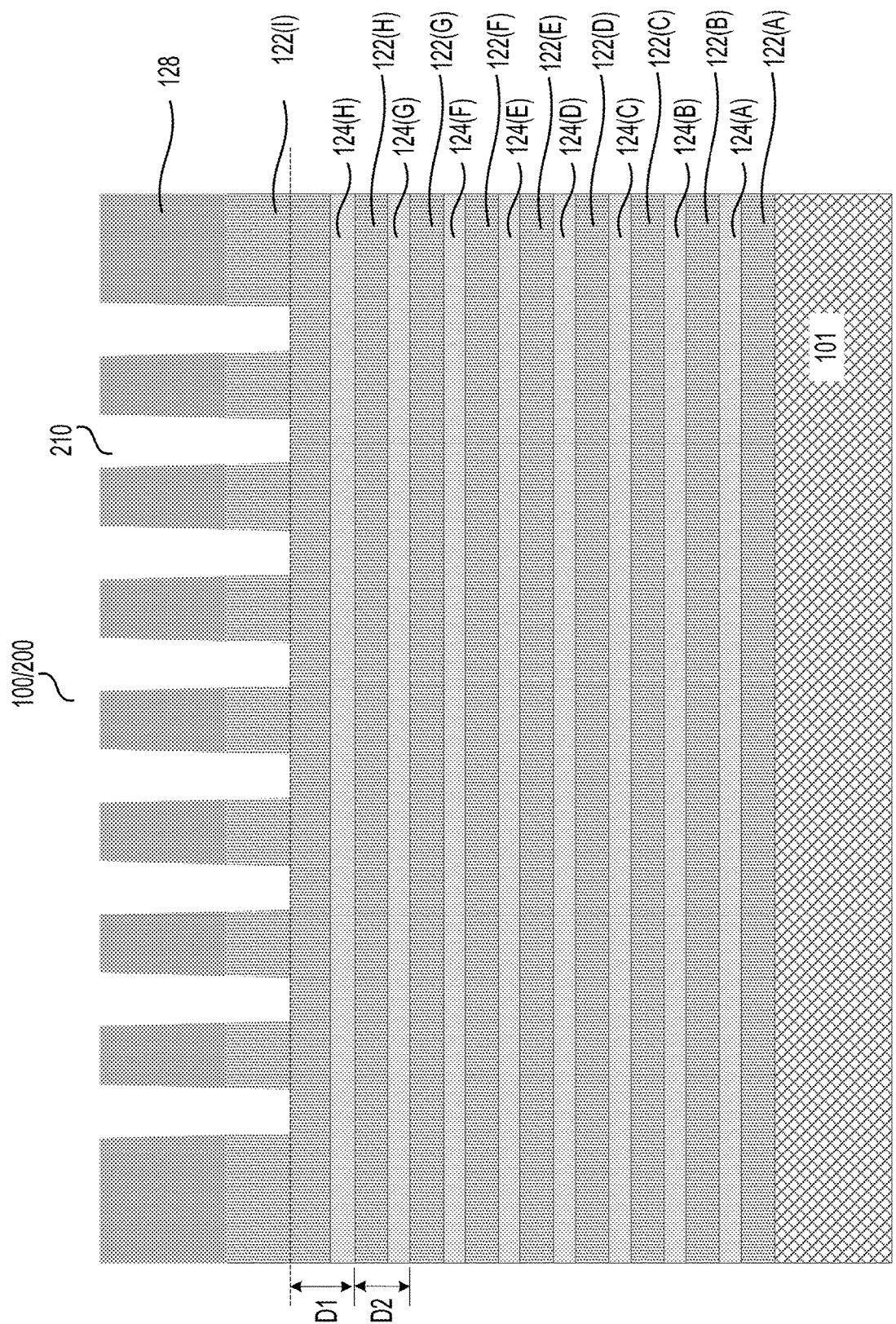

Referring to FIGS. 3 and 19A, at S1904, openings 210 extending into the topmost insulating layer 122(I) are formed according to a pattern of the mask layer 128 using any suitable process. In an example, an upper portion of the topmost insulating layer 122(1) exposed by the patterned mask layer 128 is removed to form the openings 210 using an etching process, such as a dry etching (e.g., a plasma etch referred to as a plasma punch).

Referring to FIG. 3, a first distance D1 is a distance between a bottom surface of the openings 210 to a bottom surface of the topmost sacrificial layer 124(H). The thicknesses of the sacrificial layers 124 (e.g., 124(A)-124(H)) are T1, and the thicknesses of the insulating layers 122(A)-122(H) are T2. A second distance D2 is a sum of T1 and T2. The second distance D2 is a distance between bottom surfaces of two adjacent ones of the insulating layers 122 or a distance between bottom surfaces of two adjacent ones of the sacrificial layers 124. In an example, the first distance D1 is identical to or substantially similar to the second distance D2.

The openings 210 can have any suitable shape, such as a circular pillar-shape, a square pillar-shape, an oval pillar-shape, and the like. The openings 210 can have a tapered profile where a top opening is larger than a bottom opening, as shown in FIG. 3. The tapered profile can be obtained by tapering a mask profile of the patterned mask layer 128, adjusting parameters of the etching process, and the like. A tapered profile can help subsequent deposition steps and improve sidewall coverage. In FIG. 3, the mask layer 128 remains over the stack 150 after forming the openings 210.

Figure 4:
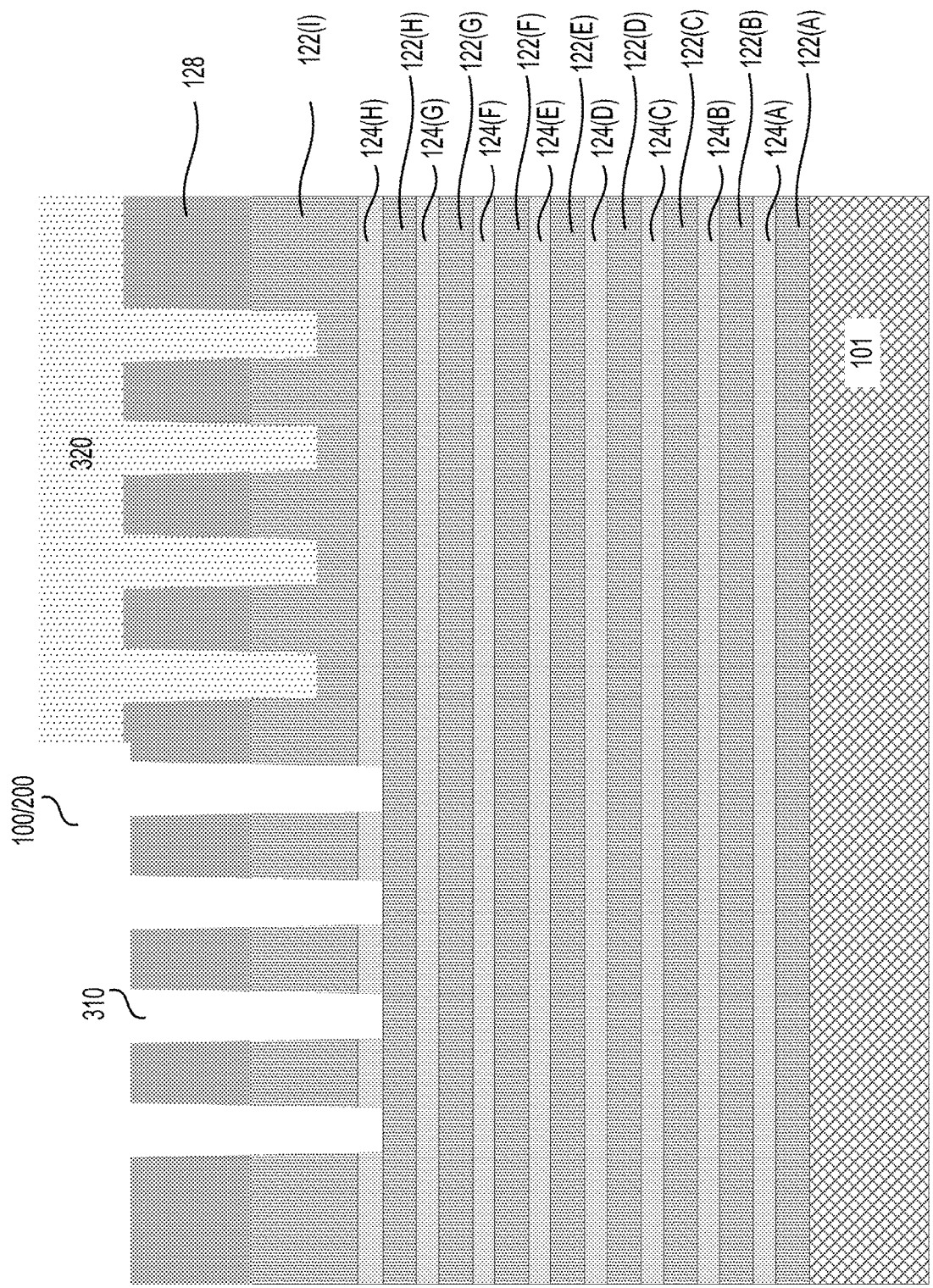

Referring to FIGS. 4-7 and 19A, at S1906, first holes 730 (e.g., 730(A)-730(H)) that extend to different sacrificial layers 124 are formed in the stack 150. Referring to FIG. 4, openings 310 extending into the topmost sacrificial layer 124(H) are formed according to the openings 210 using any suitable process while remaining openings 210 are covered by a sacrificial layer (e.g., a photoresist layer) 320. In an example, a remaining portion of the topmost insulating layer 122(I) and the topmost sacrificial layer 124(H) exposed by the openings 210 are removed to form the openings 310. The openings 310 can be formed using an etching process, such as a dry etching (e.g., a plasma punch).

Figure 5:
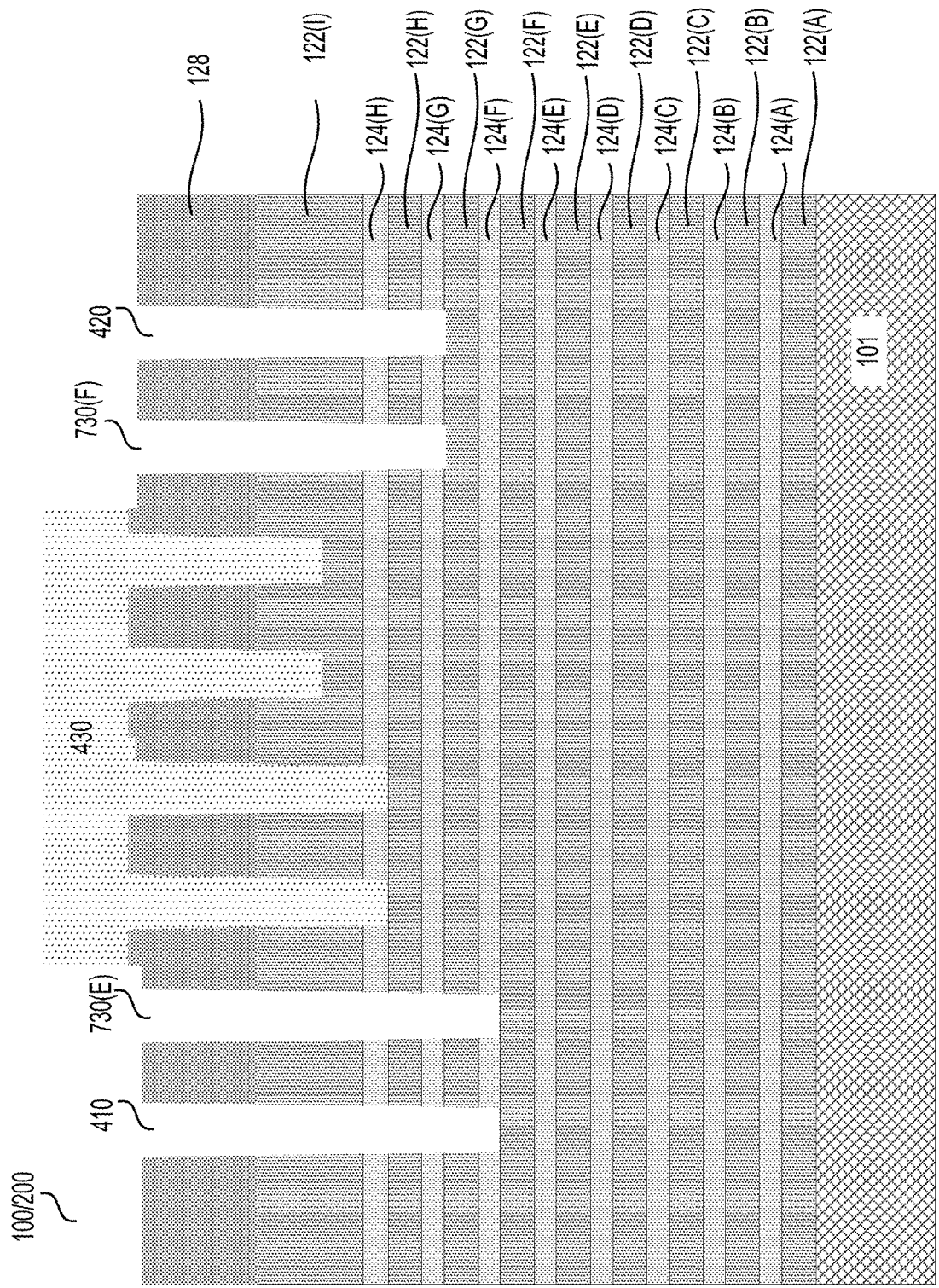

Referring to FIG. 5, a sacrificial layer (e.g., a photoresist layer) 430 is formed over two of the openings 310 and two of the openings 210. Subsequently, openings 410, 730(E), 730(F), and 420 are formed in the stack 150 by an etching process that is identical or similar to the etching process described with reference to FIG. 4. In an example, the openings 410, 730(E), 730(F), and 420 are formed simultaneously in a same etching process by etching a same thickness of the sacrificial layers and a same thickness of the insulating layers.

The openings 410 and 730(E) extending into a bottom surface of the sacrificial layer 124(F) are formed according to the openings 310 using the etching process. In an example, the insulating layers 122(G)-122(H) and the sacrificial layers 124(F)-124(G) exposed by the openings 310 are removed to form the openings 410 and 730(E). The openings 410 and 730(E) can be formed using the etching process, such as a dry etching (e.g., a plasma punch).

The openings 420 and 730(F) extending into a bottom surface of the sacrificial layer 124(G) are formed according to the openings 210 using the etching process. In an example, the bottom portion of the insulating layer 122(I) and the insulating layer 122(H) and the sacrificial layers 124(G)-124(H) exposed by the openings 210 are removed to form the openings 420 and 730(F) The openings 420 and 730(F) can be formed using the etching process, such as a dry etching (e.g., a plasma punch).

Figure 6:
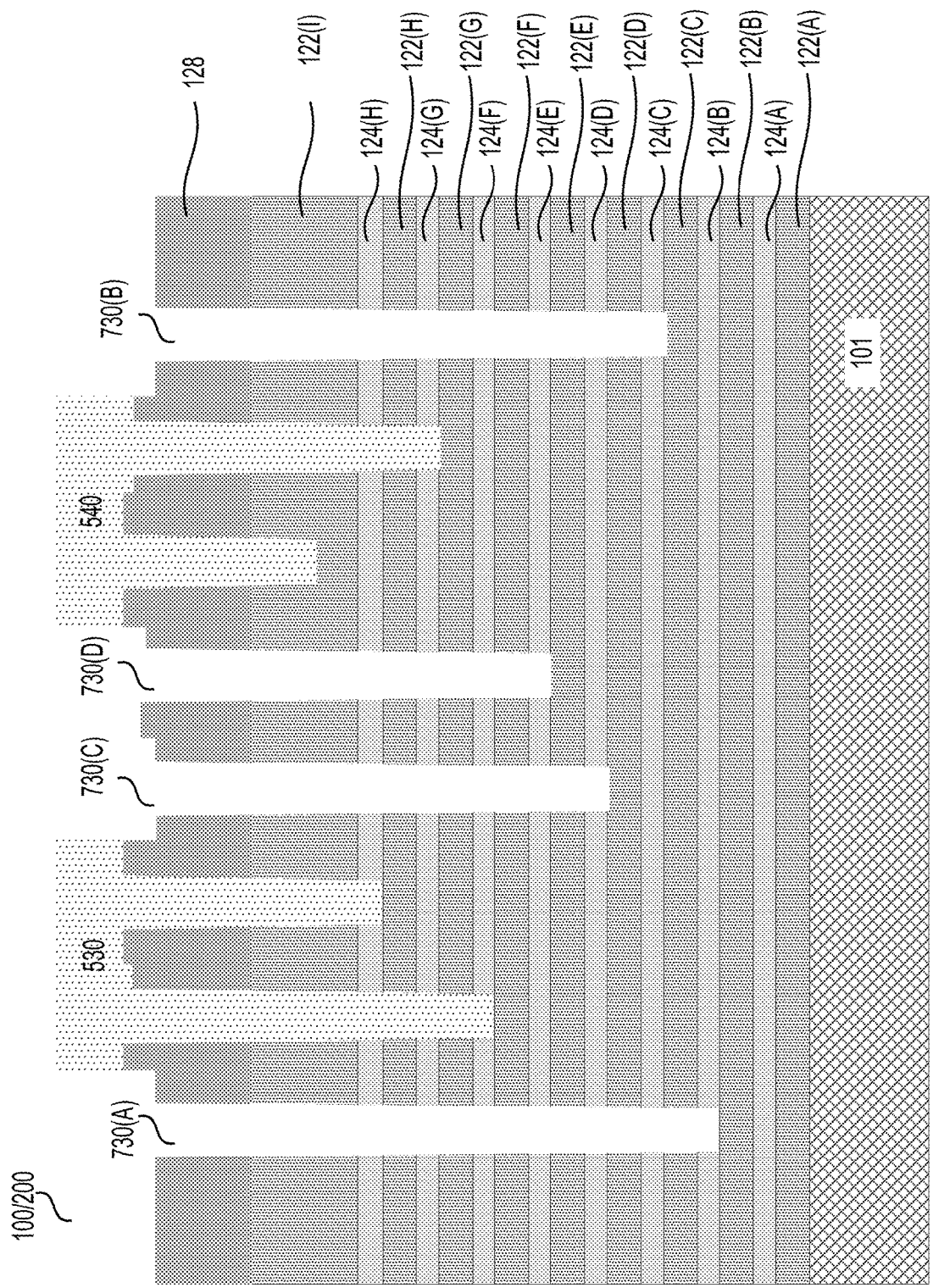

Referring to FIG. 6, sacrificial layers (e.g., photoresist layers) 530 and 540 cover portions of the stack 150 while four openings are exposed. Subsequently, the first holes 730 (e.g., 730(A)-730(D)) are formed in the stack 150 by an etching process that is identical or similar to the etching process described with reference to FIGS. 4-5. In an example, the first holes 730 (e.g., 730(A)-730(D)) are formed simultaneously in a same etching process by etching a same thickness of the sacrificial layers and a same thickness of the insulating layers. In an example shown in FIG. 6, the first holes 730 (e.g., 730(A)-730(D)) are formed simultaneously by etching a same number (e.g., 4) of the sacrificial layers having the thickness T1 and a same number (e.g., 4) of the insulating layers having the thickness T2.

The first hole 730(A) extending into a bottom surface of the sacrificial layer 124(B) is formed according to the opening 410 using the etching process. In an example, the insulating layers 122(C)-122(F) and the sacrificial layers 124(B)-124(E) exposed by the opening 410 are removed to form the first hole 730(A).

The first hole 730(C) extending into a bottom surface of the sacrificial layer 124(D) is formed according to the opening 310 using the etching process. In an example, the insulating layers 122(E)-122(H) and the sacrificial layers 124(D)-124(G) exposed by the opening 310 are removed to form the first hole 730(C.

The first hole 730(D) extending into a bottom surface of the sacrificial layer 124(E) is formed according to the opening 210 using the etching process. In an example, the insulating layers 122(F)-122(H) and the bottom portion of the insulating layer 122(1) and the sacrificial layers 124(E)-124(H) exposed by the opening 210 are removed to form the first hole 730(D).

The first hole 730(B) extending into a bottom surface of the sacrificial layer 124(C) is formed according to the opening 420 using the etching process. In an example, the insulating layers 122(D)-122(G) and the sacrificial layers 124(C)-124(F) exposed by the opening 420 are removed to form the first hole 730(B).

The first holes 730(A)-73(D) can be formed using the etching process, such as a dry etching (e.g., a plasma punch).

Figure 7:
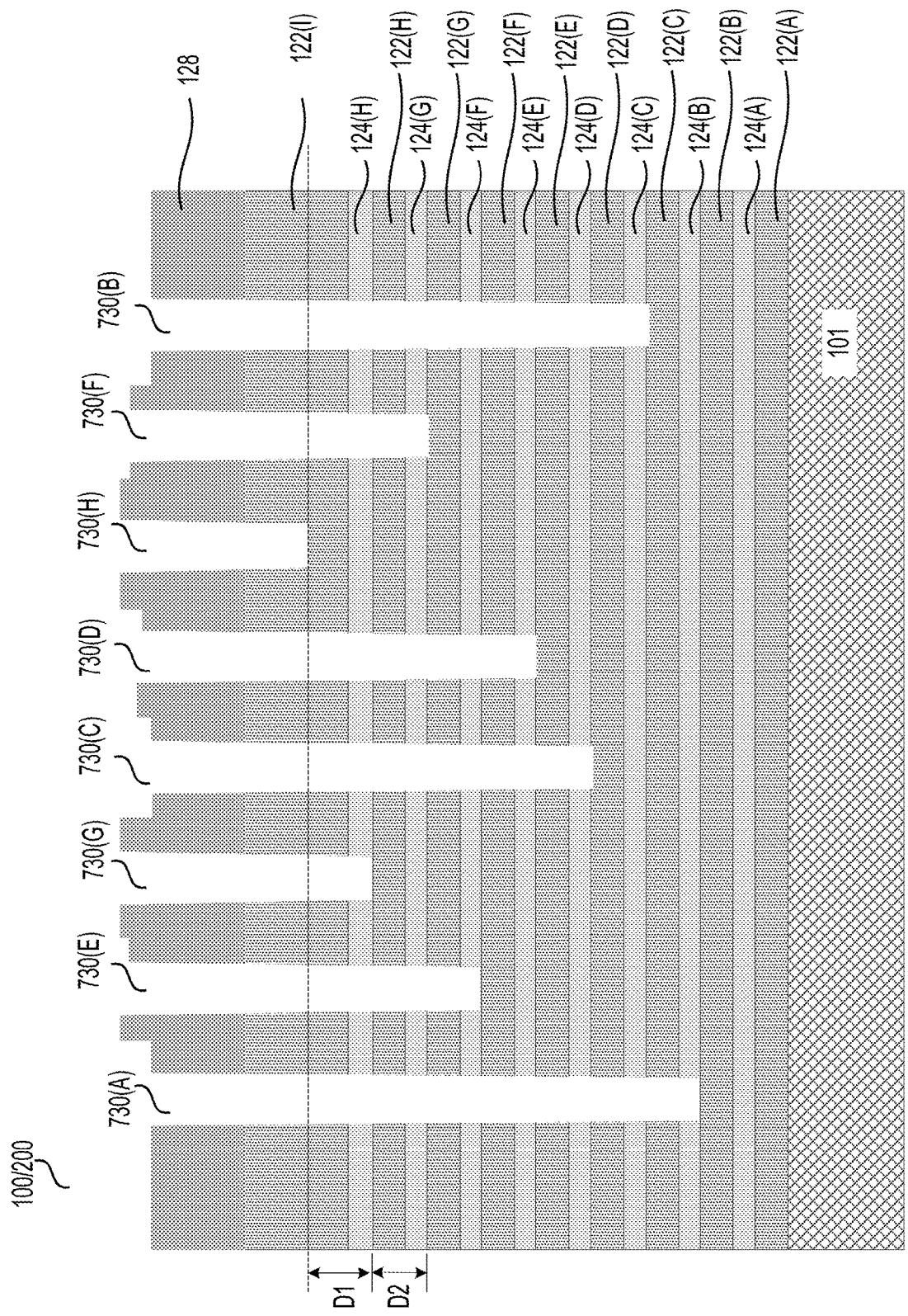

Referring to FIG. 7, the sacrificial layers 530 and 540 are removed to expose the first holes 730(E), 730(G), 730(H), and 730(F). The first holes 730 (e.g., 730(A)-730(H)) are formed in the stack 150.

Note that multiple etching steps combined with different sacrificial layers (e.g., the sacrificial layers 320, 430, 530, and 540) are used in the process 1900 to form the first holes 730 (e.g., 730(A)-730(H)) that reach different depths into the stack 150 and land on different sacrificial layers. For example, the first holes 730(A)-730(G)) reach to the bottom surfaces of the sacrificial layers 124(B)-124(H), respectively. The first hole 730(H) reaches to the bottom surface of the opening 210. As described above, the distances D1 and D2 and patterns of the sacrificial layers (e.g., 320, 430, 530, and 540) can be designed to facilitate forming the first holes 730 in desired depths and locations. Thus, a stair-case form (e.g., a stair-case form shown in FIG. 36) for the insulating layers 122 and the sacrificial layers 124 is not required. In an example, an alignment between contacts and corresponding stair-case structures within the X-Y plane that may be required in related technologies is not required in the process 1900 that is used to manufacture the semiconductor device 100.

The steps shown in FIGS. 3-7 can be suitably adapted for a stack having any number of sacrificial layers and having any suitable thickness to fabricate the first holes that reach to different sacrificial layers.

Figure 8:
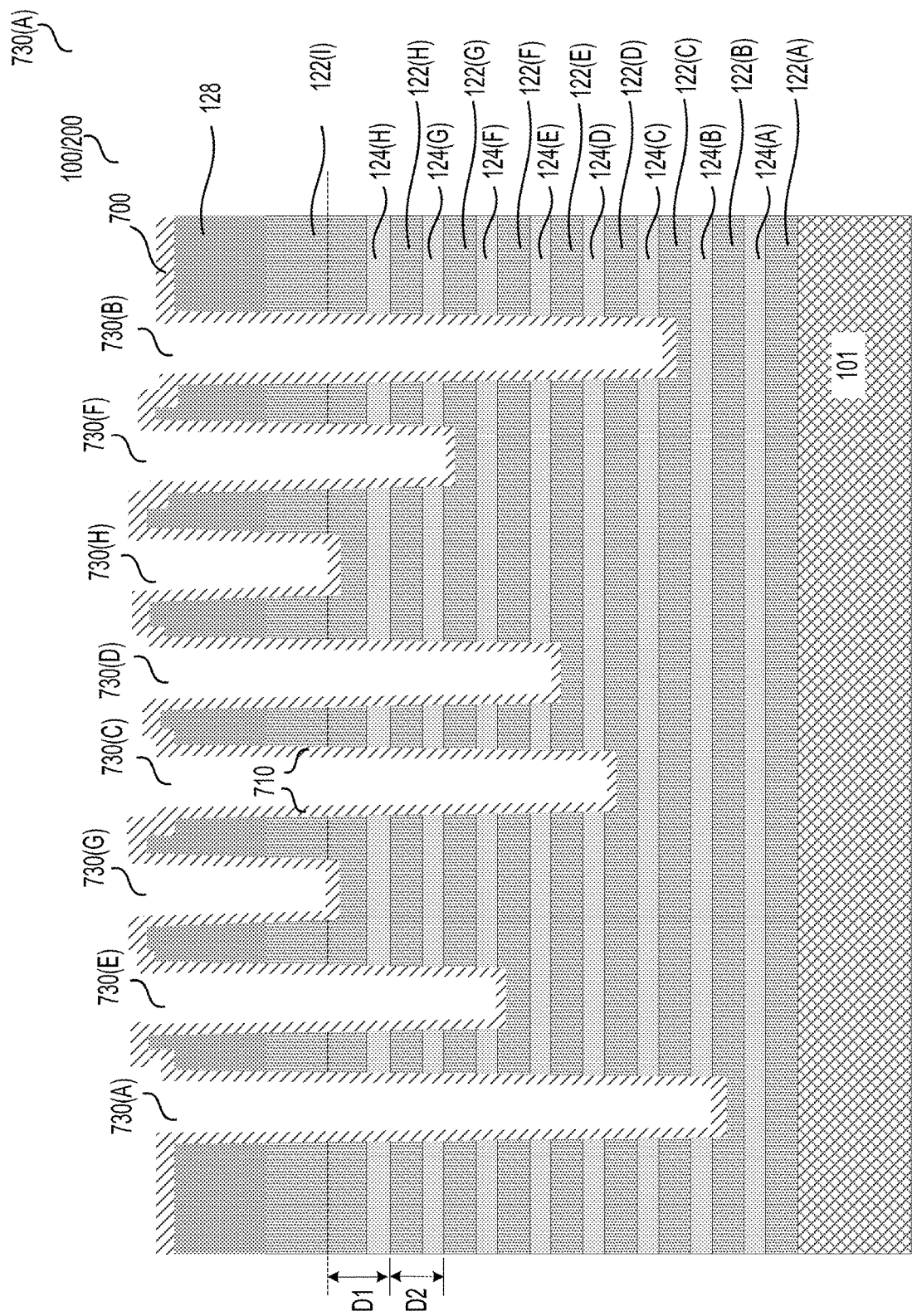

Referring to FIGS. 8 and 19A, at S1908, a first spacer layer 700 is formed over the stack 150. The first spacer layer 700 covers sidewalls of the first holes 730 and bottom surfaces of the first holes 730. Portions of the first spacer layer 700 that cover the sidewalls of the first holes 730 are referred to as the second insulating structures 710 of the combined DCH-CT structure 130(C). The first spacer layer 700 can include any suitable materials, such as silicon oxide. The first spacer layer 700 can be formed by performing any suitable deposition techniques, such as CVD, PVD, ALD, an e-beam evaporation, a sputtering, a diffusion, or any combination thereof.

In an example, prior to the deposition of the first spacer layer 700, a remote plasma oxidation (RPO) is performed to form an interfacial layer over the sidewalls of the first holes 730. In an example, the insulating layers 122 include silicon oxide and the sacrificial layers 124 include silicon nitride. The sacrificial layers 124 (e.g., silicon nitride) are oxidized by the RPO to form the interfacial layer that can increase adhesion between the first spacer layer 700 and the sacrificial layers 124, and thus the combined DCH-CT structure 130 formed in the first holes 730 can provide better support the staircase region 120. In an example, the first spacer layer 700 at the bottom surfaces of the first holes 730 extends into the corresponding insulating layers 122 that are adjacent to the bottom surfaces of the first holes 730. For example, the first spacer layer 700 at the bottom surfaces of the first hole 730(A) extends into the insulating layer 122(B).

Figure 9:
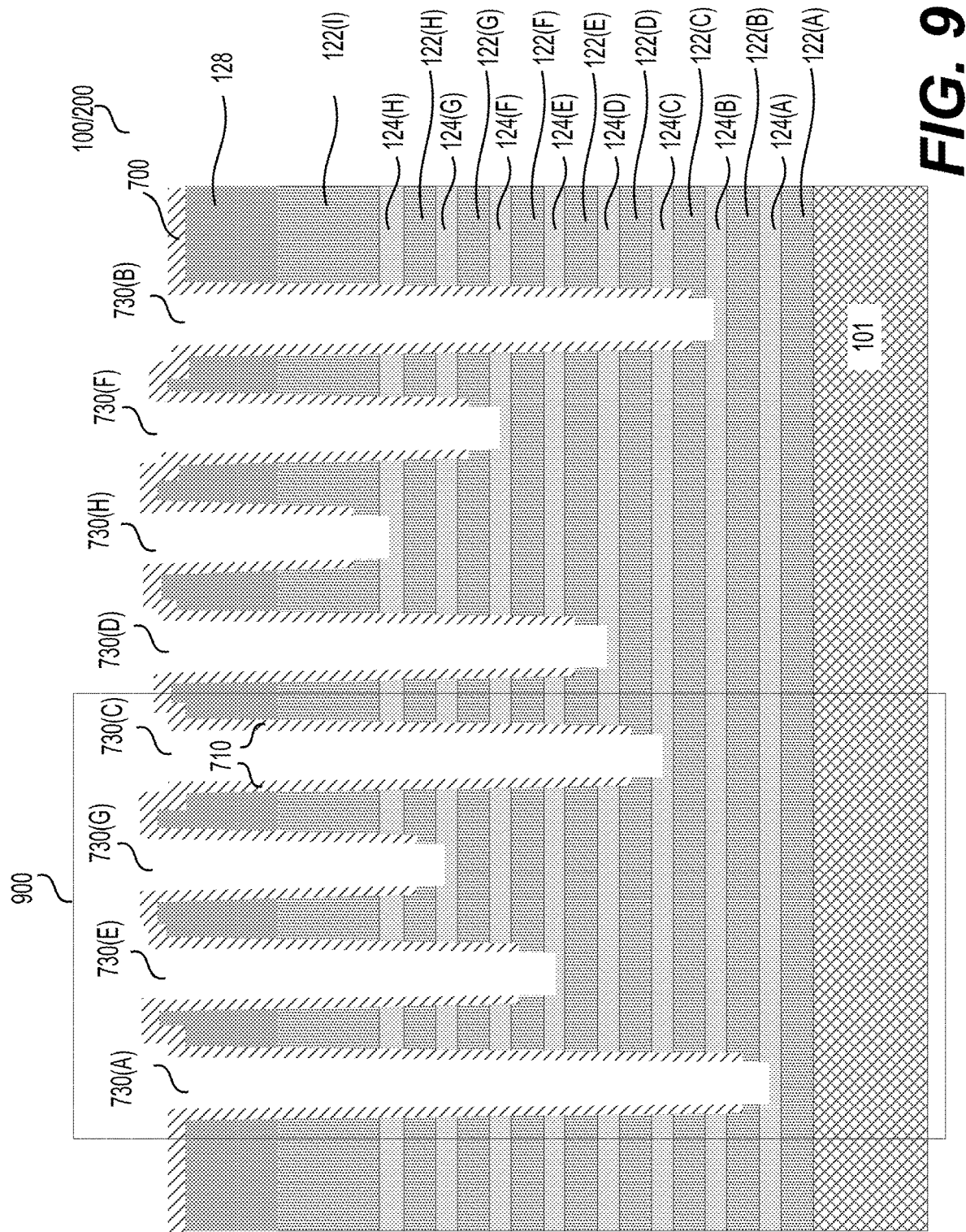

Referring to FIGS. 9 and 19A, at S1910, the first spacer layer 700 covering the bottom surfaces of the first holes 730 and the insulating layers 122 that are directly below the bottom surfaces of the first holes 730 are removed by an etching process. The etching process can be referred to as a spacer oxide punch as the first spacer layer 700 at the bottom surfaces of the first holes 730 are punched through by the etching process. The etching process can include a dry etching process, a wet etching process, a combination, or the like. In an example, the etching process is a dry etching process. Accordingly, the first holes 730 penetrate deeper into the stack 150. In an example, the first holes 730(A)-730(H) in FIG. 9 penetrate into the sacrificial layers 124(A)-124(H), respectively.

For clarity purposes, a portion 900 of the semiconductor device 100 is shown as an example in the following steps (e.g., FIGS. 10-18) in the process 1900, FIG. 1A also shows the portion 900 of the semiconductor device 100. The portion 900 includes the first holes 730(A), 730(C), 730(E), and 730(G).

Figure 10:
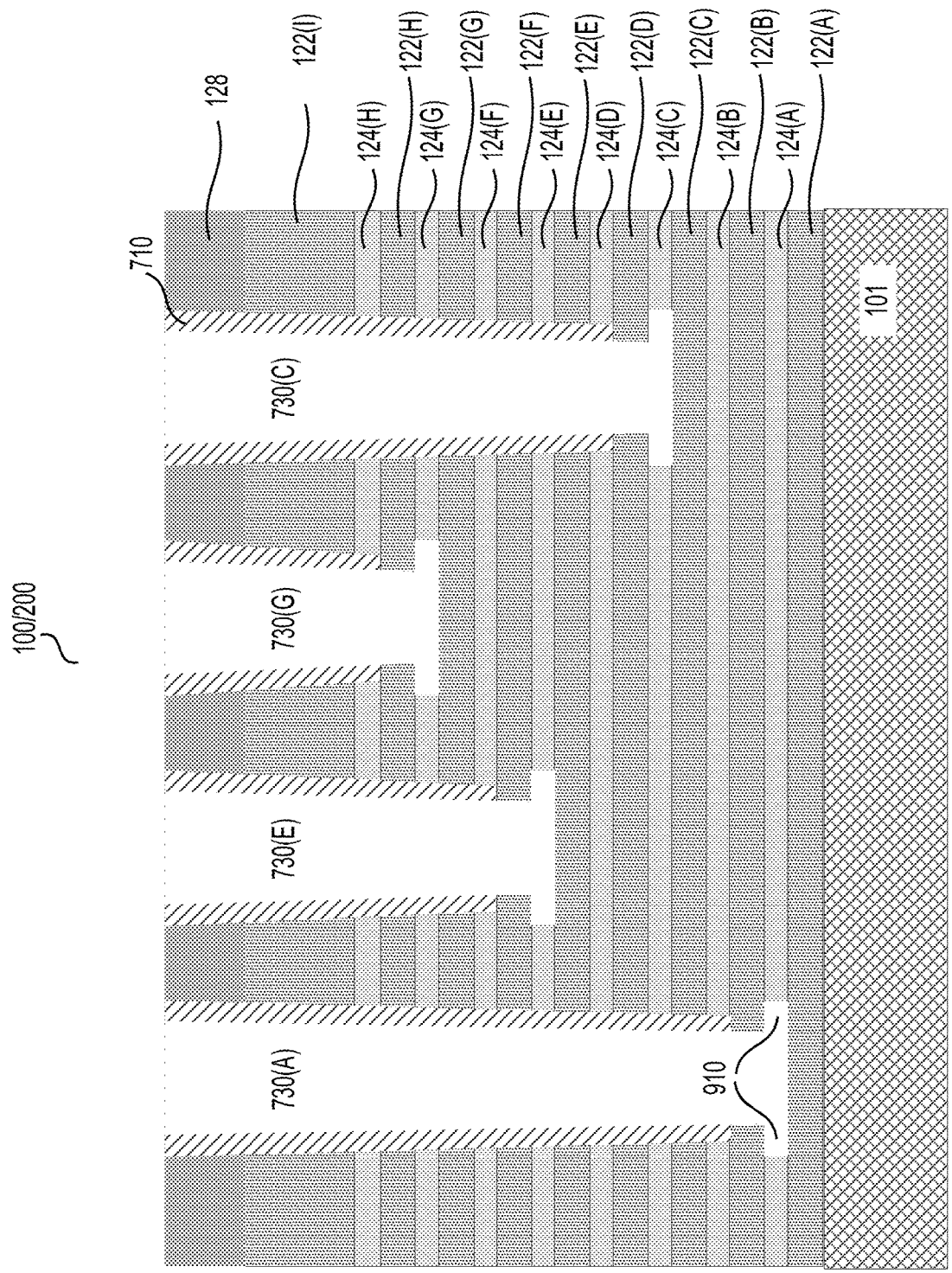

Referring to FIGS. 10 and 19A, at S1912, first recessed regions 910 are formed in the respective sacrificial layers 124 (e.g., 124(A), 124(C), 124(E), and 124(G)) into which the corresponding first holes (e.g., 730(A), 730(C), 730(E), and 730(G)) penetrate. An etching process including a dry etching process, a wet etching process, or a combination thereof can be used to form the first recessed regions 910 by removing portions of the respective sacrificial layers 124 (e.g., 124(A), 124(C), 124(E), and 124(G)) that are adjacent to the first holes 730. In an example, the first holes 730 (e.g., 730(A), 730(C), 730(E), and 730(G)) are enlarged to reach to bottom surfaces of the respective sacrificial layers 124

(e.g., 124(A), 124(C), 124(E), and 124(G)). The first holes 730 are connected to the first recessed regions 910. In an example, the first spacer layer 700 that covers a top portion of the mask layer 128 is removed in the etching process at S1912. In an example, the top portion of the mask layer 128 is further removed in the etching process at S1912.

Figure 11:
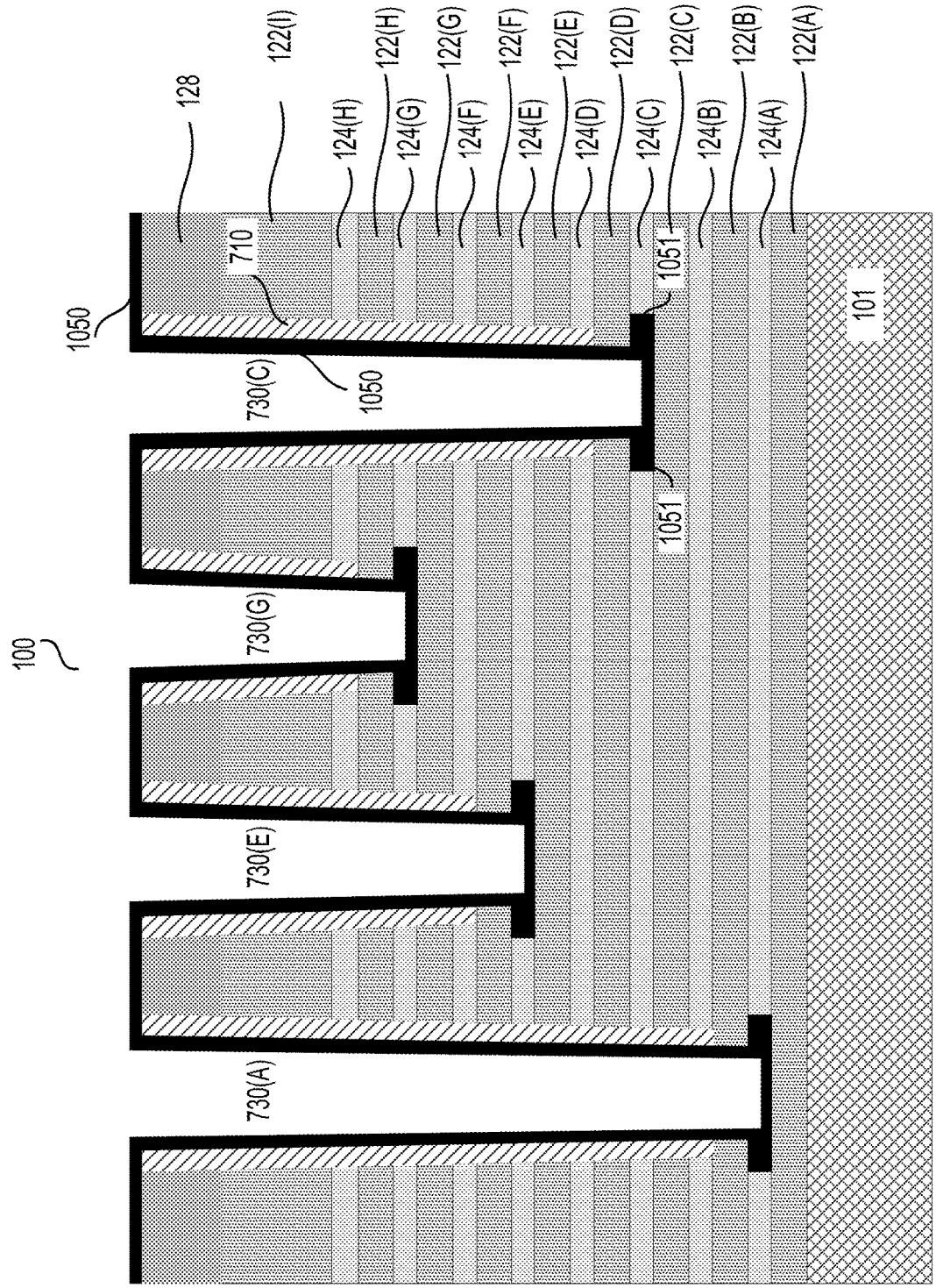

Referring to FIGS. 11 and 19A, at S1914, the first recessed regions 910 can be filled with a conductive layer 1050. The conductive layer 1050 can further cover the sidewalls of the first holes (e.g., 730(A), 730(C), 730(E), and 730(G)) and the stack 150. In an example, the conductive layer 1050 completely fills the first recessed regions 910. Portions of the conductive layer 1050 that fill the first recessed regions 910 are referred to as the conductive portions 1051.

A material of the conductive layer 1050 can include any suitable conductive material(s), such as metallic materials (e.g., W). In an example, the material of the conductive layer 1050 includes W and the conductive layer 1050 is referred to as a W liner. The conductive layer 1050 can be formed using any suitable deposition techniques, such as CVD, PVD, ALD, an e-beam evaporation, a sputtering, a diffusion, or any combination thereof.

Figure 12:
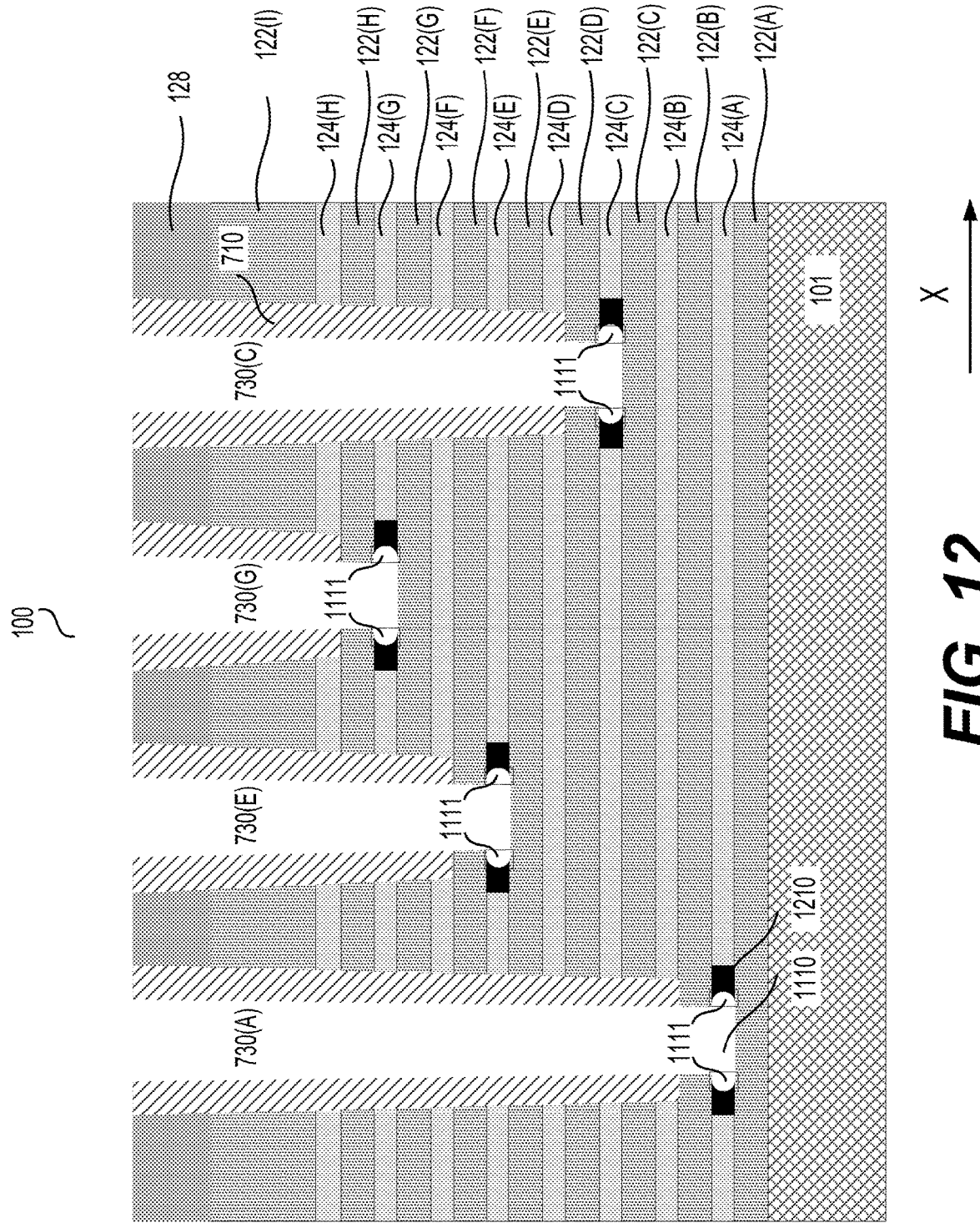

Referring to FIGS. 12 and 19A, at S1916, the conductive layer 1050 over the sidewalls of the first holes 730 (e.g., 730(A), 730(C), 730(E), and 730(G)) and the stack 150 is removed by an etching process. Portions of the conductive portions 1051 in the first recessed regions 910 can be removed (or recessed) by the etch process at S1916. Because thicknesses of the respective conductive portions 1051 along the X direction are significantly larger than thicknesses of the conductive layer 1050 over the sidewalls of the first holes 730, relatively large portions of the conductive portions 1051 in the first recessed regions 910 remain intact after the etch process at S1916. The remaining portions of the conductive portions 1051 can be referred to as the remaining conductive portions 1210. Further, spaces 1110 can be formed due to removal of the conductive layer 1050 over the bottom surfaces of the first holes 730. The first holes 730 further include the respective spaces 1110. In an example, the spaces 1110 further include recesses 1111 formed in the conductive layer 1050.

Figure 13:
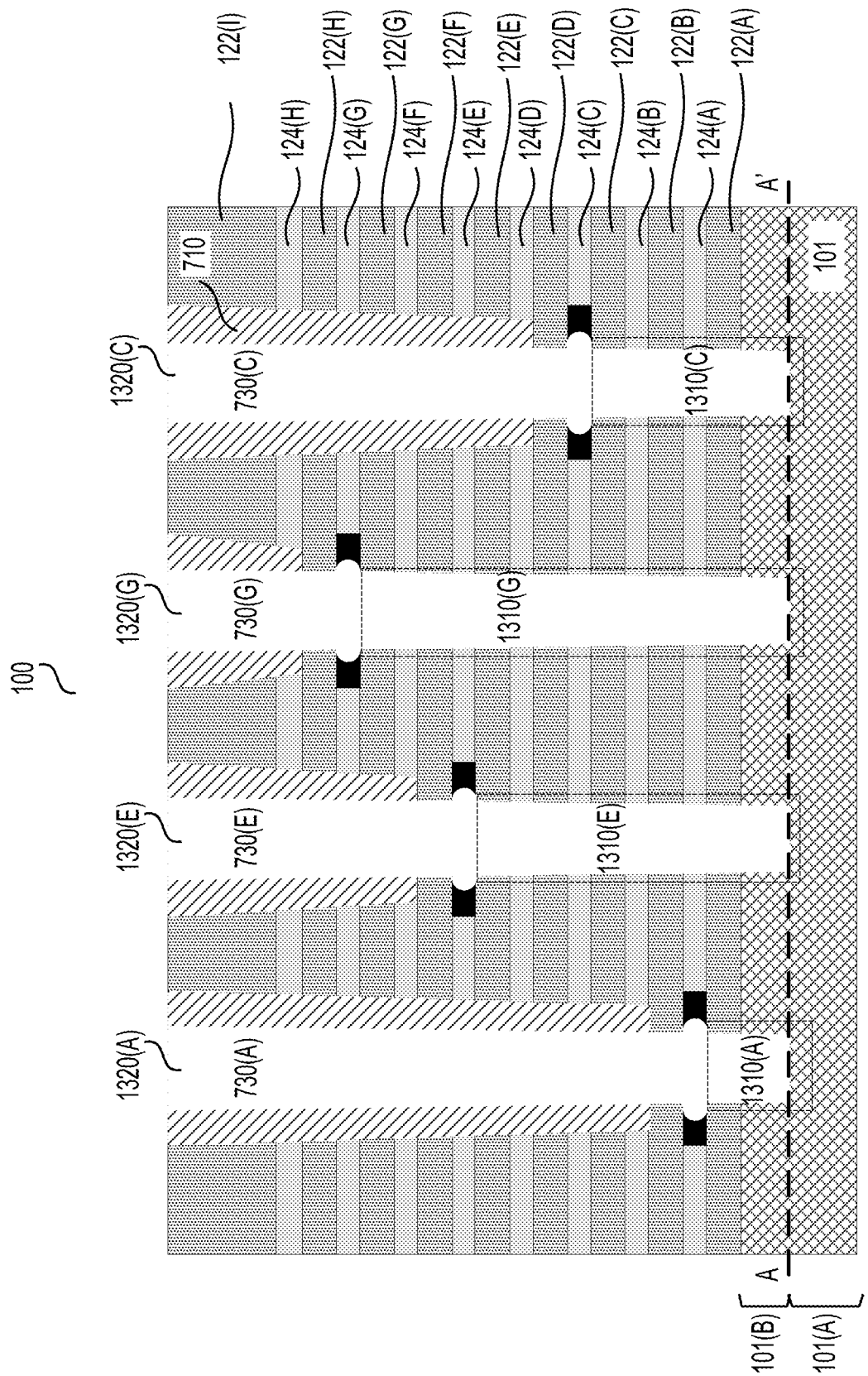

Referring to FIGS. 13 and 19B, at S1918, materials between the first holes 730 (or the spaces 1110) and the bottom portion 101(A) of the insulating layer 101 can be removed by an etching process (e.g., a dry etching process) to form second holes 1310 (e.g., 1310(A), 1310(C), 1310(E), and 1310(G)) that are directly connected to the respective first holes 730. For example, the second hole 1310(A) is connected to the first hole 730(A), and the second hole 1310(E) is connected to the first hole 730(E). Combined holes 1320 (e.g., 1320(A), 1320(C), 1320(E), and 1320(G)) include the first holes 730 and the respective second holes 1310 that are connected to the first holes 730. For example, the combined hole 1320(A) includes the first hole 730(A) and the second hole 1310(A). The combined stair-DCH-CT structures 130 can subsequently be formed in the respective combined holes 1320.

The materials removed can include one or more insulating layers 122 and the upper portion 101(B) of the insulating layer 101 that are between the first holes 730 and the bottom portion 101(A) of the insulating layer 101. The materials removed can further include one or more sacrificial layers 124 that are between the first holes 730 and the bottom portion 101(A) of the insulating layer 101. For example, the second hole 1310(A) is formed by removing the insulating layer 122(A) and the upper portion 101(B) of the insulating layer 101, and the second hole 1310(C) is formed by removing the insulating layers 122(A)-122(C), the sacrificial layers 124(A)-124(B), and the upper portion 101(B) of the insulating layer 101.

In an example, the mask layer 128 is removed after forming the second holes 1310, for example, by a plasma ashing and a wet clean.

Figure 14:
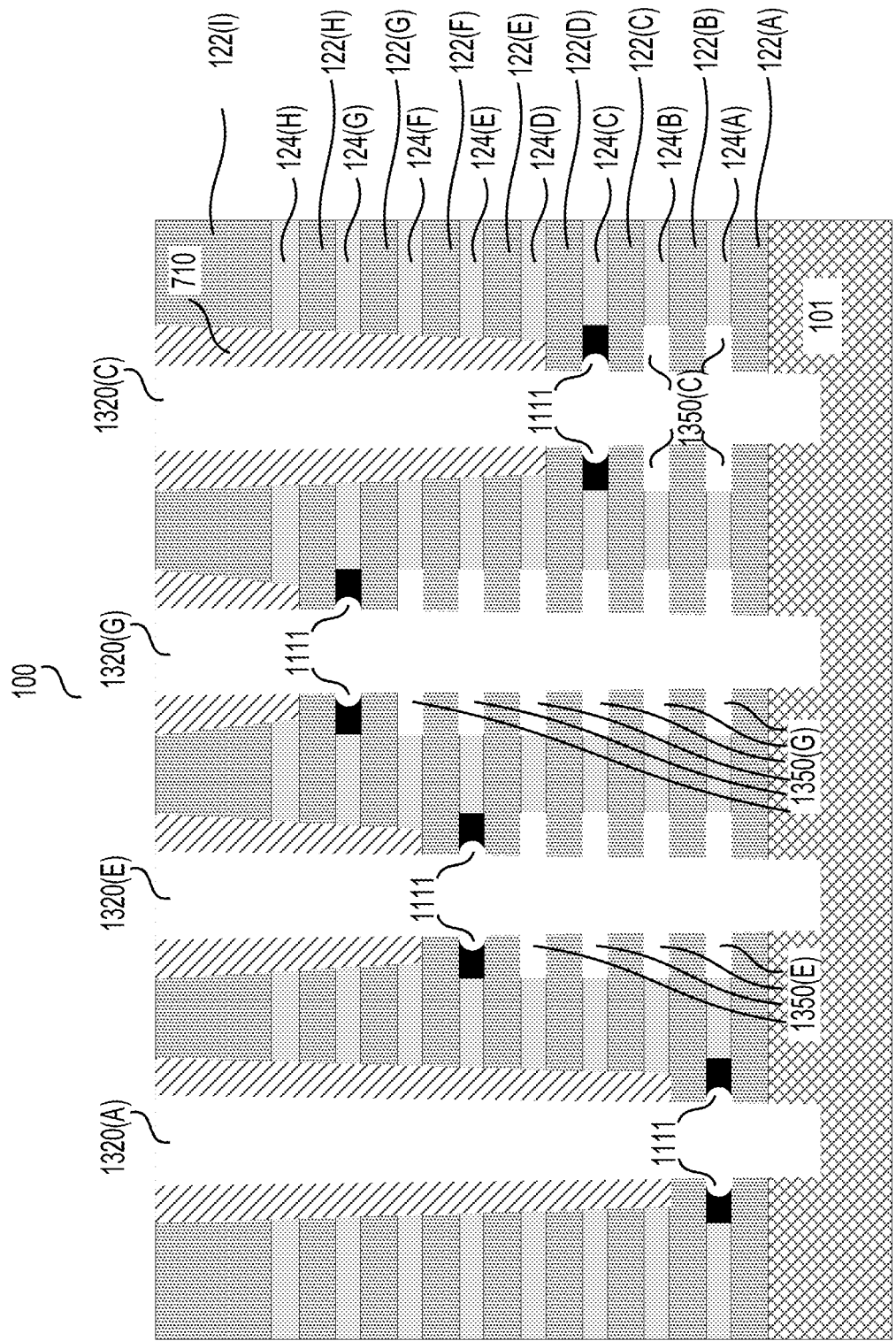

Referring to FIGS. 14 and 19B, at S1920, second recessed region(s) 1350 (e.g., 1350(C), 1350(E), 1350(G)) are formed in the respective sacrificial layer(s) 124 by removing portions of the respective sacrificial layer(s) 124 using an etching process, such as a dry etching process, a wet etching process, or a combination thereof. The second recessed region(s) 1350 are formed in the respective sacrificial layer(s) 124 that are adjacent to the second holes 1310. For example, the second recessed regions 1350(C) are formed in the sacrificial layers 124(A)-124(B). In an example, no second recessed region is formed adjacent to the second hole 1310(A).

Figure 15:
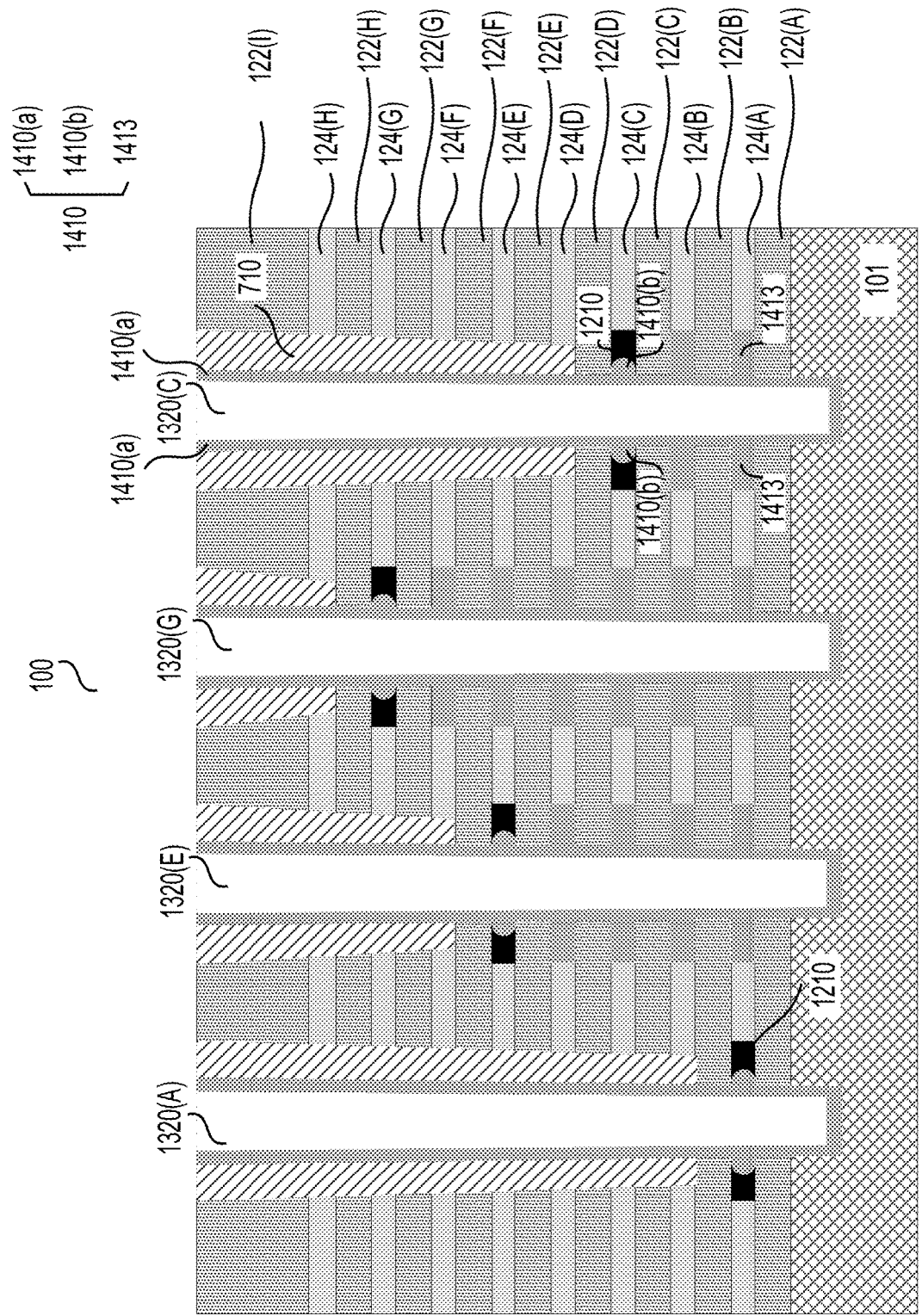

Referring to FIGS. 15 and 19B, at S1922, a second spacer layer 1410 is formed over sidewalls of the combined holes 1320. The second spacer layer 1410 can further fill the second recessed regions 1350 and the recesses 1111. The second spacer layer 1410 can include a portion 1410(a) that covers the sidewalls of the combined holes 1320, portions 1410(b) that fill the recesses 1111, and portions 1413 that fill the second recessed regions 1350. Any suitable deposition techniques, such as CVD, PVD, ALD, an e-beam evaporation, a sputtering, a diffusion, or any combination thereof can be performed to form the second space layer 1410. In an example, the second spacer layer 1410 is formed of silicon oxide. In an example, ALD is performed to form the second space layer 1410. In an example, such as shown in FIG. 15, the second space layer 1410 completely fills the second recessed regions 1350 to provide stronger support to the staircase region 120 as compared to an incomplete filling.

Figure 16:
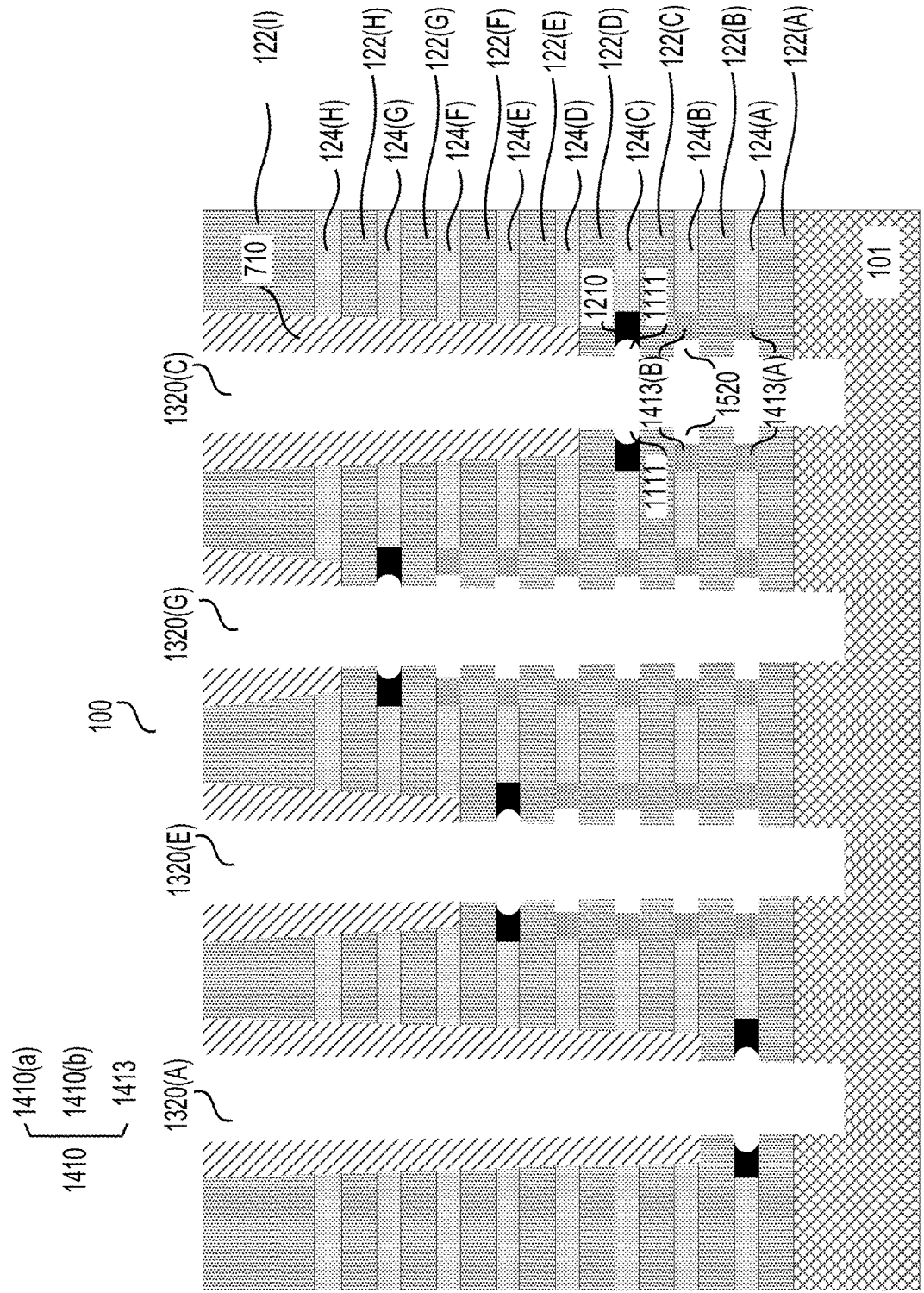

Referring to FIGS. 16 and 19B, at S1924, the second spacer layer 1410 (e.g., 1410(a)) over the sidewalls of the combined holes 1320 and the stack 150 are removed by an etching process. Further, the second spacer layer 1410 (e.g., the portions 1410(b) that fill the recesses 1111) is removed to expose the remaining conductive portions 1210 by an etching process. The recesses 1111 are exposed. In an example, a part of the portions 1413 is removed, and recesses 1520 are formed in the etching process. An etching process that selectively etches the second spacer layer 1410 (e.g., silicon oxide) can be performed in S1924. The remaining portions 1413 (e.g., 1413(A) and 1413(B)) that are between the insulating layers 122 are the first insulating structures shown in FIG. 1A.

Figure 17:
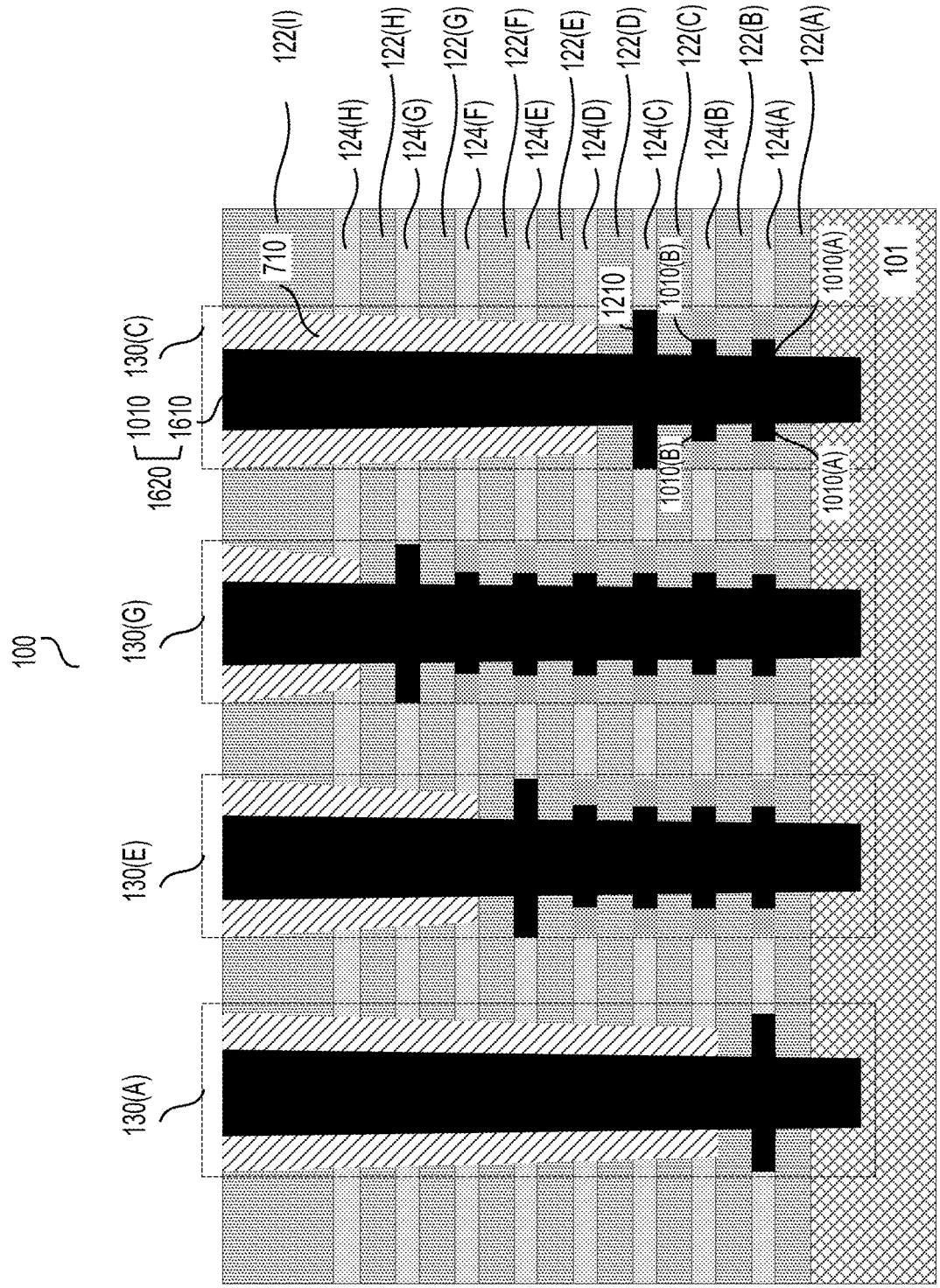

Referring to FIGS. 17 and 19B, at S1926, the combined holes 1320 can be filled with conductive (e.g., metallic) material(s) to form the conductive structure 1620. In an example, the metallic material(s) completely fill the combined holes 1320. Further, the metallic material(s) fills the recesses 1111 to conductively connect to the remaining conductive portions 1210 and fills the recesses 1520 to form the protrusions 1010 (e.g., 1010(A)-1010(B)) of the conductive structure 1620. The conductive structure 1620 is described with reference to FIG. 1A, and thus detailed descriptions are omitted for purposes of brevity. In an example, the metallic material(s) include W. Referring to FIG. 17, the combined DCH-CT structures 130 (e.g., 130(A), 130(C), 130(E), and 130(G)) are formed. In some embodiments, a CMP is performed to remove the metallic material(s) deposited over the stack 150.

Referring back to FIG. 1A and referring to FIG. 19B, at S1928, the sacrificial layers 124 are replaced with the gate layers 1710. For example, the sacrificial layers 124 are removed by an etching process, and the gate layers 1710 can be formed subsequently. In an example, gate line slits (GLS) (not shown) are etched as trenches in the stack 150. Etchants to the sacrificial layers 124 are applied via the GLS to remove the sacrificial layers 124. In an example, the sacrificial layers 124 are made of silicon nitride, and hot sulfuric acid ($H_2SO_4$) is applied via the GLS to remove the sacrificial layers 124. Further, via the GLS, the gate layers 1710 are formed. In an example, the gate layers 1710 are formed of a metal layer. A material of the metal layer includes a metal or a combination of metallic materials having high conductivity, such as W, Cu, and the like. The gate layers 1710 can include additional layer(s).

When the sacrificial layers 124 are removed, the combined stair-DCH-CT structures 130 support the stack of insulating layers 122 in the staircase region 120.

The process 1900 can be suitably adapted to include additional step(s), to omit step(s), and/or to modify step(s). Referring to FIG. 18, the core structures 1810 within the metal pillars 1610 can be formed, for example, after S1926 and prior to S1928. For example, middle portions of the respective metal pillars 1610 are removed by an etching process followed by depositing an insulating material (e.g., an oxide layer) to form the core structures 1810. As described above, the core structures 1810 can include insulating material(s), such as silicon oxide and are referred to as oxide cores.

In an example, referring back to FIG. 16, at S1924, the recesses 1520 are not formed in the etching process, and thus no protrusions 1010 are formed, such as shown in FIG. 1B.

Figure 19C:
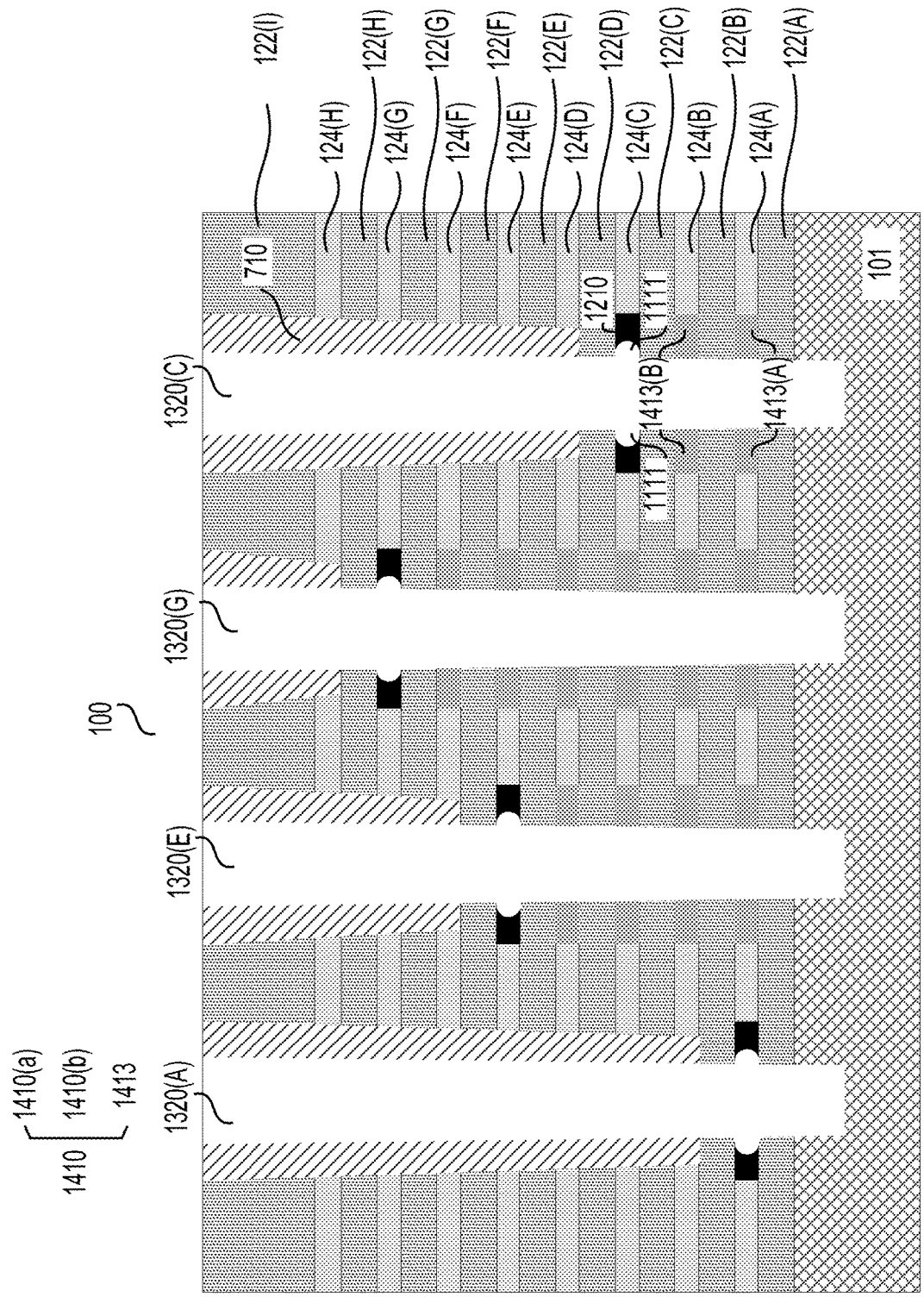
FIGS. 19C-19D show vertical cross-sectional views of the semiconductor device 100 at various steps of a process according to exemplary embodiments of the disclosure.
Figure 19D:
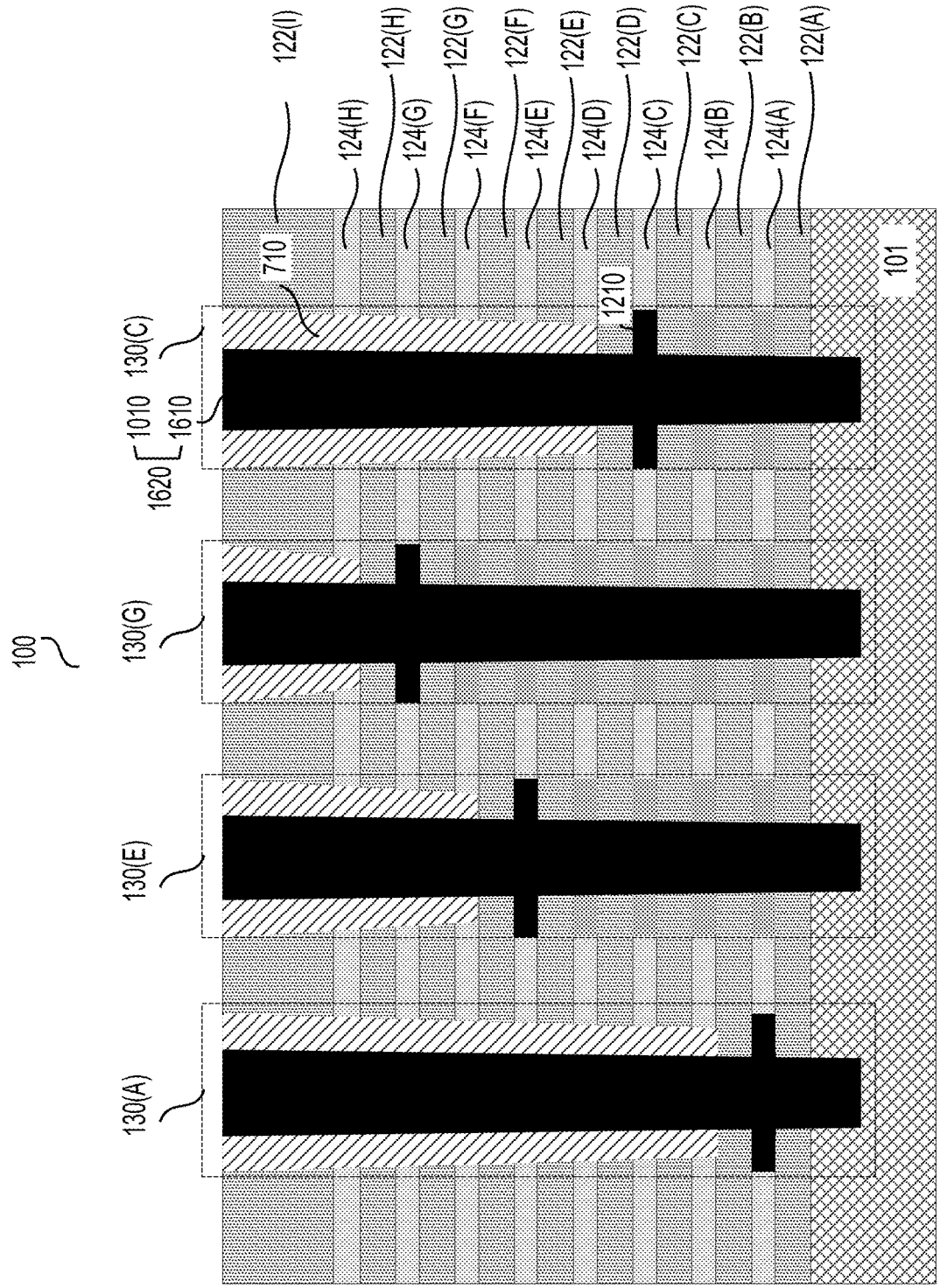

In an example, steps S1920, S1922, and S1924 corresponding to FIGS. 14-16 can be replaced by an oxidization step described with reference to FIG. 19C. Following S1918 described with reference to FIG. 13 and referring to FIG. 19C, portions of the sacrificial layers 124 (e.g., 124(A)-124(B)) that are adjacent to the second holes 1310 (e.g., 1310(C)) can be oxidized to form the first insulating structures 1413 (e.g., 1413(A)-1413(B)) directly. For example, the sacrificial layers 124 include silicon nitride, and can be oxidized into the first insulating structures 1413 that include silicon oxynitride (SiON). For example, Referring to FIG. 19D, at S1926, the combined holes 1320 can be filled with conductive (e.g., metallic) material(s) to form the conductive structure 1620. The conductive structure 1620 does not include protrusions. Referring to FIG. 1B, at S1928, the sacrificial layers 124 can be replaced by the gate layers 1710.

In an example, the semiconductor device 100 is manufactured by the process 1900 described with reference to FIGS. 1A, 1B, 2-18, and 19A-D over the insulating layer 101 and the substrate 102.

In an example, the semiconductor device 100 is manufactured over a sacrificial substrate. The stack 150 is formed over the sacrificial substrate instead of the insulating layer 101, and the process 1900 can be adapted accordingly. For example, after S1928 where the sacrificial layers are replaced by the gate layers, the sacrificial substrate can be removed by an etching process. A deposition process can be used to form the insulating layer 101 to cover the contact structures 130. Further, a deposition process, such as an epitaxial deposition can be applied to form the semiconductor layer 102 (e.g., a polysilicon layer) over the insulating layer 101.

Figure 33:
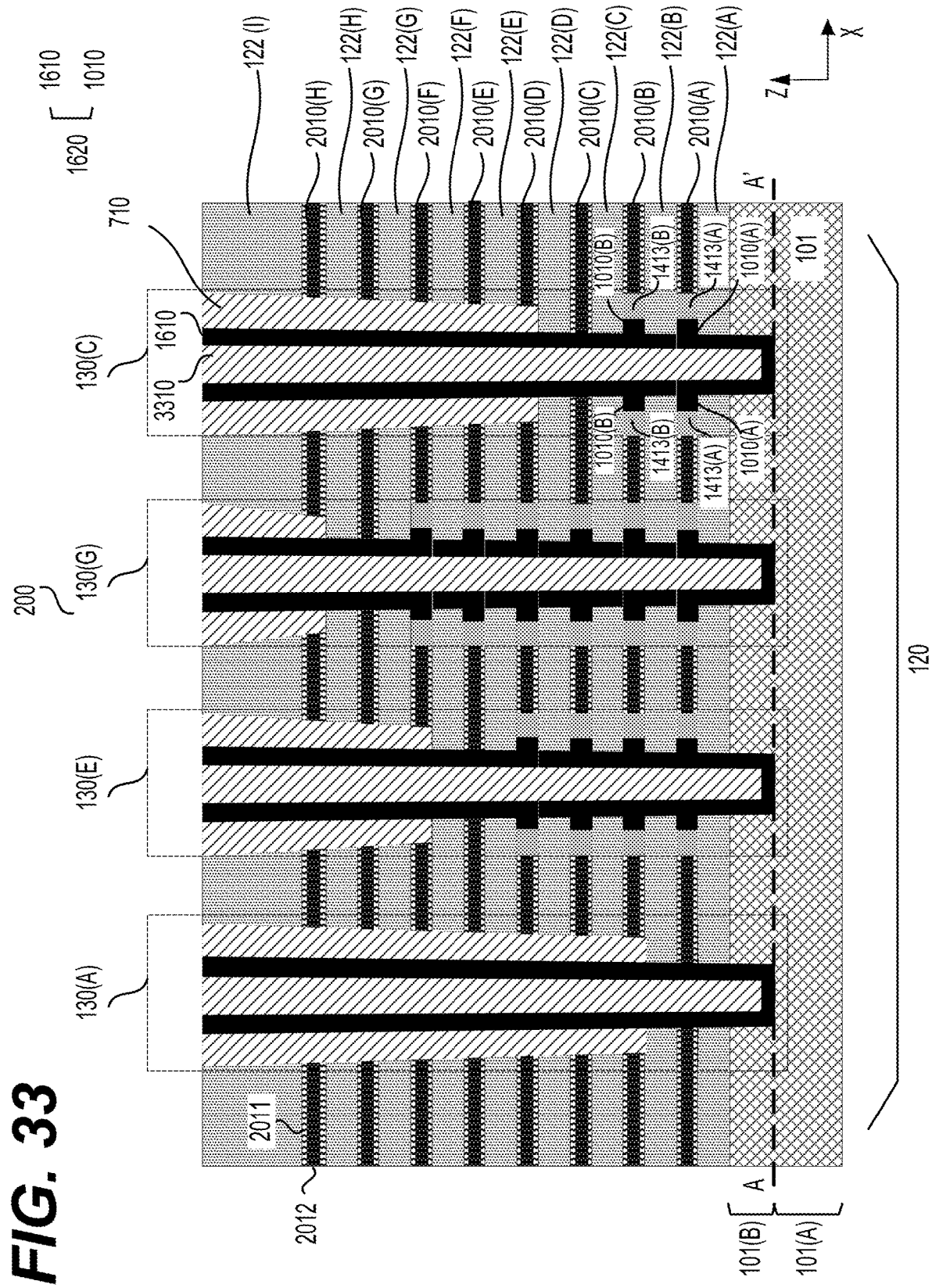

The semiconductor device 100 shown in FIGS. 1A-1B and/or FIG. 18 can be suitably adapted, for example, to include other structures and/or materials. For example, the gate layers 1710 in FIGS. 1A-1B and/or FIG. 18 include the MG electrode (or the metal layer) and do not include a high-k insulating layer. In some embodiments, the gate layers further include a high-k insulating layer, such as shown in FIGS. 20 and 33.

Figure 20:
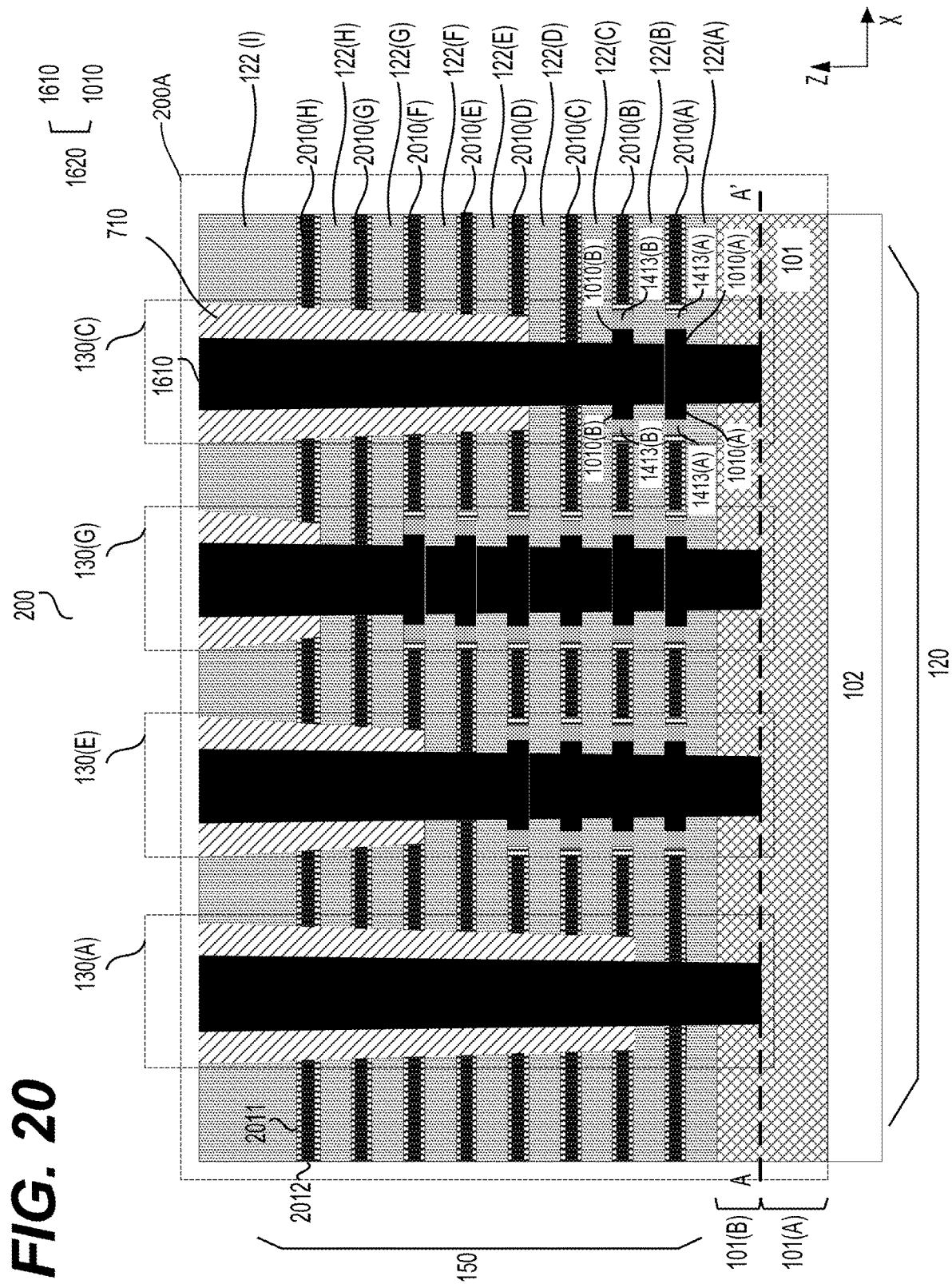
FIG. 20 shows a vertical cross-sectional view of a portion 200A of a semiconductor device 200 according to an exemplary embodiment of the disclosure.

FIG. 20 shows a vertical cross-sectional view of a portion 200A of a semiconductor device (or a memory device) 200 according to an embodiment of the disclosure. The semiconductor device 200 is identical to the semiconductor device 100 except for the gate layers 2010 (e.g., 2010(A)-2010(H)) in the semiconductor device 200, and thus detailed descriptions of the semiconductor device 200 are omitted for purposes of brevity. Referring to FIG. 20, the gate layers 2010 in the semiconductor device 200 include MG electrodes (or metal layers) 2012 and high-k insulating layers 2011. As described above, the high-k insulating layer 2011 can be formed of any suitable material(s) that provide a relatively large dielectric constant, such as HfO2, HfSiO4, HfSiON, Al2O3, La2O3, Ta2O5, Y2O3, ZrO2, SrTiO3, ZrSiO4, HfZrO4, and the like. The MG electrodes (or the metal layers) 2012 can be formed of a metal or a combination of metallic materials having high conductivity, such as W, Cu, and the like. In an example, the MG electrodes (or the metal layers) 2012 is formed of W.

In summary, the semiconductor device 200 includes the staircase region 120 that includes the stack 150 of the gate layers 2010 (e.g., 2010(A)-2010(H)) and the insulating layers 122 (e.g., 122(A)-122(1)) that are stacked alternatingly in the Z direction.

Further, referring to FIG. 20, the combined DCH-CT structures 130 (e.g., 130(A), 130(C), 130(E), and 130(G)) are formed in the stack 150 in the staircase region 120 to conductively connect to the gate layers 2010, respectively. The combined DCH-CT structures 130 in the semiconductor device 200 can be referred to as the combined stair-DCH-CT structure 130. Each of the combined DCH-CT structures 130 is electrically connected to only one of the gate layers 2010 and is electrically isolated from remaining ones of the gate layers 2010. For example, the combined DCH-CT structure 130(C) is electrically connected to the gate layer 2010(C) and is electrically isolated from the gate layers 2010(A)-2010(B) and 2010(D)-2010(H).

The combined DCH-CT structure 130(C) can include the conductive structure 1620 extending in the Z direction. The conductive structure 1620 can include the metal pillar 1610. The metal pillar 1610 can extend in the Z direction and form a conductive connection with one of the gate layers (e.g., the gate layer 2010(C)). Referring to FIG. 20, the metal pillar 1610 extends through the gate layers 2010 (e.g., 2010(A)-2010(H)) and the insulating layers 122 (e.g., 122(A)-122(1)) and penetrates into the insulating layer 101. In an example, the metal pillar 1610 reaches to the depth AA' into the insulating layer 101. The upper portion 101(B) of the insulating layer 101 is above the depth AA' and the bottom portion 101(A) of the insulating layer 101 is below the depth AA'. The metal pillar 1610 penetrates through the upper portion 101(B) of the insulating layer 101. In an example shown in FIG. 20, the metal pillars 1610 (or the combined DCH-CT structures 130) extend through the entire stack 150 along the Z direction. Thus, when sacrificial layers are being replaced by the gate layers 2010 in a gate-last fabrication technology, the combined DCH-CT structures 130 can provide strong support to the staircase region 120.

The conductive structure 1620 can further include the protrusions 1010 (e.g., 1010(A)-1010(B)) between each pair of the insulating layers 122 that are between the gate layer 2010(C) that is electrically connected to the combined DCH-CT structure 130(C) and the insulating layer 101, as described above with reference to FIG. 1A. The protrusions 1010 extend out from the metal pillar 1610 into the respective gate layers 2010.

Alternatively, in an example, the conductive structure 1620 in the semiconductor device 200 does not include protrusions. The conductive structure 1620 is a metal pillar. The first insulating structures 1413 electrically isolate the conductive structure 1620 (or the metal pillar) from respective gate layers of the gate layers 2010. Each of the first insulating structures 1413 can surround the conductive structure 1620 (or the metal pillar) and electrically isolate the conductive structure 1620 from a respective one of the gate layers 2010. In an example, the first insulating structures 1413 extend out from the conductive structure 1620 (or the metal pillar) into the respective gate layers 2010.

The combined DCH-CT structure 130(C) can include the first insulating structures 1413 (e.g., 1413(A)-1413(B)). The first insulating structures 1413 electrically isolate any protrusions 1010 of the conductive structure 1620 from a respective gate layer of the gate layers 2010. Each of the first insulating structures 1413 can be between the insulating layers 122 (e.g., each pair of the insulating layers) that are between the gate layer 2010(C) and the insulating layer 101. The first insulating structures 1413 are disposed on the first side of the gate layer 2010(C), for example, beneath the gate layer 2010(C). Each of the first insulating structures 1413 can surround the conductive structure 1620 and electrically isolate the conductive structure 1620 from a respective one of the gate layers 2010, as described above with reference to FIG. 1A. In an example, the first insulating structures 1413 can surround the respective protrusions 1010 and electrically isolate the conductive structure 1620 from the respective ones of the gate layers 2010.

The combined DCH-CT structure 130(C) can include the second insulating structure 710 that surrounds the conductive structure 1620 (and the metal pillar 1610) and electrically isolates the conductive structure 1620 (and the metal pillar 1610) from any gate layer of the gate layers 2010 that is above the insulating layer 101 and the gate layer 2010 (e.g., the gate layer 2010(C)) that is electrically connected to the combined DCH-CT structure 130(C), as described above with reference to FIG. 1A. The second insulating structure 710 can extend through one or more of the gate layers 2010 and the insulating layers 122 that are on the second side of the gate layer 2010(C) where the second side is opposite to the first side. For example, the second insulating structure 710 extends through the gate layers 2010(D)-2010(H) and the insulating layers 122(E)-122(H) that are above the gate layer 2010(C).

Referring to FIG. 20, the combined DCH-CT structure 130(C) comprises insulating structures that include the first insulating structures 1413 and the second insulating structure 710 that are disposed on opposite sides of the gate layer 2010 (e.g., the gate layer 2010(C)) that is electrically connected to the combined DCH-CT structure 130(C).

Note that each of the combined DCH-CT structures 130 is conductively connected to a different gate layer.

Referring to FIG. 20, the combined DCH-CT structures 130 can serve multiple purposes in the semiconductor device 200 and/or in manufacturing the semiconductor device 200: (i) serving as contacts to the corresponding gate layers 2010 and (ii) serving as dummy channels that support the staircase region 120, for example, during a gate-last process, as described above with reference to FIG. 1A.

The combined DCH-CT structures 130 in the semiconductor device 200 can be suitably adapted to include additional structure(s), to omit structure(s), to modify structure(s), and/or the like. Referring to FIG. 33, the combined DCH-CT structures 130 includes core structures 3310 within the metal pillars 1610. The core structures 3310 extend in the Z direction and through the gate layers 2010 and the insulating layers 122. A material of the core structure 3310 can be different from a material of the conductive structure 1620 (or the metal via 1610). In an example, the core structures 3310 are formed of insulating material(s), such as silicon oxide and are referred to as oxide cores. Having an oxide core or other insulating cores can reduce cost of metal deposition (e.g., W deposition) and mitigate issues associated with metal voids (e.g., voids in W), such as fluorine attack risk associated with voids in W.

FIGS. 21-33 show vertical cross-sectional views of the semiconductor device 200 at various steps of a process according to exemplary embodiments of the disclosure. For purposes of brevity, the structure 102 is not shown in FIGS. 21-33.

Figure 34A:
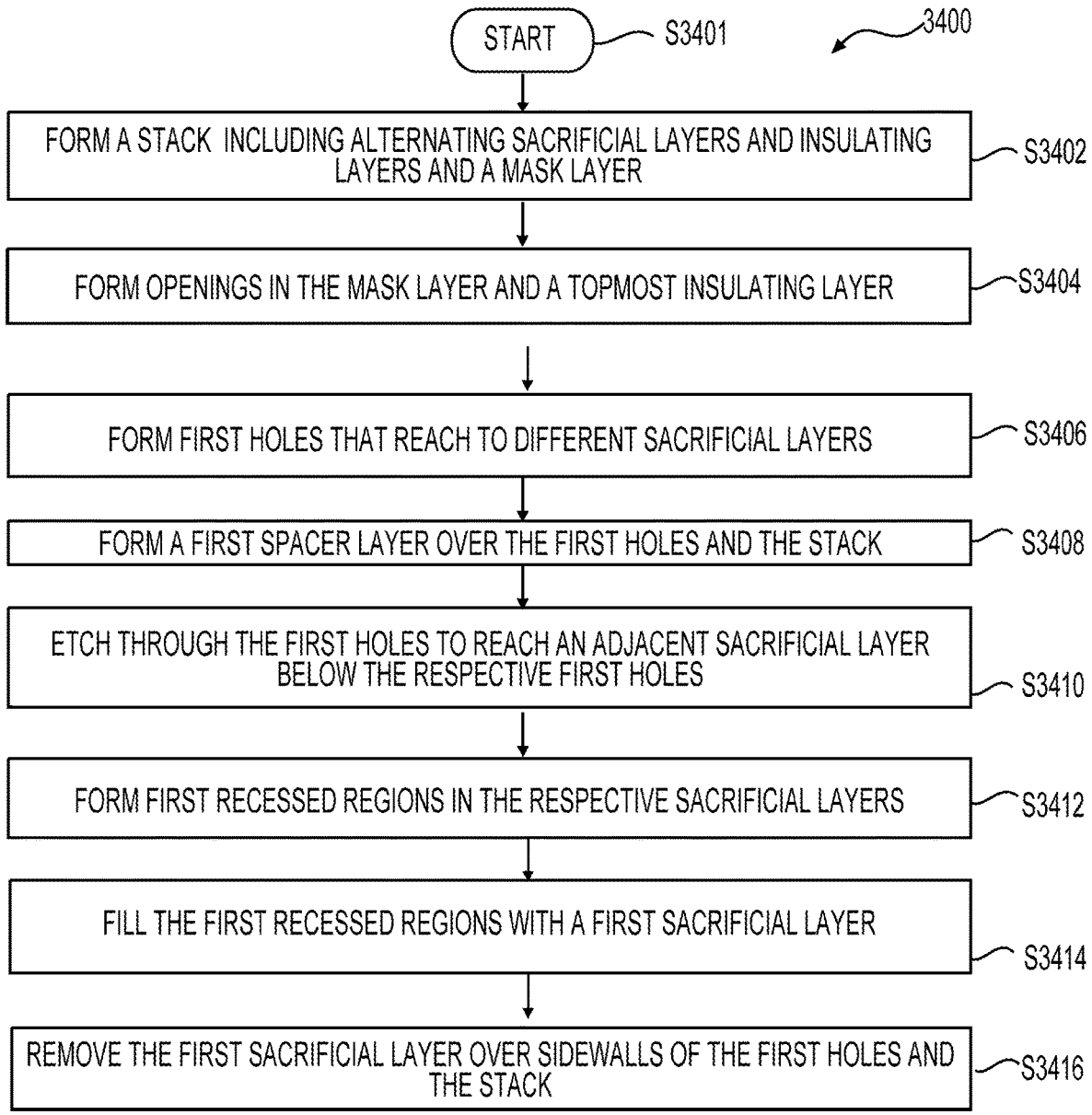
FIG. 34A-34B show a flow chart outlining a process 3400 example to manufacture the semiconductor device 200 according to an exemplary embodiment of the disclosure.
Figure 34B:
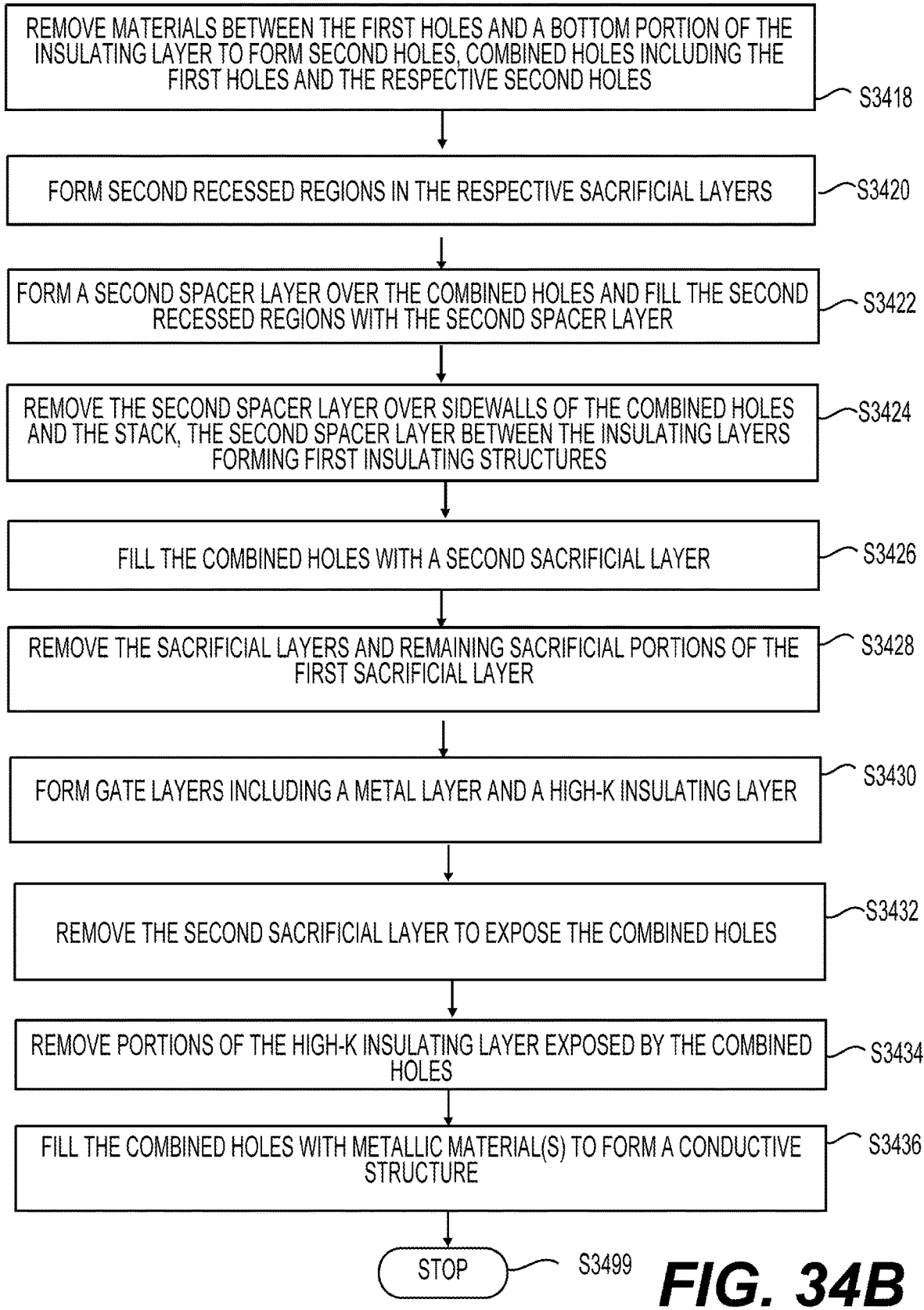

FIG. 34A-34B show a flow chart outlining a process 3400 example to manufacture the semiconductor device 200 according to an embodiment of the disclosure. The process 3400 starts at S3401 where a plurality of channel structures, such as described above for the semiconductor device 100, is formed in a core region of the semiconductor device 200. In some embodiments, holes are formed in the core region. A channel structure including a gate dielectric layer, a semiconductor layer, and an insulating layer can be formed within the holes. Comparing steps S1901 and S3401, prior to forming the gate dielectric layer (e.g., an ONO stack structure) of the channel structure in the semiconductor device 200, a high-k insulating layer is not formed to cover sidewalls of the holes. Thus, at S3401 in the process 3400, the channel structure of the semiconductor device 200 is formed directly over the sidewalls of the holes. On the other hand, at S1901 in the process 1900, the channel structure of the semiconductor device 100 is formed over the high-k insulating layer.

For clarity purposes, FIGS. 21-33 illustrate the staircase region 120 of the semiconductor device 200 and show the process 3400 used to form the combined DCH-CT structures 130 in the staircase region 120 of the semiconductor device 200.

Referring to FIG. 34A, steps S3402, S3404, S3406, S3408, S3410, and S3412 in the process 3400 are similar to the steps S1902, S1904, S1906, S1908, S1910, and S1912 in the process 1900, respectively and thus detailed descriptions are provided with references to FIGS. 2-10 and are omitted for purposes of brevity. FIGS. 2-10 show the vertical cross-sectional views of the semiconductor devices 100 and 200.

Figure 21:
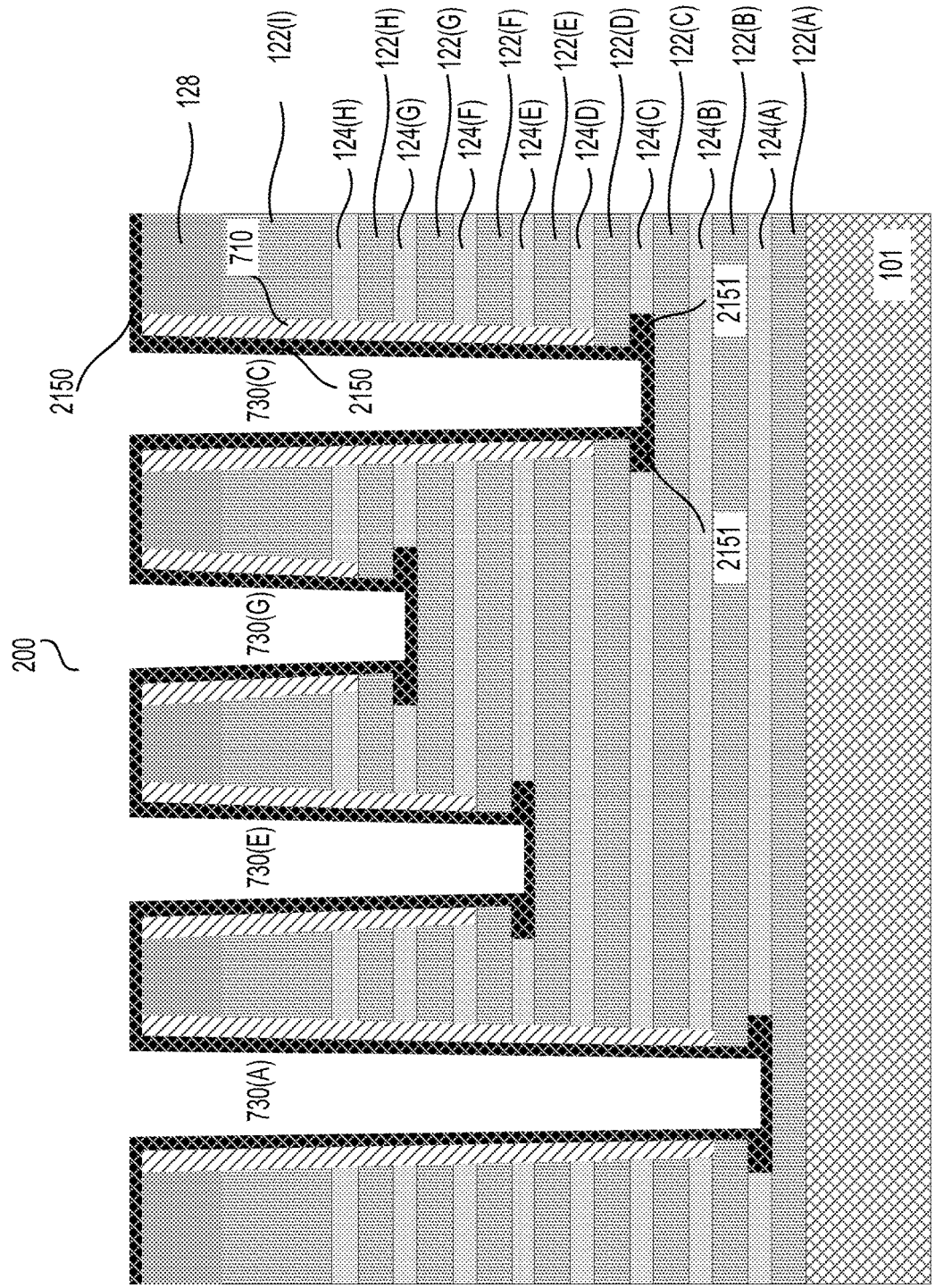
FIGS. 21-33 show vertical cross-sectional views of the semiconductor device 200 at various steps of a process according to exemplary embodiments of the disclosure.

Referring to FIGS. 21 and 34A, at S3414, the first recessed regions 910 can be filled with a sacrificial layer 2150 (also referred to a first sacrificial layer). The sacrificial layer 2150 can further cover the sidewalls of the first holes (e.g., 730(A), 730(C), 730(E), and 730(G)) and the stack 150. In an example, the sacrificial layer 2150 completely fills the first recessed regions 910. Portions of the sacrificial layer 2150 that fill the first recessed regions 910 are referred to as the sacrificial portions 2151.

The sacrificial layer 2150 can be formed of any suitable materials, such as polysilicon, metal oxide(s), or the like. In an example, a material is selected for the sacrificial layer 2150 such that an etch rate of the sacrificial layer 2150 is different from the etch rates of the insulating layers 122 (e.g., silicon oxide) and the sacrificial layers 124 (e.g., silicon nitride).

The sacrificial layer 2150 can be formed using any suitable deposition techniques, such as CVD, PVD, ALD, an e-beam evaporation, a sputtering, a diffusion, or any combination thereof.

Figure 22:
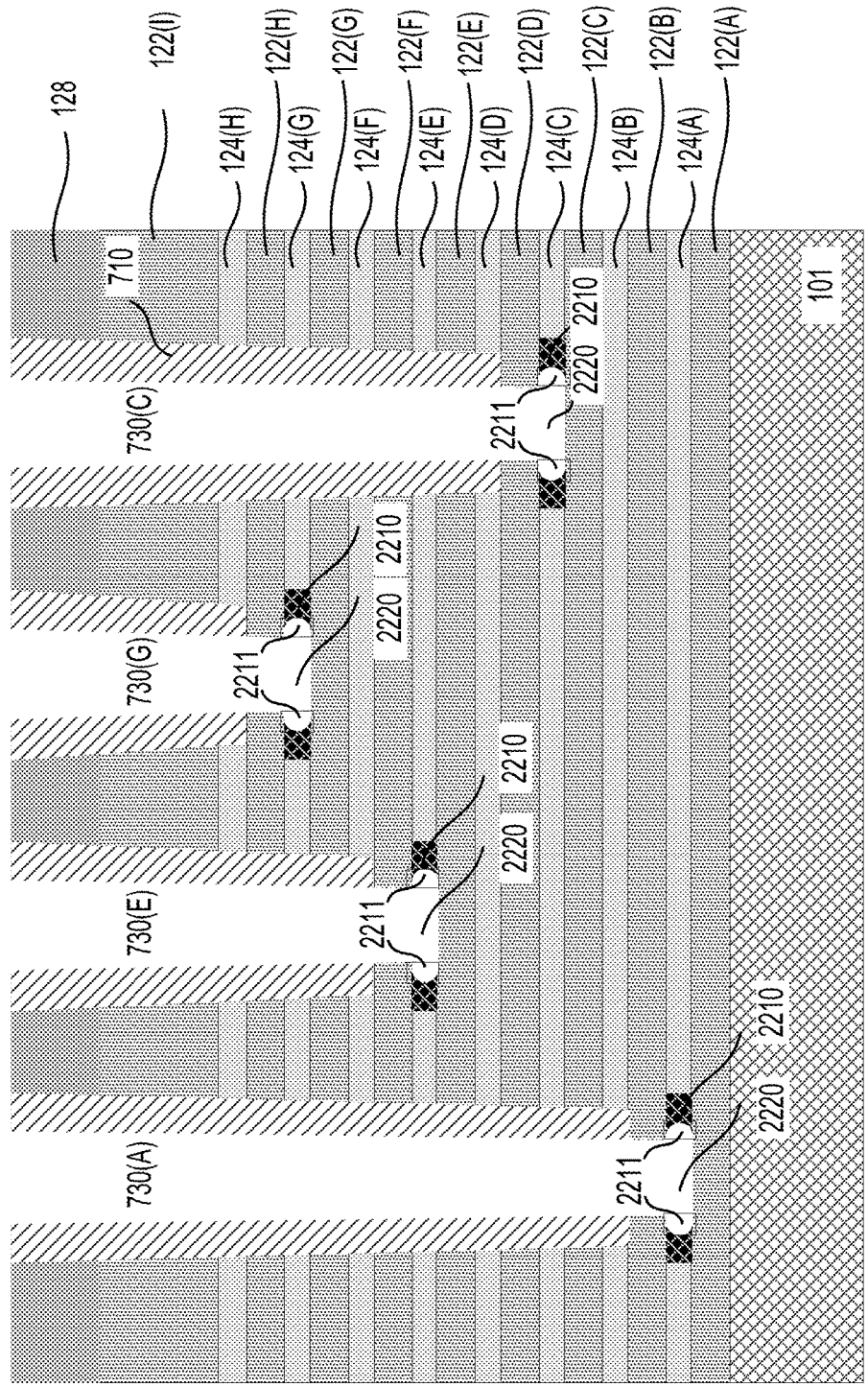

Referring to FIGS. 22 and 34A, at S3416, the sacrificial layer 2150 over the sidewalls of the first holes (e.g., 730(A), 730(C), 730(E), and 730(G)) and the stack 150 is removed by an etching process. Portions of the sacrificial layer 2150 in the first recessed regions 910 can be removed by the etch process at S3416. Because thicknesses of the respective sacrificial portions 2151 along the X direction are significantly larger than thicknesses of the sacrificial layer 2150 over the sidewalls of the first holes 730, relatively large portions of the sacrificial portions 2151 in the first recessed regions 910 remain intact after the etch process at S3416. The remaining portions of the sacrificial portions 2151 can be referred to as the remaining sacrificial portions 2210. Further, spaces 2220 can be formed due to removal of the sacrificial layer 2150 over the bottom surfaces of the first holes 730. The first holes 730 further include the respective spaces 2220. In an example, the spaces 2220 further include recesses 2211 formed in the remaining sacrificial portions 2210.

Figure 23:
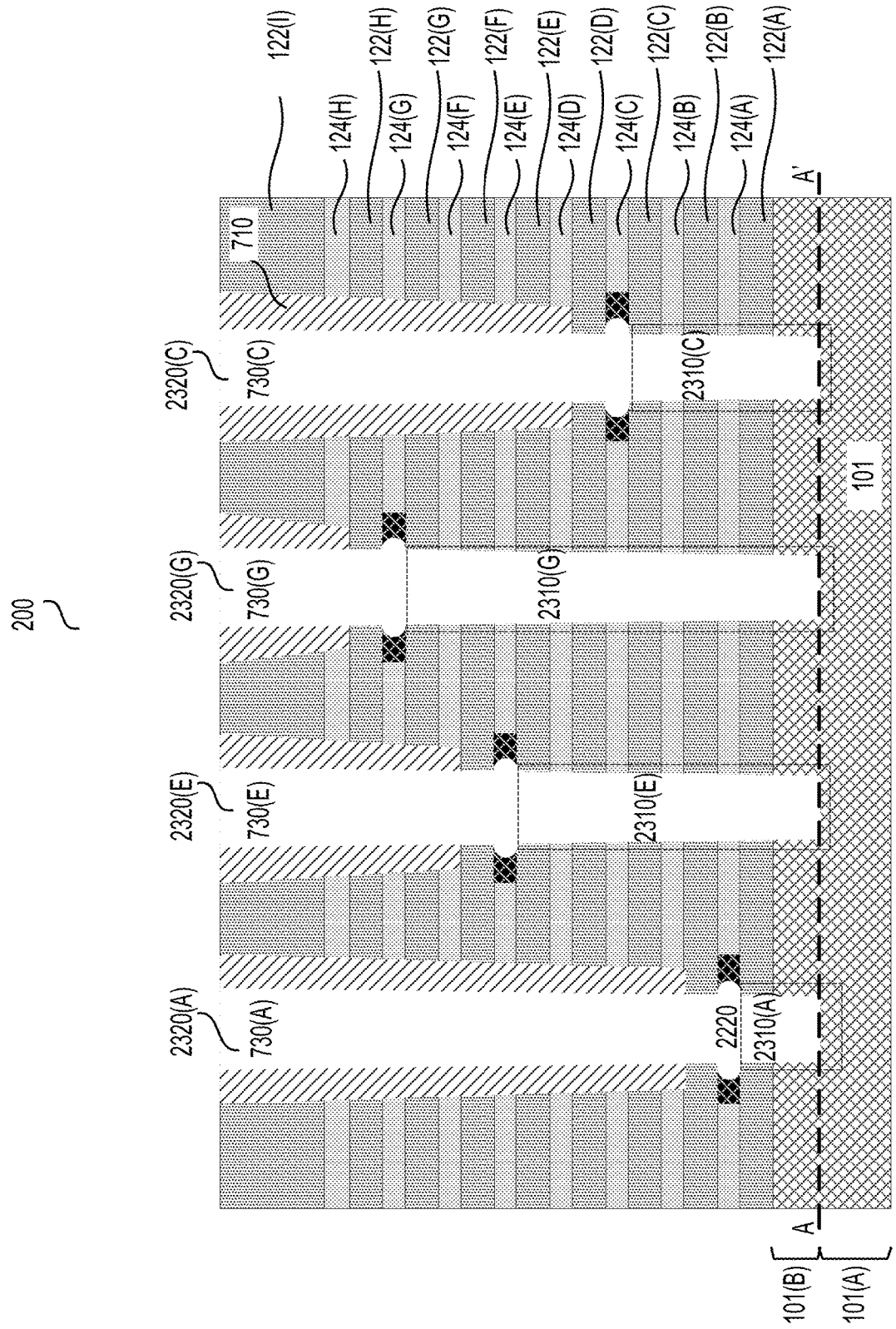

Referring to FIGS. 23 and 34B, at S3418, materials between the first holes 730 (or the spaces 2220) and the bottom portion 101(A) of the insulating layer 101 can be removed by an etching process (e.g., a dry etching process) to form second holes 2310 (e.g., 2310(A), 2310(C), 2310(E), and 2310(G)) that are directly connected to the respective first holes 730. For example, the second hole 2310(A) is connected to the first hole 730(A), and the second hole 2310(E) is connected to the first hole 730(E). Combined holes 2320 (e.g., 2320(A), 2320(C), 2320(E), and 2320(G)) include the first holes 730 and the respective second holes 2310 that are connected to the first holes 730. For example, the combined hole 2320(A) includes the first hole 730(A) and the second hole 2310(A). The combined stair-DCH-CT structures 130 can subsequently be formed in the respective combined holes 2320.

The materials removed can include one or more insulating layers 122 and the upper portion 101(B) of the insulating layer 101 that are between the first holes 730 and the bottom portion 101(A) of the insulating layer 101. The materials removed can further include one or more sacrificial layers 124 that are between the first holes 730 and the bottom portion 101(A) of the insulating layer 101. For example, the second hole 2310(A) is formed by removing the insulating layer 122(A) and the upper portion 101(B) of the insulating layer 101, and the second hole 2310(C) is formed by removing the insulating layers 122(A)-122(C), the sacrificial layers 124(A)-124(B), and the upper portion 101(B) of the insulating layer 101.

In an example, the mask layer 128 is removed after forming the second holes 2310, for example, by a plasma ashing and a wet clean.

Figure 24:
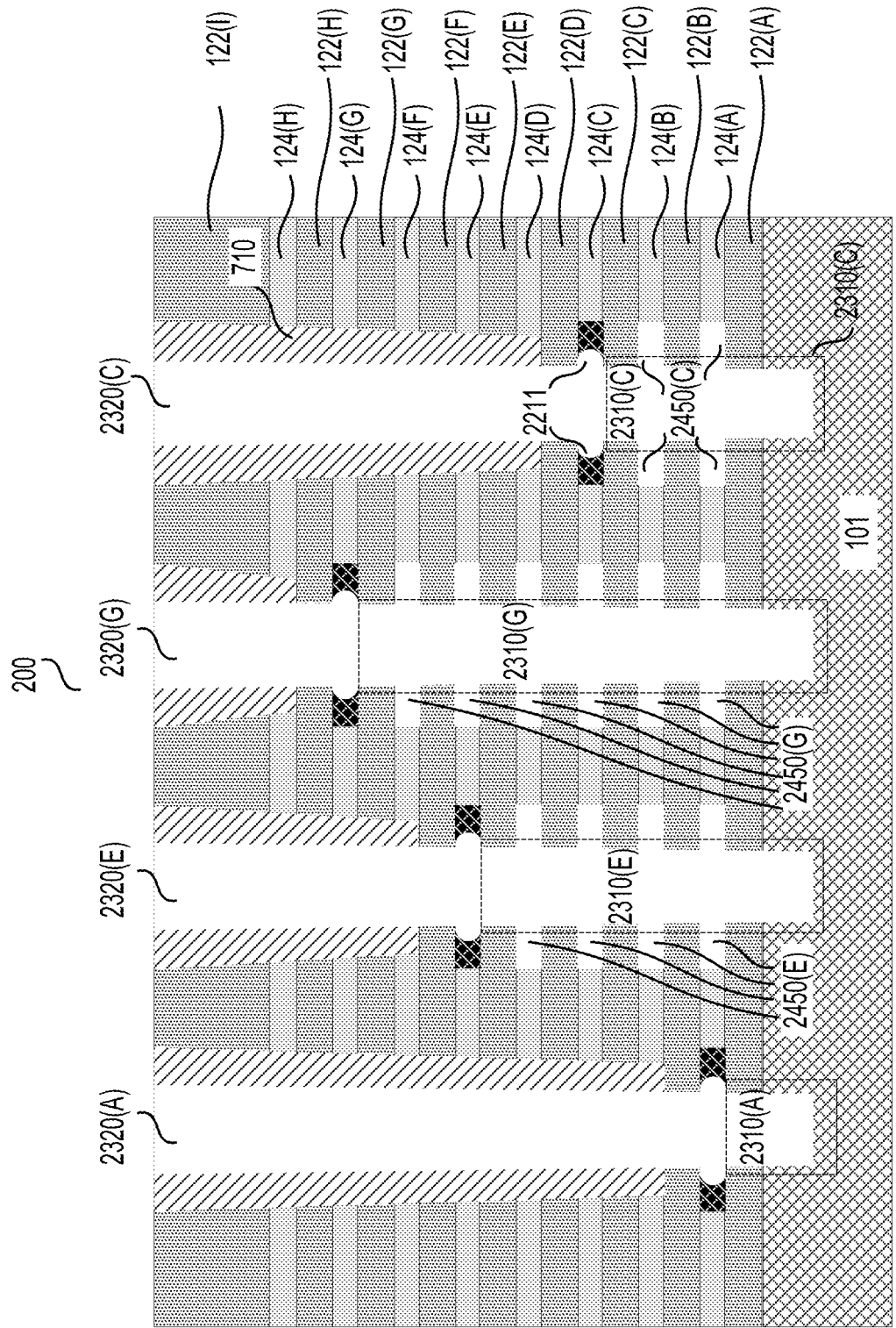

Referring to FIGS. 24 and 34B, at S3420, second recessed region(s) 2450 (e.g., 2450(C), 2450(E), 2450(G)) are formed in the respective sacrificial layer(s) 124 by removing portions of the respective sacrificial layer(s) 124 using an etching process, such as a dry etching process, a wet etching process, or a combination thereof. The second recessed region(s) 2450 are formed in the respective sacrificial layer(s) 124 that are adjacent to the second holes 2310. For example, the second recessed regions 2450(C) are formed in the sacrificial layers 124(A)-124(B). In an example, no second recessed region is formed adjacent to the second hole 2310(A).

Figure 25:
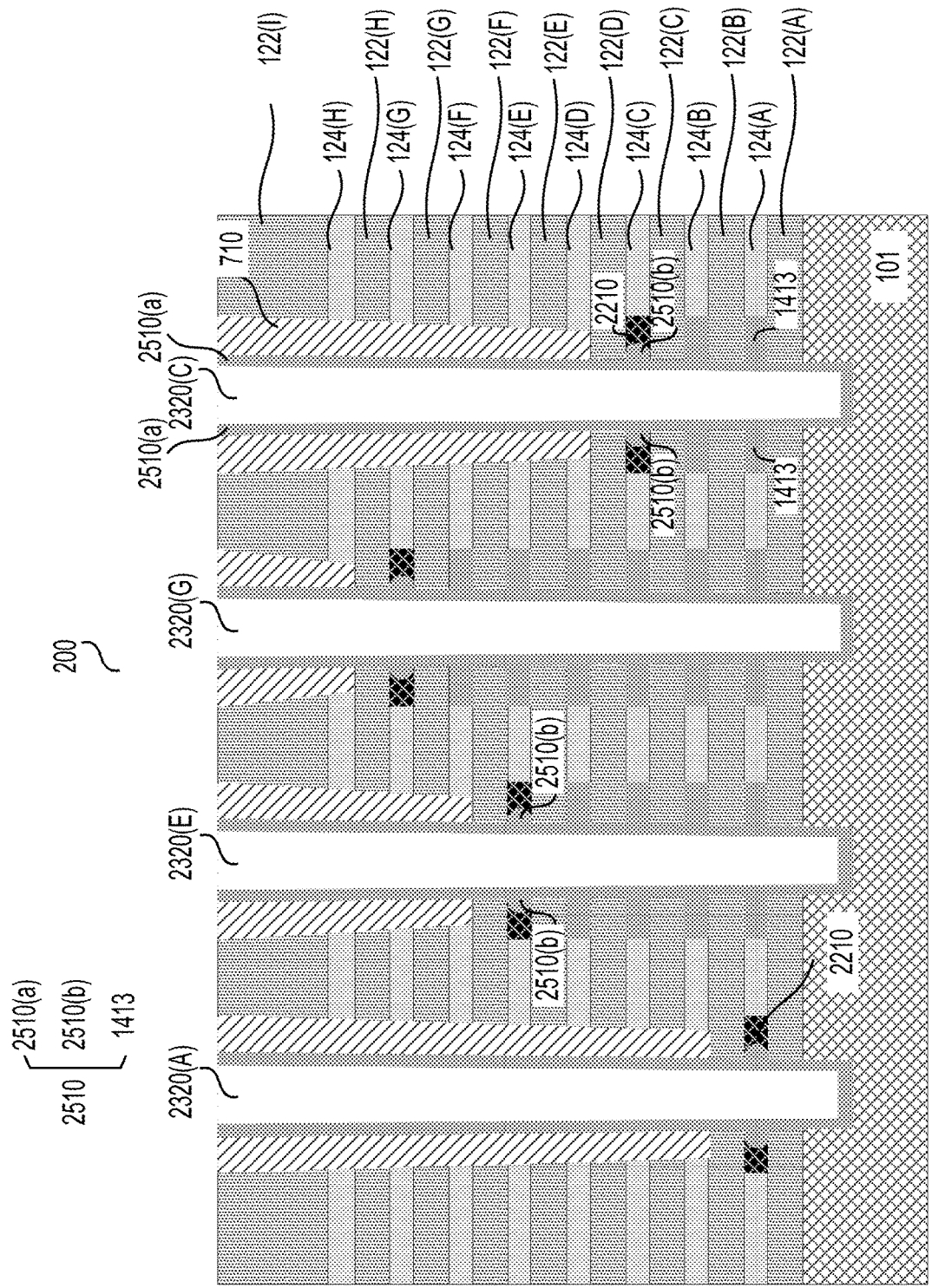

Referring to FIGS. 25 and 34B, at S3422, a second spacer layer 2510 (e.g., including 2510(a), 2510(b), and 1413) is formed over sidewalls of the combined holes 2320. The second spacer layer 2510 can further fill the second recessed regions 2450 and the recesses 2211. The second spacer layer 2510 can include the portion 2510(a) that cover the sidewalls of the combined holes 2320, the portions 2510(b) that fill the recesses 2211, and the portions 1413 that fill the second recessed regions 2450. Any suitable deposition techniques, such as CVD, PVD, ALD, an e-beam evaporation, a sputtering, a diffusion, or any combination thereof can be performed to form the second space layer 2510. In an example, ALD is performed to form the second space layer 2510. In an example, such as shown in FIG. 25, the second space layer 2510 completely fills the second recessed regions 2450 to provide stronger support to the staircase region 120 as compared to an incomplete filling.

Figure 26:
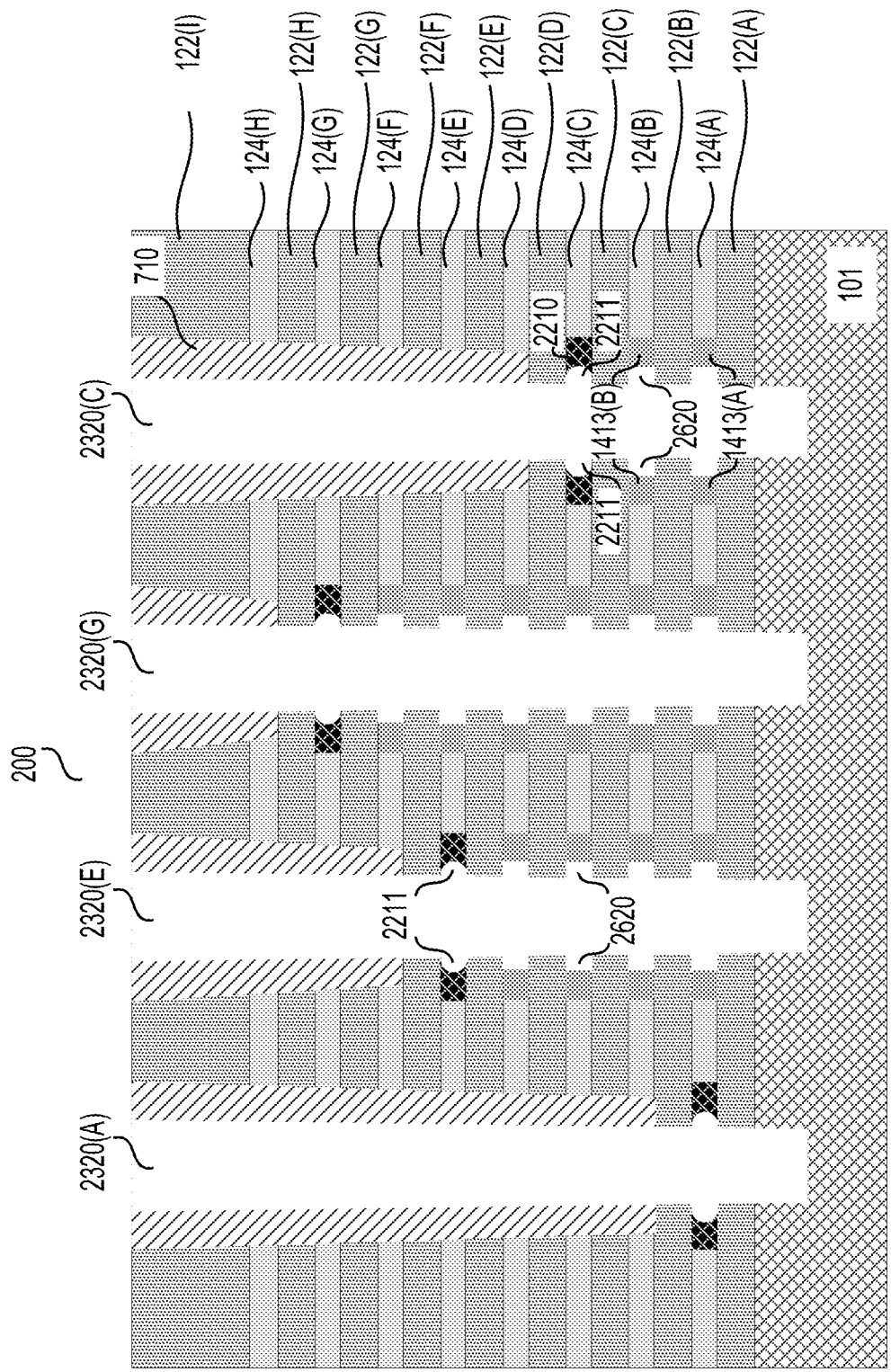

Referring to FIGS. 26 and 34B, at S3424, the second spacer layer 2510 (e.g., 2510(a)) over the sidewalls of the combined holes 2320 and the stack 150 are removed by an etching process. Further, the second spacer layer 2510 (e.g., the portions 2510(b) that fill the recesses 2211) is removed to expose the remaining sacrificial portions 2210 by an etching process. The recesses 2211 are also exposed. In an example, a part of the portions 1413 is removed, and recesses 2620 are formed in the etching process. An etching process that selectively etches the second spacer layer 2510 (e.g., silicon oxide) can be performed in S3424. The remaining portions 1413 (e.g., 1413(A) and 1413(B)) of the second spacer layer 2510 that are between the respective insulating layers 122 are the first insulating structures 1413 shown in FIG. 20.

Figure 27:
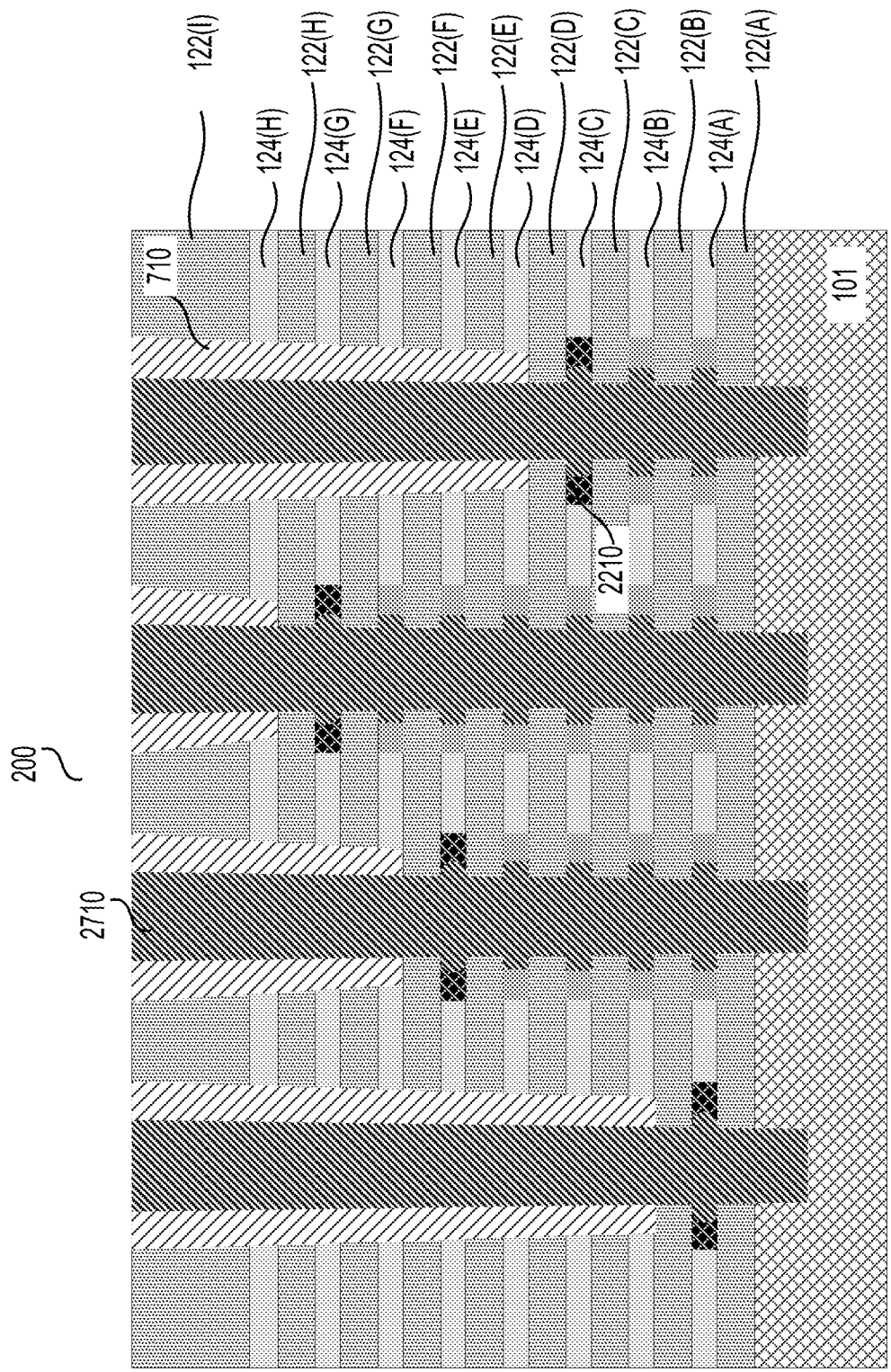

Referring to FIGS. 27 and 34B, at S3426, the combined holes 2320 can be filled with a sacrificial layer 2710 (also referred to as a second sacrificial layer). In an example, the sacrificial layer 2710 completely fills the combined holes 2320. Further, the sacrificial layer 2710 fills the recesses 2211 and 2620.

The sacrificial layer 2710 can be formed of any suitable materials, such as polysilicon, carbon (C), or the like. In an example, a material is selected for the sacrificial layer 2710 such that an etch rate of the sacrificial layer 2710 is different from the etch rate of the sacrificial layer 2150. The sacrificial layer 2710 can be formed using any suitable deposition techniques, such as CVD, PVD, ALD, an e-beam evaporation, a sputtering, a diffusion, or any combination thereof. In some embodiments, a CMP is performed to remove the sacrificial layer 2710 deposited over the stack 150.

Figure 28:
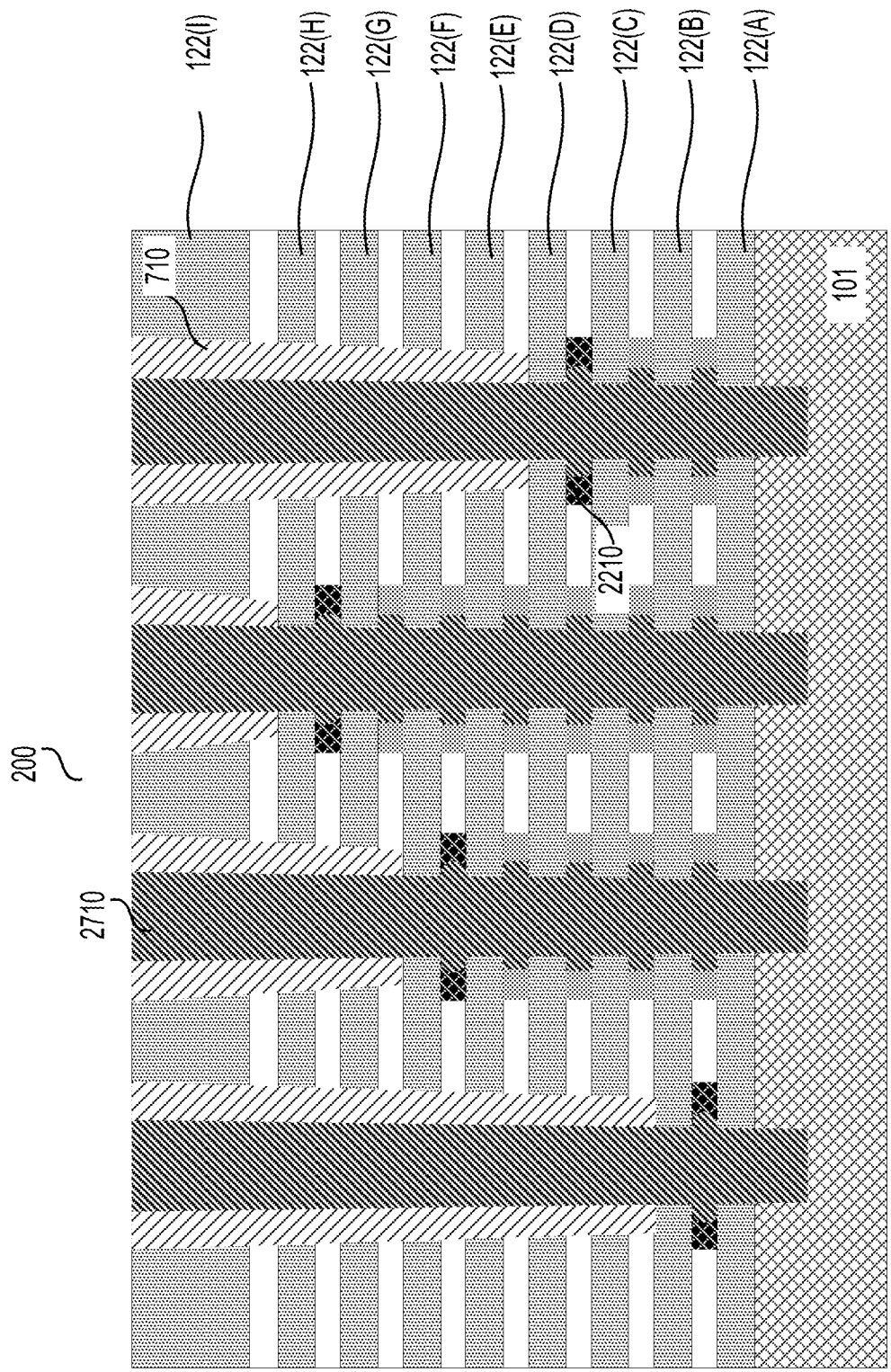
Figure 29:
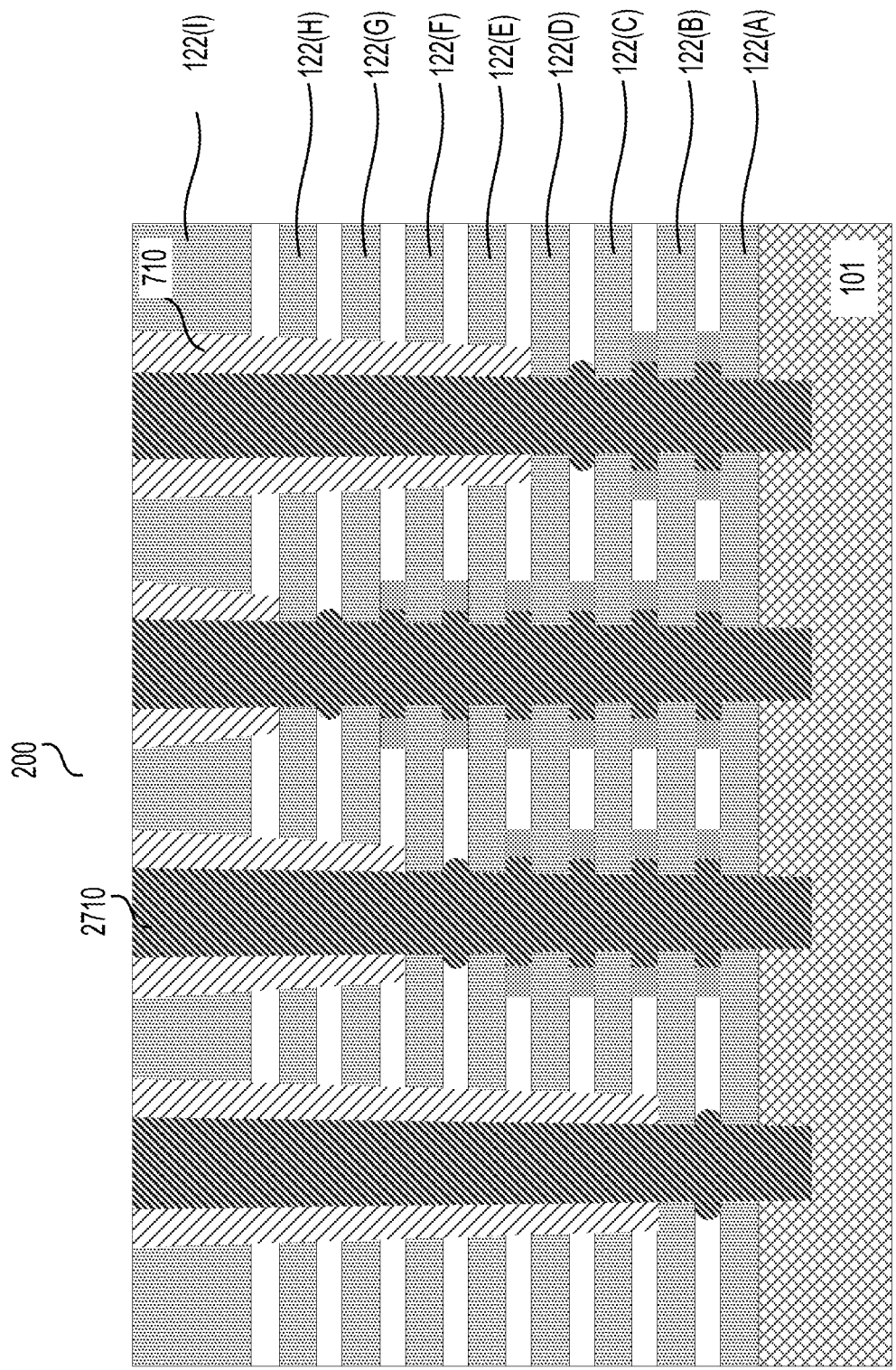

Referring to FIGS. 28, 29, and 34B, at S3428, the sacrificial layers 124 and the remaining sacrificial portions 2210 are removed by an etching process, such as described at S1928. Referring to FIG. 28, the sacrificial layers 124 are removed.

Referring to FIG. 29, the remaining sacrificial portions 2210 are removed. When the sacrificial layers 124 are removed, the combined stair-DCH-CT structures 130 support the stack of insulating layers 122 in the staircase region 120.

Figure 30:
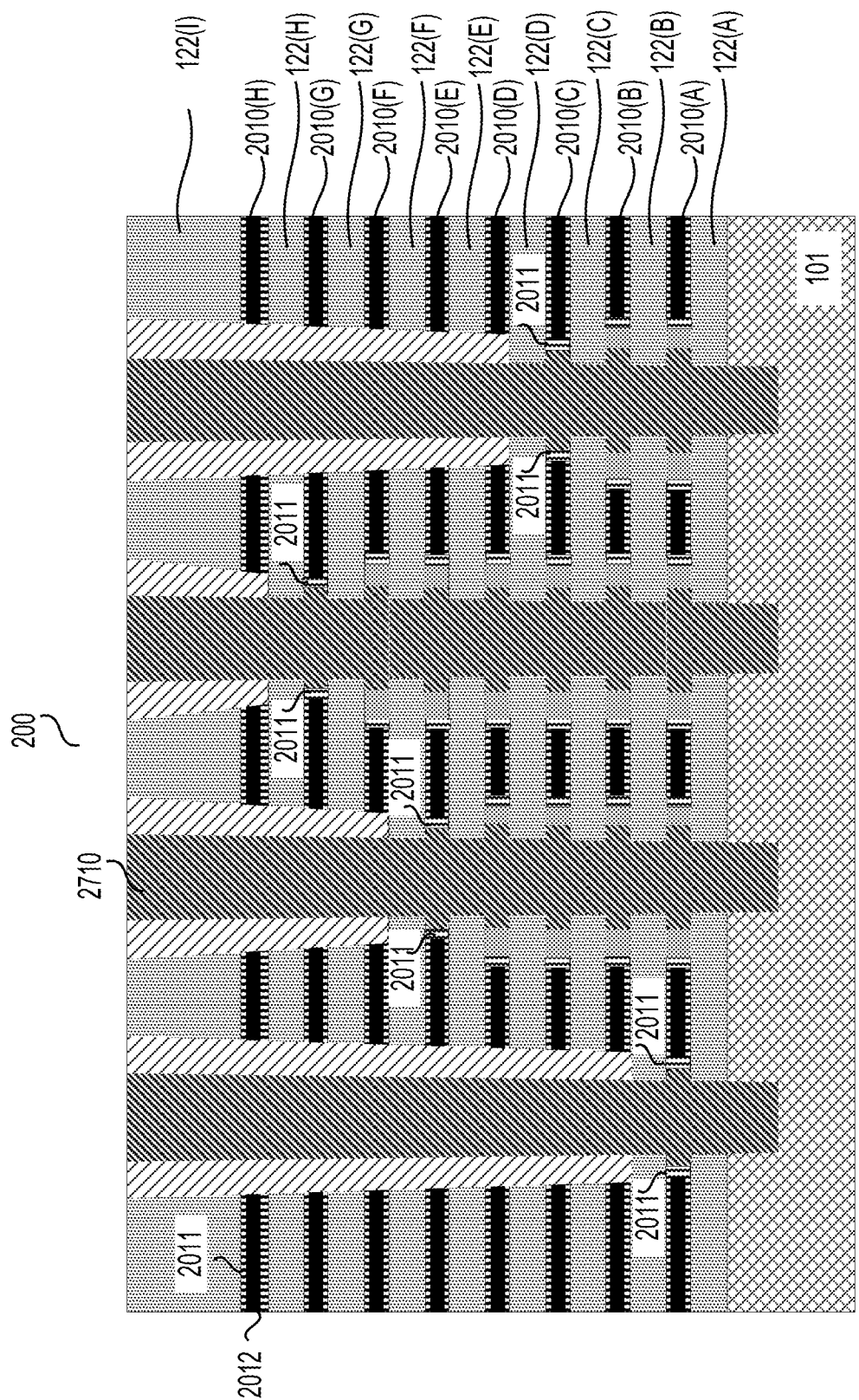

Referring to FIGS. 30 and 34B, at S3430, the gate layers 2010 (e.g., 2010(A)-2010(11)) including the metal layers 2012 and the respective high-k insulating layers 2011 are formed. In an example, the metal layer 2012 includes W.

Figure 31:
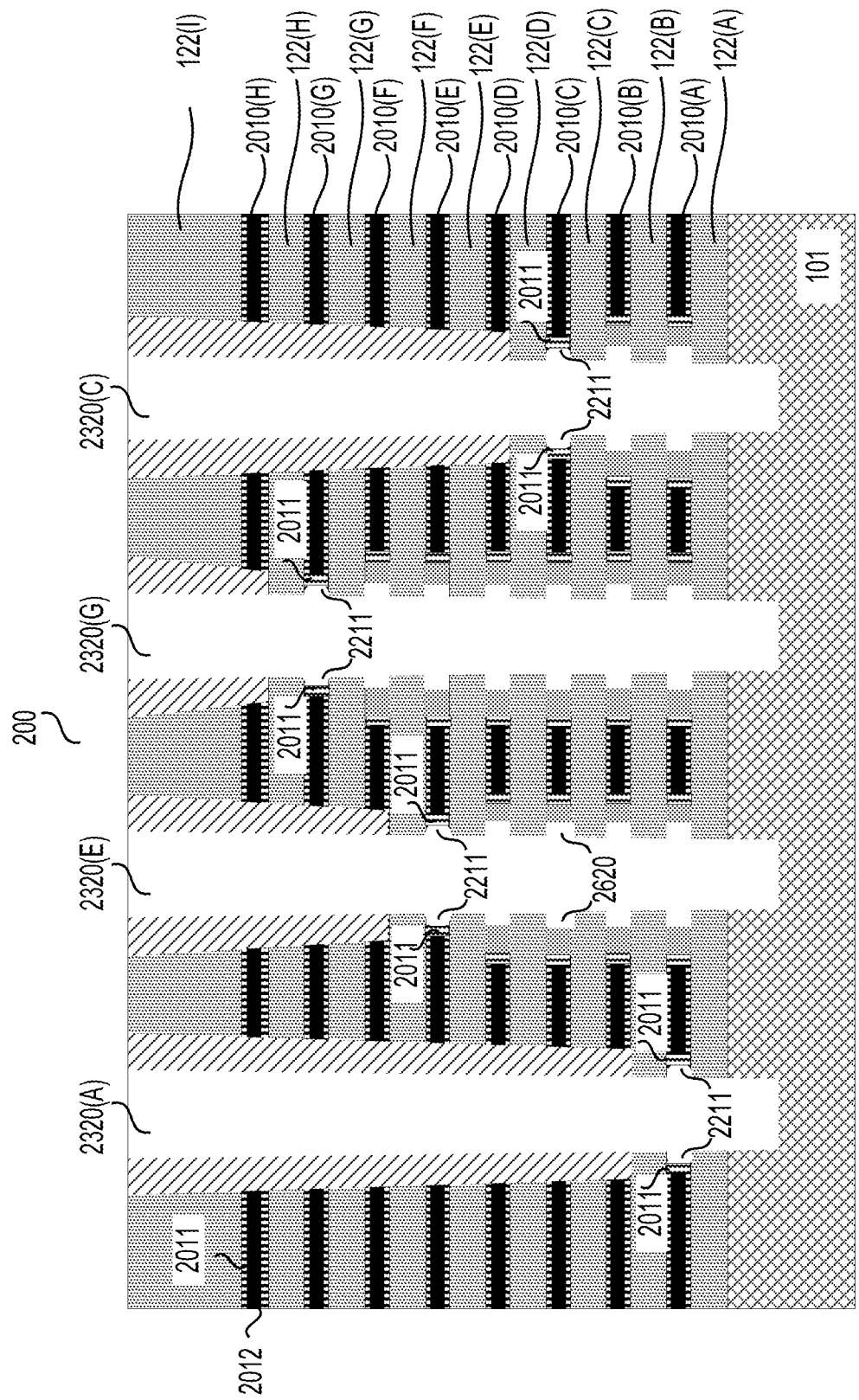

Referring to FIGS. 31 and 34B, at S3432, the sacrificial layer 2710 is removed to expose the combined holes 2320 and the recesses 2211 and 2620, for example, by an etching process. Portions of the high-k insulating layers 2011 that are adjacent to the combined holes 2320 are also exposed.

Figure 32:
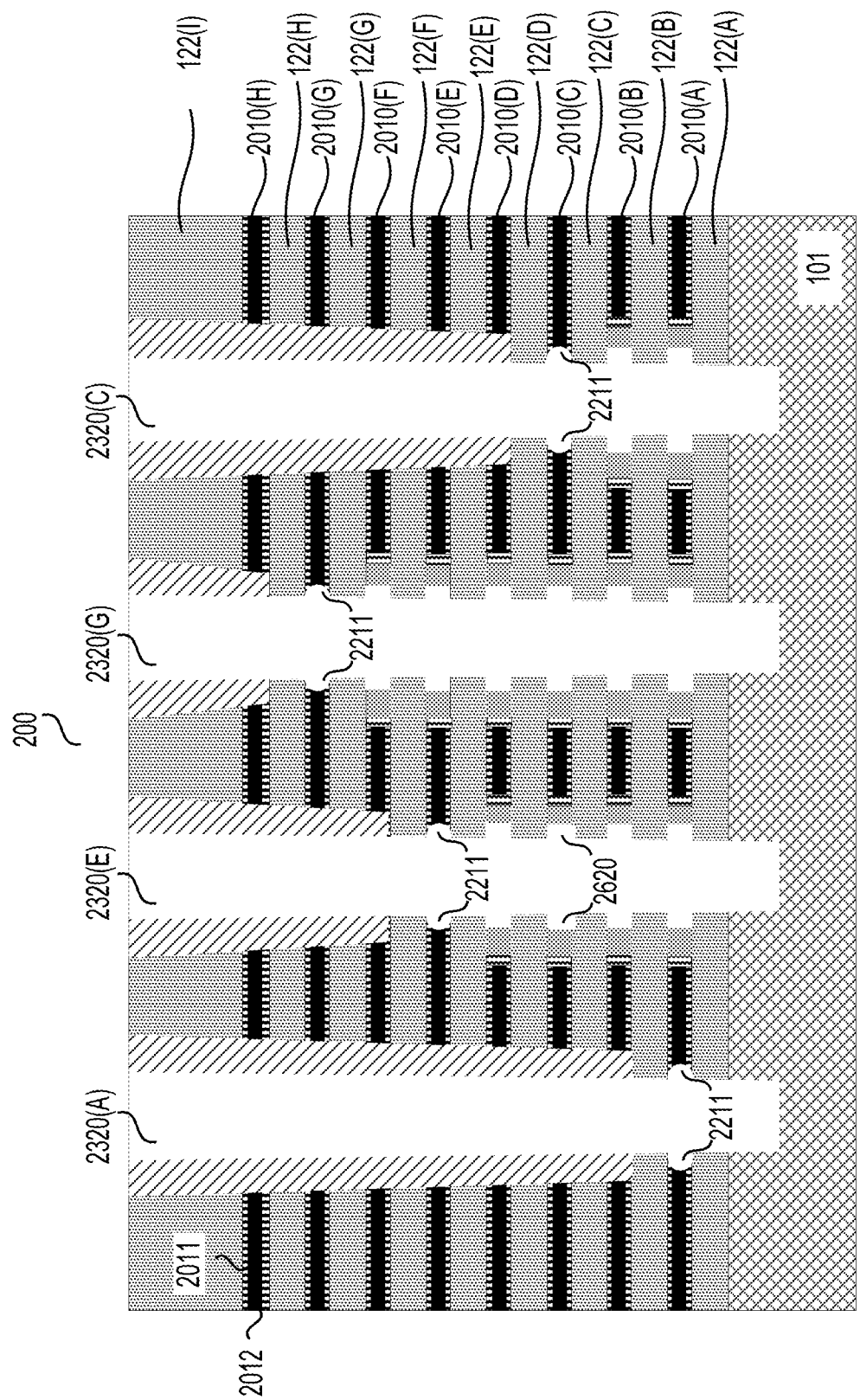

Referring to FIGS. 32 and 34B, at S3434, the portions of the high-k insulating layers 2011 that are adjacent to the combine holes 2320 are removed, for example, by an etching process (e.g., a wet etching process, a dry etching process, or a combination thereof), and thus electrical connections between the conductive structures 1620 and the respective gate layers 2010 can be formed subsequently.

Referring to FIGS. 20 and 34B, at S3436, the combined holes 2320 can be filled with metallic material(s) to form the conductive structure 1620. In an example, the metallic material(s) can completely fill the combined holes 2320. The metallic material(s) can fill the recesses 2211 to conductively connect to the respective gate layers 2010. The metallic material(s) fill the recesses 2620 to form the protrusions 1010 of the conductive structure 1620. In an example, the metallic material(s) include W. Referring to FIG. 20, the combined DCH-CT structures 130 (e.g., 130 (A), 130(C), 130(E), and 130(G)) of the semiconductor device 200 are formed. In some embodiments, a CMP is performed to remove the metallic material(s) deposited over the stack 150.

The process 3400 can be suitably adapted to include additional step(s), to omit step(s), and/or to modify step(s). Referring to FIG. 33, core structures 3310 within the metal pillars 1610 can be formed, for example, after S3436. For example, middle portions of the respective metal pillars 1610 are removed by an etching process followed by depositing an insulating material (e.g., an oxide layer) to form the core structures 3310. As described above, the core structures 3310 can be formed of insulating material(s), such as silicon oxide and are referred to as oxide cores.

In an example, referring back to FIG. 26, at S3424, the recesses 2620 are not formed in the etching process, and thus no protrusions 1010 are formed in the semiconductor device 200 (not shown).

In an example, steps S3420, S3422, and S3424 corresponding to FIGS. 24-26 can be replaced by an oxidization step. Following S3418 described with reference to FIG. 23, portions of the sacrificial layers 124 (e.g., 124(A)-124(B)) that are adjacent to the second holes 2310 (e.g., 2310(C)) can be oxidized to form the first insulating structures 1413 (e.g., 1413(A)-1413(B)) directly. At S3436, the combined holes 2320 can be filled with conductive (e.g., metallic) material(s) to form the conductive structure 1620. The conductive structure 1620 does not include protrusions.

In an example, the semiconductor device 200 is manufactured by the process 3400 described with reference to FIGS. 20-33, and 34A-34B over the insulating layer 101 and the substrate 102.

In an example, the semiconductor device 200 is manufactured over a sacrificial substrate. The stack 150 is formed over the sacrificial substrate instead of the insulating layer 101, and the process 3400 can be adapted accordingly. For example, after S3436 where the conductive structure 1620 is formed, the sacrificial substrate can be removed by an etching process. A deposition process can be used to form the insulating layer 101 to cover the contact structures 130. Further, a deposition process, such as an epitaxial deposition can be applied to form the semiconductor layer 102 (e.g., a polysilicon layer) over the insulating layer 101.

Figure 46:
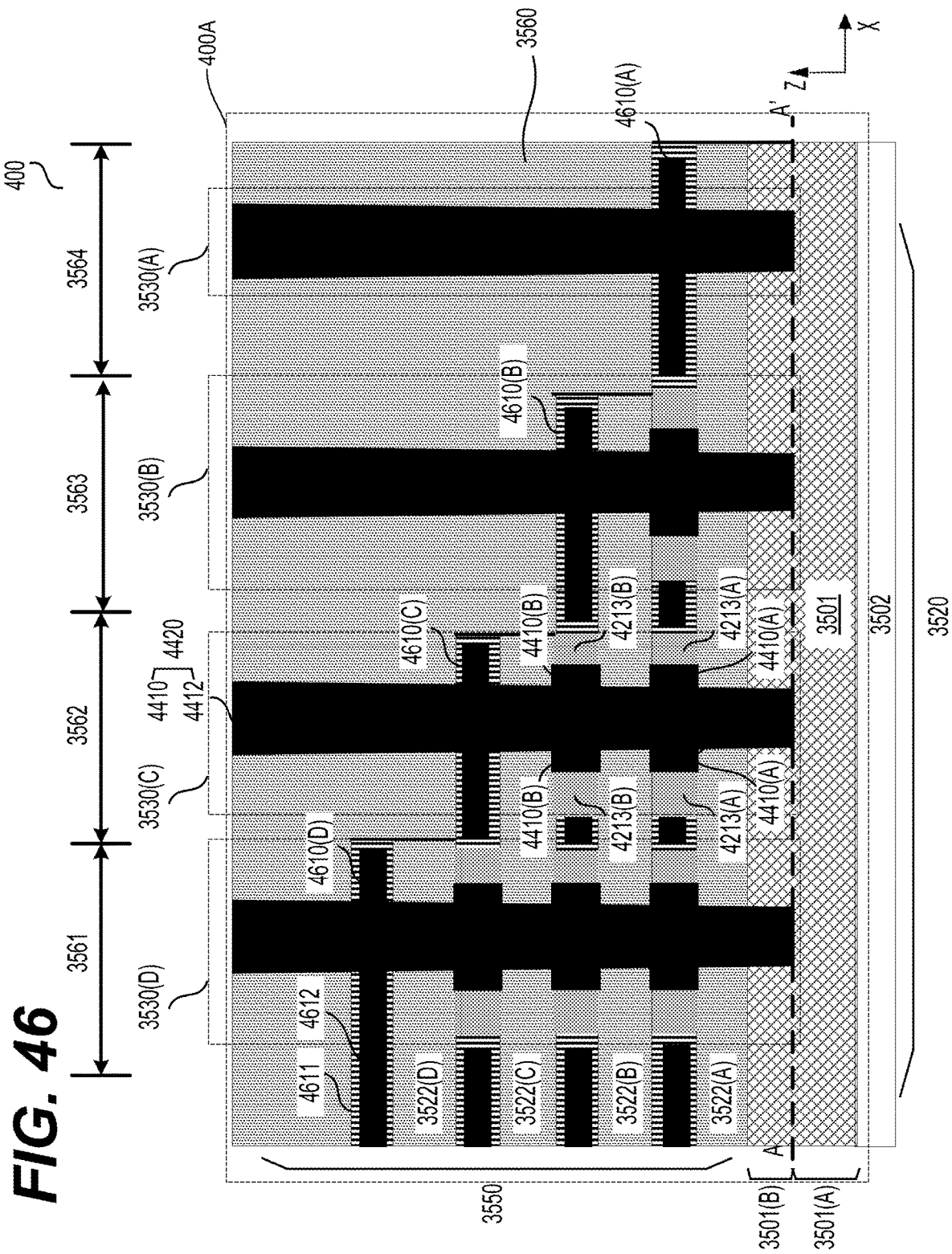
FIG. 46 shows a vertical cross-sectional view of a portion 400A of a semiconductor device 400 according to an exemplary embodiment of the disclosure.

The combined stair-DCH-CT structure 130 in the semiconductor device 100 or 200 is formed in the stack 150 where the gate layers (e.g., 1710 or 2010) and the insulating layers 122 are not formed in a stair-step form. The combined stair-DCH-CT structure 130 in the semiconductor devices 100 or 200 combines three structures (e.g., a stair-case structure, a dummy channel, and a contact for a gate layer) into a single structure. According to some embodiments of the disclosure, a combined DCH-CT structure in a semiconductor device can be formed in a stack where gate layers and insulating layers are formed in a stair-step form, as shown in FIGS. 35 and 46, where the combined DCH-CT structure combines two structures (e.g., a dummy channel and a contact for a gate layer) into a single structure, as described below.

Figure 35:
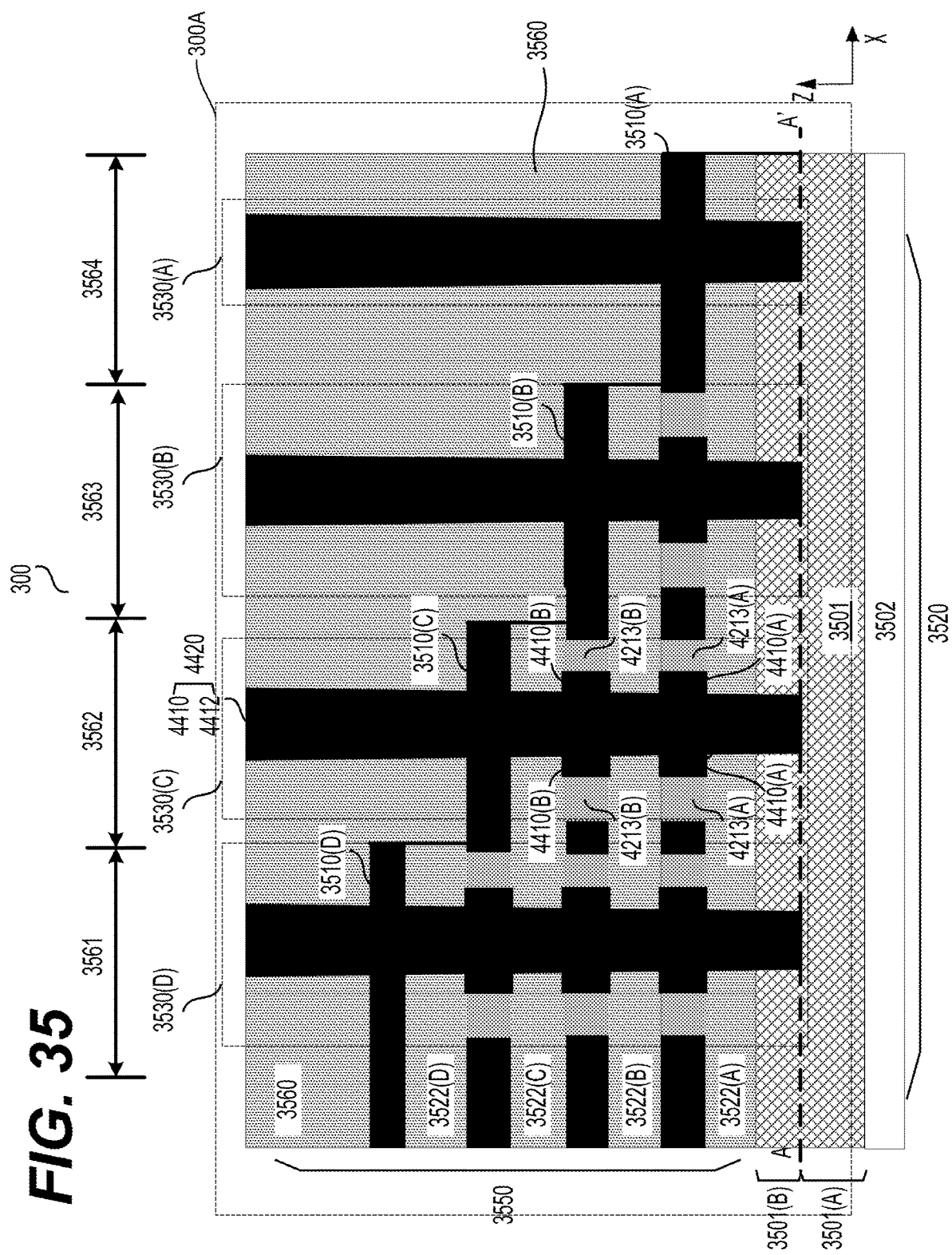
FIG. 35 shows a vertical cross-sectional view of a portion 300A of a semiconductor device 300 according to an exemplary embodiment of the disclosure.

FIG. 35 shows a vertical cross-sectional view of a portion 300A of a semiconductor device (or a memory device) 300 according to an embodiment of the disclosure. An X-Y plane of an insulating layer 3501 extends in an X direction and a Y direction. The Z direction is perpendicular to the X-Y plane. A vertical cross-section (e.g., an X-Z plane) is perpendicular to the X-Y plane. The semiconductor device 300 can refer to a memory device. The semiconductor device 300 can include a structure 3502 that is adjacent to the insulating layer 3501. In an example, the structure 3502 is a semiconductor layer 3502, such as a polysilicon layer. In an example, the structure 3502 is a substrate 3502. The substrate 3502 can be any suitable substrate, such as the substrate 102 described with reference to FIG. 1A.

In various embodiments, the semiconductor device 300 includes 3D NAND memory device formed on the structure 3502 and the semiconductor device 300 can be referred to as a vertical memory device. The semiconductor device 300 can include other suitable circuitry, such as logic circuitry, power circuitry, and the like that is formed on the structure 3502, and is suitably coupled with the 3D NAND memory circuitry. Generally, the 3D NAND memory circuitry includes a memory array and peripheral circuitry (e.g., address decoder, driving circuits, sense amplifier and the like). The memory array is formed in a core region as an array of vertical memory cell strings. The peripheral circuitry is formed in a peripheral region. Besides the core region and the peripheral region, the semiconductor device 300 includes a staircase region 3520 to facilitate making contacts to the gates of the memory cells in the vertical memory cell strings. The gates of the memory cells in the vertical memory cell strings correspond to word lines for the NAND memory architecture.

In the core region, a plurality of channel structures is formed in gate layers and insulating layers that are stacked alternatingly in the Z direction.

In some embodiments, each of the channel structures includes a gate dielectric layer, a semiconductor layer, and an insulating layer that have a circular shape in the X-Y plane, and extend in the Z direction, such as described with reference to FIG. 1A.

Referring to FIG. 35, the stack 3550 of gate layers 3510 (or WLs) (e.g., 3510(A)-3510(D)) and insulating layers 3522 (e.g., 3522(A)-3522(D)) forms stair-steps (e.g., stair-steps 3561-3564) in the staircase region 3520 to facilitate forming contacts to the gate layers 3510. The contacts are used to connect driving circuitry, such as word line driving circuitry, ground select driving circuitry, string select driving circuitry, and the like in the periphery circuitry to the respective gates of the transistors in the stack. The gate layers 3510 (e.g., 3510(A)-3510(D)) and insulating layers 3522 (e.g., 3522(A)-3522(D)) are stacked alternatingly in the Z direction. In an example, the stack 3550 includes an insulating layer 3560 that is formed over the alternating gate layers 3510 and the insulating layers 3522. In an example, the insulating layer 3560 is formed of the same insulating material(s) as insulating material(s) of the insulating layer 3522.

The gate layers 3510 can have identical or similar structures, material(s), and connections as the structures, the material(s), and the connections of the gate layers 1710 in FIG. 1A. The gate layers 3510 correspond to gates of the transistors in the core region of the semiconductor device 300. The gate layers 3510 are formed of a gate stack materials, such as a MG electrode (or a metal layer), and the like. The insulating layers 3522 are formed of insulating material(s), such as silicon nitride, silicon dioxide, and the like.

Referring to FIG. 35, the gate layers 3510 in the staircase region 3520 do not include high-k gate insulator layers.

Further, in the FIG. 35 example, combined DCH-CT structures 3530 (e.g., combined DCH-CT structures 3530(A)-3530(D)) are formed in the stack 3550 in the staircase region 3520 to conductively connect to the gate layers 3510(A)-3510(D), respectively. The combined DCH-CT structures 3530 are used to connect driving circuitry, such as word line driving circuitry, ground select driving circuitry, string select driving circuitry, and the like in the periphery circuitry to the respective gates of the transistors in the core region. In FIG. 35, the combined DCH-CT structures 3530 are electrically connected to the respective gate layers 3510. Note that each of the combined DCH-CT structures 3530 is electrically connected to only one of the gate layers 3510 and is electrically isolated from remaining ones of the gate layers 3510.

An example of the combined DCH-CT structures 3530, such as the combined DCH-CT structure 3530(C), is described below. The combined DCH-CT structure 3530(C) is electrically connected to the gate layer 3510(C) and is electrically isolated from the gate layers 3510(A)-3510(B) and 3510(D).

The combined DCH-CT structure 3530(C) can include a conductive structure 4420 extending in the Z direction. The conductive structure 4420 can include a metal pillar 4412. The metal pillar 4412 can extend in the Z direction and form a conductive connection with one of the gate layers (e.g., the gate layer 3510(C)). Referring to FIG. 35, the metal pillar 4412 extends through the gate layers 3510 (e.g., 3510(A)-3510(D)) and the insulating layers 3522 (e.g., 3522(A)-3522(D)) and penetrates into the insulating layer 3501. In an example, the metal pillar 4412 reaches to a depth AA' into the insulating layer 3501. An upper portion 3501(B) of the substrate 3501 is above the depth AA' and a bottom portion 3501(A) of the insulating layer 3501 is below the depth AA'. The metal pillar 4412 penetrates through the upper portion 3501(B) of the insulating layer 3501. In an example shown in FIG. 35, the metal pillars 4412 (or the combined DCH-CT structures 3530) extend through the entire stack 350 along the Z direction. Thus, when sacrificial layers are being replaced by the gate layers 3510 in a gate-last fabrication technology, the combined DCH-CT structures 3530 can provide stronger support to the staircase region 3520 as compared to structures (e.g., dummy channels) that only extend through a portion of the stack 3550.

The conductive structure 4420 can further include protrusions 4410 (e.g., 4410(A)-4410(B)) between each pair of the insulating layers 3522 that are between the gate layer 3510(C) that is electrically connected to the combined DCH-CT structure 3530(C) and the insulating layer 3501. In an example shown in FIG. 35, the protrusion 4410(A) is between the insulating layers 3522(A)-3522(B), and the protrusion 4410(B) is between the insulating layers 3522(B)-3522(C). The protrusions 4410 extend out from the metal pillar 4412 into the respective gate layers 3510. The metal pillar 4412 and the protrusions 4410 can be formed in a same process, and can include identical material(s), such as one or more metallic materials (e.g., tungsten (W), copper (Cu)).

The combined DCH-CT structure 3530(C) can include first insulating structures 4213 (e.g., 4213(A)-4213(B)). The first insulating structures 4213 electrically isolate any protrusions 4410 of the conductive structure 4420 from a respective gate layer of the gate layers 3510. Each of the first insulating structures 4213 can be between each pair of the insulating layers 3522 that are between the gate layer 3510(C) and the insulating layer 3501. The first insulating structures 4213 are disposed on the first side of the gate layer 3510(C), for example, beneath the gate layer 3510(C). Each of the first insulating structures 4213 can surround the conductive structure 4420 and electrically isolate the conductive structure 4420 from a respective one of the gate layers 3510. In an example, the first insulating structures 4213 extend out from the respective protrusions 4410 into the respective gate layers 3510. Referring to FIG. 35, the first insulating structure 4213(A) is between the insulating layers 3522(A)-3522(B) and electrically isolates the conductive structure 4420 from the gate layer 3510(A), and the first insulating structure 4213(B) is between the insulating layers 3522(B)-3522(C) and electrically isolates the conductive structure 4420 from the gate layer 3510(B). The combined DCH-CT structure 3530(A) includes no first insulating structures.

In an example, the first insulating structures 4213 can surround the respective protrusions 4410 and electrically isolate the conductive structure 4420 from the respective ones of the gate layers 3510. The first insulating structure 4213(A) surrounds the protrusion 4410(A) and electrically isolates the protrusion 4410(A) (and the conductive structure 4420) from the gate layer 3510(A), and the first insulating structure 4213(B) surrounds the protrusion 4410(B) and electrically isolates the protrusion 4410(B) (and the conductive structure 4420) from the gate layer 3510(B). The first insulating structures 4213 can include one or more suitable insulating materials, such as silicon oxide, silicon oxynitride (SiON), and/or the like.

In an example, referring to the combined DCH-CT structure 3530(C), the insulating layer 3560 surrounds the conductive structure 4420 (and the metal pillar 4412) that is above the gate layer 3510(C) that conductively connects to the conductive structure 4420.

Referring to FIG. 35, the combined DCH-CT structure 3530(C) comprises insulating structures that include the first insulating structures 4213 and a second insulating structure (e.g., portions of the insulating layer 3560) that is disposed on opposite sides of the gate layer 3510 (e.g., the gate layer 3510(C)) that is electrically connected to the combined DCH-CT structure 3530(C).

The above descriptions for the combined DCH-CT structure 3530(C) can be suitably adapted to other combined DCH-CT structures in the semiconductor device 300, and detailed descriptions are omitted for purpose of brevity. Note that each of the combined DCH-CT structures 3530 is conductively connected to a different gate layer. For example, the combined DCH-CT structure 3530(A) is conductively connected to the gate layer 3510(A), the combined DCH-CT structure 3530(B) is conductively connected to the gate layer 3510(B), and the combined DCH-CT structure 3530(D) is conductively connected to the gate layer 3510(D).

Referring to FIG. 35, the combined DCH-CT structures 3530 can serve multiple purposes in the semiconductor device 300 and/or in manufacturing the semiconductor device 300: (i) serving as contacts to the corresponding gate layers 3510 and (ii) serving as dummy channels that support the staircase region 3520, for example, during a gate-last process, similarly as described above with reference to FIG. 1A.

For example, the combined DCH-CT structure 3530(C) serves as a contact to the gate layer 3510(C) and is electrically isolated from remaining ones of the gate layers 3510 (e.g., 3510(A)-3510(B) and 3510(D)). The combined DCH-CT structure 3530(C) is electrically isolated from other gate layer(s) (e.g., 3510(A)-3510(B) and 3510(D)) due to the stair-case form and the first insulating structures 4213. Referring to FIG. 35, the insulating layer 3560 also isolates an upper portion of the combined DCH-CT structure 3530 (C) that is above the gate layer 3510(C) from adjacent combined DCH-CT structures.

Further, the combined DCH-CT structure 3530(C) is formed through the entire stack of the staircase region 3520, and thus provides relatively strong support to the staircase region 3520, for example, during the gate-last process than a dummy channel that is not formed through the entire stack.

In related semiconductor 3D memory devices or vertical memory devices, contacts and dummy channels in a staircase region are disposed in different areas in the X-Y plane. Thus, how to arrange and manufacture the contacts and the dummy channel in the staircase region can be challenging, similar to the description above with reference to FIG. 1A.

According to some embodiments of the disclosure, the combined DCH-CT structure 3530 can offer advantageous solutions to the challenges described above. Referring to FIG. 35, a dummy channel and a contact that are separated in a related technology can be combined into a single structure (e.g., the combined DCH-CT structure 3530). The combined DCH-CT structure 3530 in FIG. 35 can also be referred to as a DCH-CT structure. The combined DCH-CT structure 3530 significantly simplifies a structure of a vertical memory device by combining two different structures into a single structure, thus reducing a footprint of the dummy channel and the contact. The manufacturing process and the design of the single structure can be simplified and more flexible, reducing a number of manufacturing steps and cost.

As the dummy channels and the contacts are combined into the single structure, design windows among the dummy channels and the contacts can be relaxed or no longer need to be considered, such as design windows associated with CTs and DCHs (e.g., a distance between a CT and a DCH, a distance between two DCHs).

In FIG. 35, the supporting structure is the combined DCH-CT structure 3530 where metallic material(s) (e.g., W) are filled through the entire conductive structure 4420. As described above with reference to FIG. 1A, the metal material(s) (e.g., W) have a larger Young's modulus than material(s) (e.g., insulating material(s)) used in dummy structures in a related technology, the combined DCH-CT structure 3530 can provide stronger support and mitigate bending of the gate layers. Further, the combined DCH-CT structure is formed on a face side above the substrate, and thus the process is performed on one side.

Referring to FIG. 35, the combined DCH-CT structure 130(C) includes a first portion above the gate layer (e.g., the gate layer 3510(C)) that is electrically connected to the combined DCH-CT structure 3530(C), a second portion that is connected to the gate layer 3510(C), and a bottom portion below the gate layer 3510(C). The bottom portion below the gate layer 3510(C) includes the protrusions 4410 and the first insulating structures 4213 that surround the metal pillar 4412. The bottom portion has a structure that resembles a "screw thread" structure. In an example, the protrusions 4410 and/or the first insulating structures 4213 resemble "screw threads" of the bottom portion such that the bottom portion is fastened into the gate layers 3510(A)-3510(B) and the insulating layers 3522(A)-3522(C). The "screw thread" structure of the bottom portion can better support the staircase region 3520, for example, during a gate-last process.

The first portion and the second portion can be referred to as a top portion of the combined DCH-CT structure 3530 (C). The top portion is also referred to as a contact to the gate layer 3510(C). The bottom portion can be referred to as a dummy channel and is isolated from the gate layers that are disposed below the gate layer 3510(C) (e.g., 3510(A)-3510 (B)). Both the top portion and the bottom portion provide support to the staircase region 3520, for example, during the gate-last process.

The combined DCH-CT structures 3530 can be suitably adapted to include additional structure(s), to omit structure(s), to modify structure(s), and/or the like. In an example, the combined DCH-CT structures 3530 can include respective core structures, similarly as described for the semiconductor device 100 with reference to FIG. 18. The core structures can be disposed within the respective conductive structure 4420, such as the respective metal pillars 4412. The core structures can extend in the Z direction and through a subset of the gate layers 3510 and the insulating layers 3522. A material of the core structure can be different from a material of the conductive structure 4420. In an example, the core structures are formed of insulating material(s), such as silicon oxide and are referred to as oxide cores. Having an oxide core or other insulating cores can reduce cost of metal deposition (e.g., W deposition) and mitigate issues associated with metal voids (e.g., voids in W), such as fluorine attack risk associated with voids in W. Suitable material(s) including metal(s) other than W can be used in the conductive structure 4420.

In an example, the conductive structure 4420 does not include the protrusions 4410. The conductive structure 4420 is a metal pillar. The first insulating structures 4213 electrically isolate the conductive structure 4420 (or the metal pillar) from respective gate layers of the gate layers 3510. Each of the first insulating structures 4213 can surround the conductive structure 4420 (or the metal pillar) and electrically isolate the conductive structure 4420 from a respective one of the gate layers 3510. In an example, the first insulating structures 4213 extend out from the conductive structure 4420 (or the metal pillar) into the respective gate layers 3510.

FIGS. 36-44 show vertical cross-sectional views of the semiconductor device 300 at various steps of a process according to exemplary embodiments of the disclosure. For purposes of brevity, the structure 3502 is not shown in FIGS. 36-44.

Figure 45:
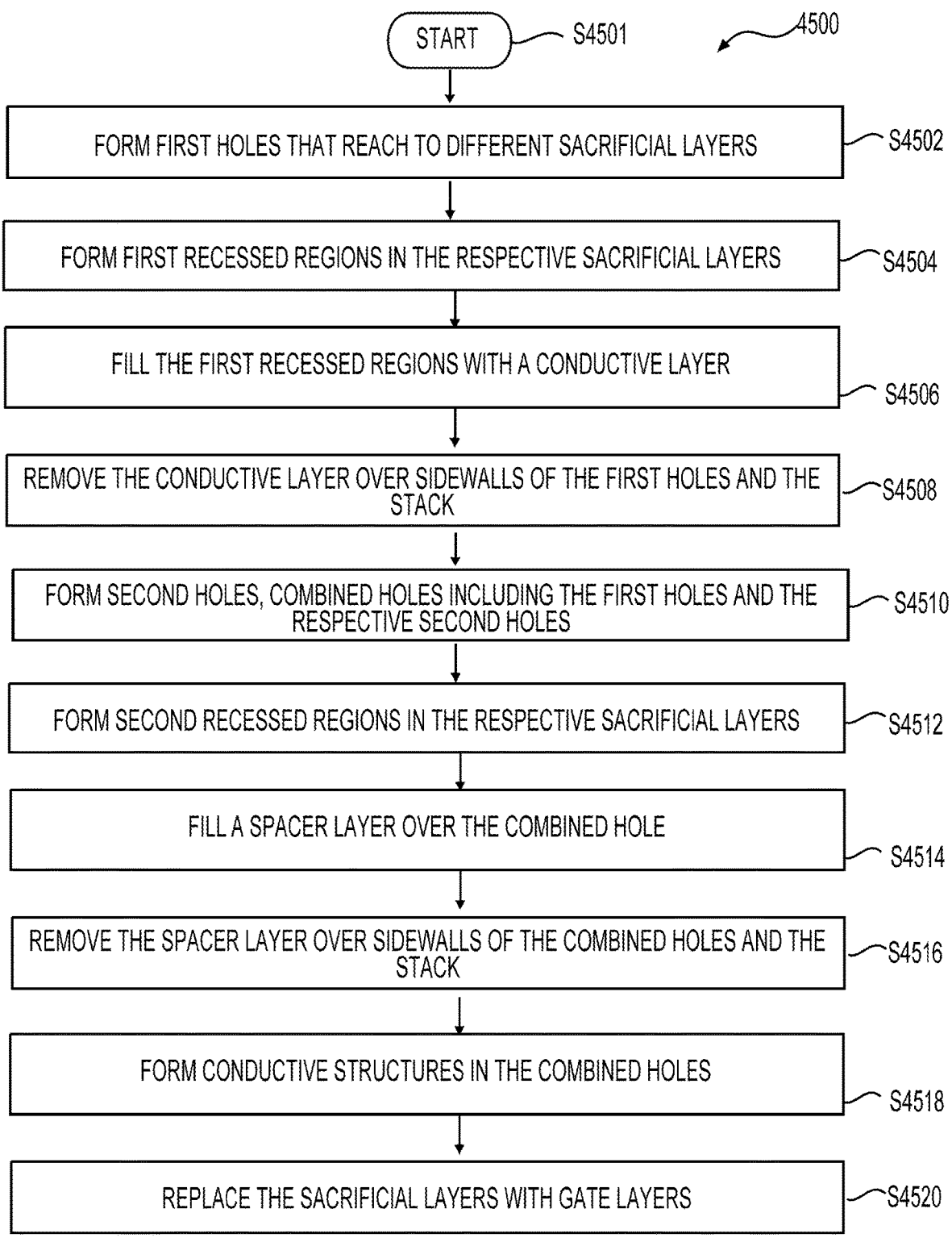
FIG. 45 shows a flow chart outlining a process 4500 to manufacture the semiconductor device 300 according to an exemplary embodiment of the disclosure.

FIG. 45 shows a flow chart outlining a process 4500 to manufacture the semiconductor device 300 according to an embodiment of the disclosure. The process 4500 starts at S4501 where the plurality of channel structures, similarly as described above with reference to S1901, is formed in the core region of the semiconductor device 300. In some embodiments, holes are formed in the core region. Prior to forming the gate dielectric layer (e.g., the ONO stack structure) of the channel structure, a high-k insulating layer is formed to cover sidewalls of the holes. Subsequently, the channel structure including the gate dielectric layer, the semiconductor layer, and the insulating layer can be formed within the holes over the high-k insulating layer. The high-k insulating layer can include any suitable material(s) that provide the relatively large dielectric constant, such as $HfO_2$, $HfSiO_4$, HfSiON, $Al_2O_3$, $La_2O_3$, $Ta_2O_5$, $Y_2O_4$, $ZrO_2$, $SrTiO_3$, $ZrSiO_4$, $HfZrO_4$, and the like. In an example, the high-k insulating layer includes $Al_2O_3$. The high-k insulating layer can, for example, enhance the blocking insulating layer of the gate dielectric layer.

Figure 36:
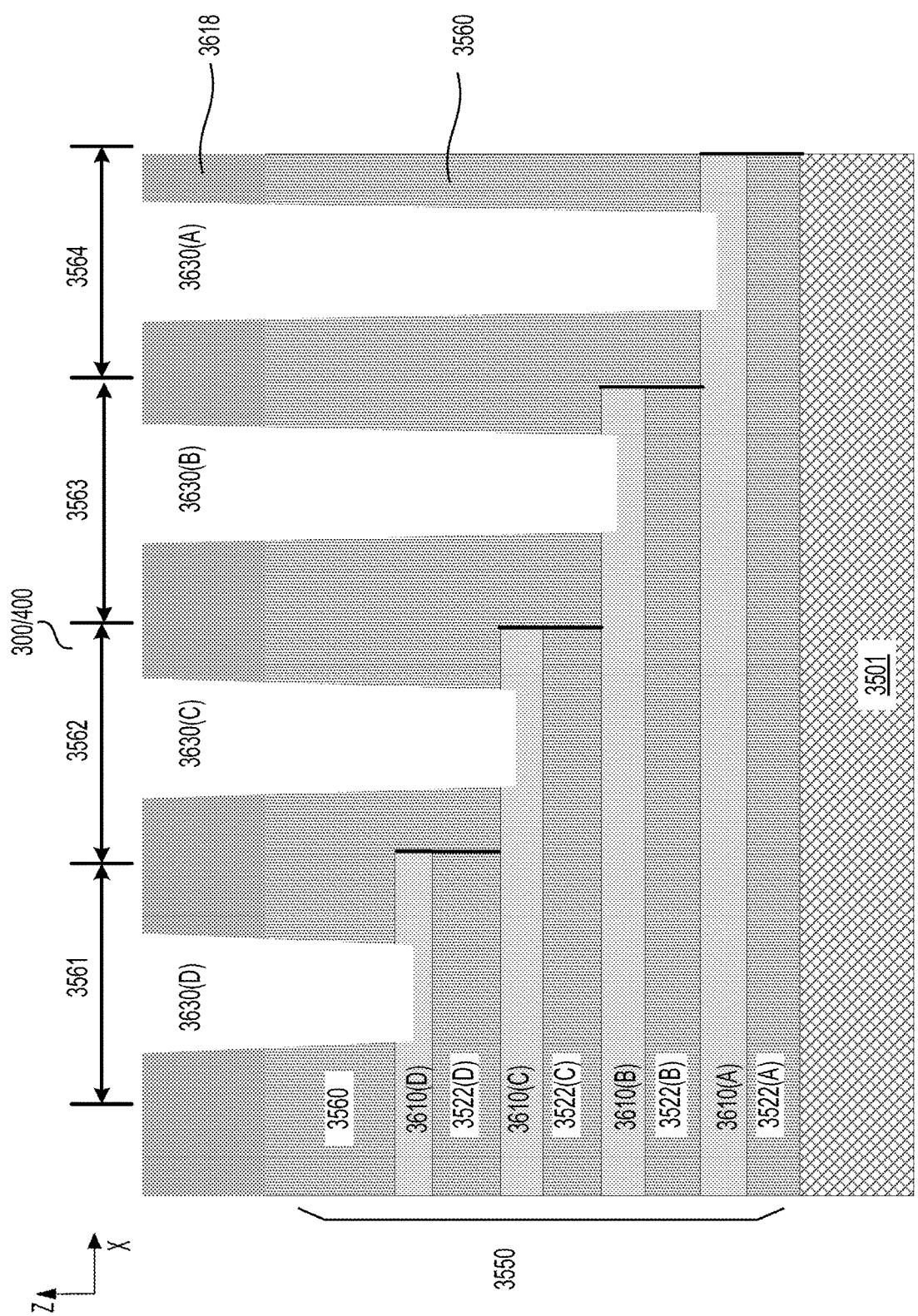
FIGS. 36-44 show vertical cross-sectional views of the semiconductor device 300 at various steps of a process according to exemplary embodiments of the disclosure.

Referring to FIG. 36, the stack (or the stack structure) 3550 can include alternating sacrificial layers 3610 (e.g., 3610(A)-3610(D)) and the insulating layers 3522 formed over the insulating layer 3501 of the semiconductor device 300. The thicknesses, material(s), and the fabrication of the sacrificial layers 3610 and the insulating layers 3522 can be similar to those described with reference to the semiconductor device 100.

The stack structure 3550 includes pairs of sacrificial layers 3610 and insulating layers 3522 formed along the Z direction. Each pair includes a sacrificial layer (e.g., 3610(C)) and an adjacent insulating layer (3522(C)) that is on the first side (e.g., beneath) along the Z direction. The pairs of sacrificial layers and insulating layers are stacked in a stair-step form in the staircase region 3520 such that, for each pair (e.g., 3610(C) and 3522(C)), an adjacent pair (e.g., 3610(B) and 3522(B)) that is on the first side along the Z direction extends beyond an edge of the pair (e.g., 3610(C) and 3522(C)) along a direction (e.g., X direction) that is perpendicular to the Z direction.

The stair-steps (e.g., the stair-steps 3561-3564) can be formed in the stair-case region 3520 in the stack 3550. Portions of the sacrificial layers 3610 and the insulating layers 3522 are selectively removed at different stair-steps. For example, at the stair-step 3562, portions of the sacrificial layers 3610(D) and the insulating layers 3522(D) that are above the sacrificial layers 3610(C) is removed; at the stair-step 3563, portions of the sacrificial layers 3610(C)-3610(D) and the insulating layers 3522(C)-3522(D) that are above the sacrificial layers 3610(B) are removed; portions of at the stair-step 3564, the sacrificial layers 3610(B)-3610(D) and the insulating layers 3522(B)-3522(D) that are above the sacrificial layers 3610(A) are removed. In an example, after forming the stair-steps 3561-3564, the insulating layer 3560 is formed over the remaining sacrificial layers 3610 and the insulating layers 3522. For clarity purposes, FIGS. 36-44 illustrate the staircase region 3520 of the semiconductor device 300 and show a process used to form the combined DCH-CT structures 3530 in the staircase region 3520.

Referring to FIGS. 36 and 45, at S4502, a mask layer (e.g., a hardmask layer) 3618 can be formed over the insulating layer 3560 of the stack 3550 to protect the semiconductor device 300 during subsequent processing, similarly as described with reference to FIG. 2. First holes 3630 (e.g., 3630(A)-3630(D)) extending into different sacrificial layers 3610 are formed in the stack 3550 according to a pattern of the mask layer 3618 using a dry etching (e.g., a plasma punch). For example, the first holes 3630(A)-3630(D) extend into the sacrificial layers 3610(A)-3610(D), respectively.

Referring to FIG. 36, prior to forming the first holes 3630, in some examples, silicon nitride layer(s) (also referred to as top selective silicon nitride layer(s)) are selectively formed over the stair-steps 3561-3564 through a deposition process, such as an ALD. Thus, thicknesses of the corresponding sacrificial layers 3610 at the stair-steps 3561-3564 can be increased. The formation of the top selective silicon nitride layer(s) can increase an etching landing window for the formation of the first holes 3630, and for example, prevent the first holes 3630(A)-3630(D) from punching through the sacrificial layers 3610 (A)-3610 (D), respectively. In an embodiment, the top selective silicon nitride layer(s) facilitate landing of the first holes 3630 on the corresponding sacrificial layers 3610 (e.g., the first holes 3630(A)-3630(D) reach or land on the sacrificial layers 3610(A)-3610(D), respectively).

Figure 37:
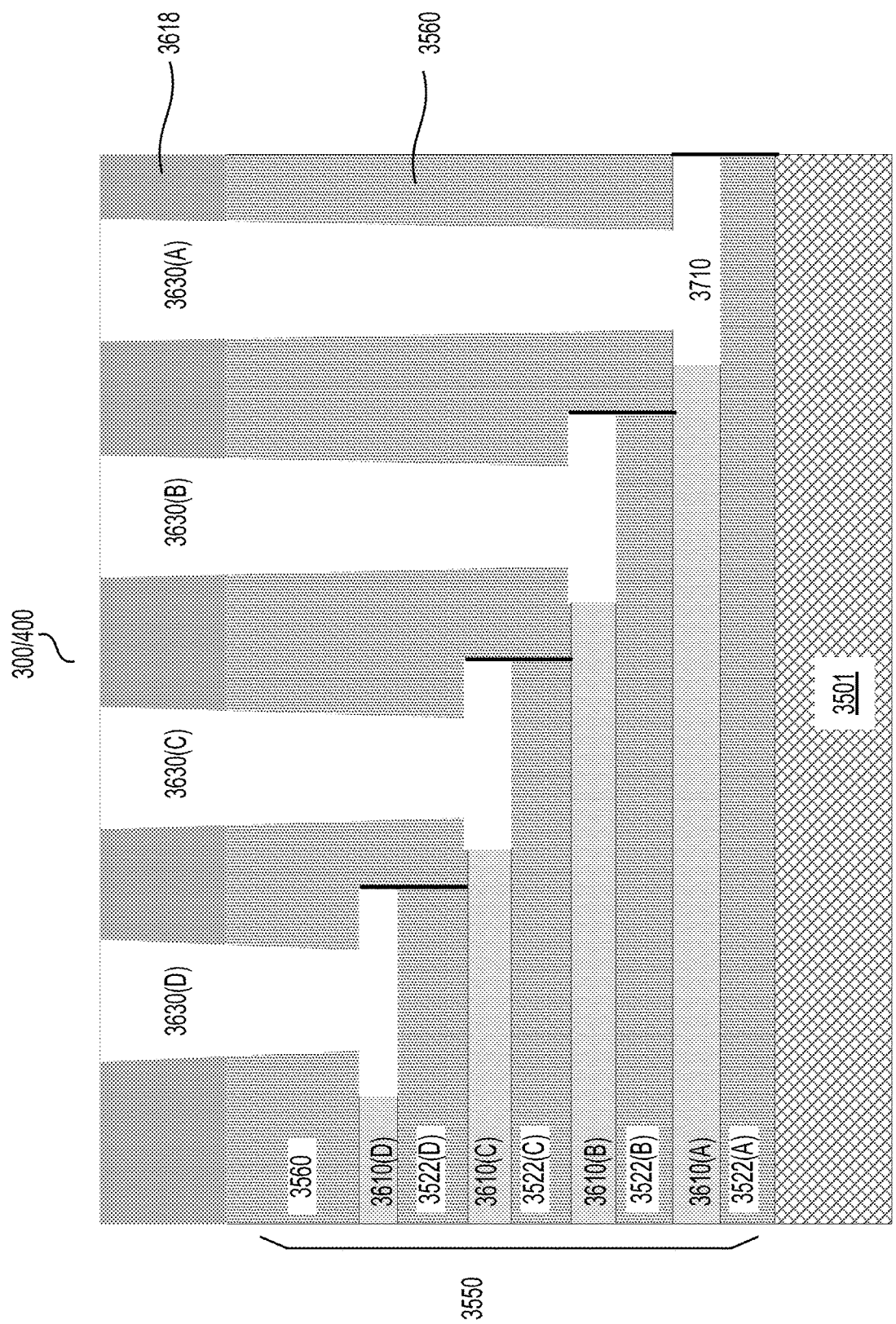

Referring to FIGS. 37 and 45, at S4504, first recessed regions 3710 are formed in the respective sacrificial layers 3610 into which the corresponding first holes 3630 penetrate. An etch process including a dry etching process, a wet etching process, or a combination thereof can be used to form the first recessed regions 3710 by removing portions of the respective sacrificial layers 3610 that are adjacent to the first holes 3630. In an example, the first holes 3630 (e.g., 3630(A)-3630(D)) are enlarged to reach to bottom surfaces of the respective sacrificial layers 3610 (e.g., 3610(A)-3610 (D)). The first holes 3630 are connected to the respective first recessed regions 3710.

Figure 38:
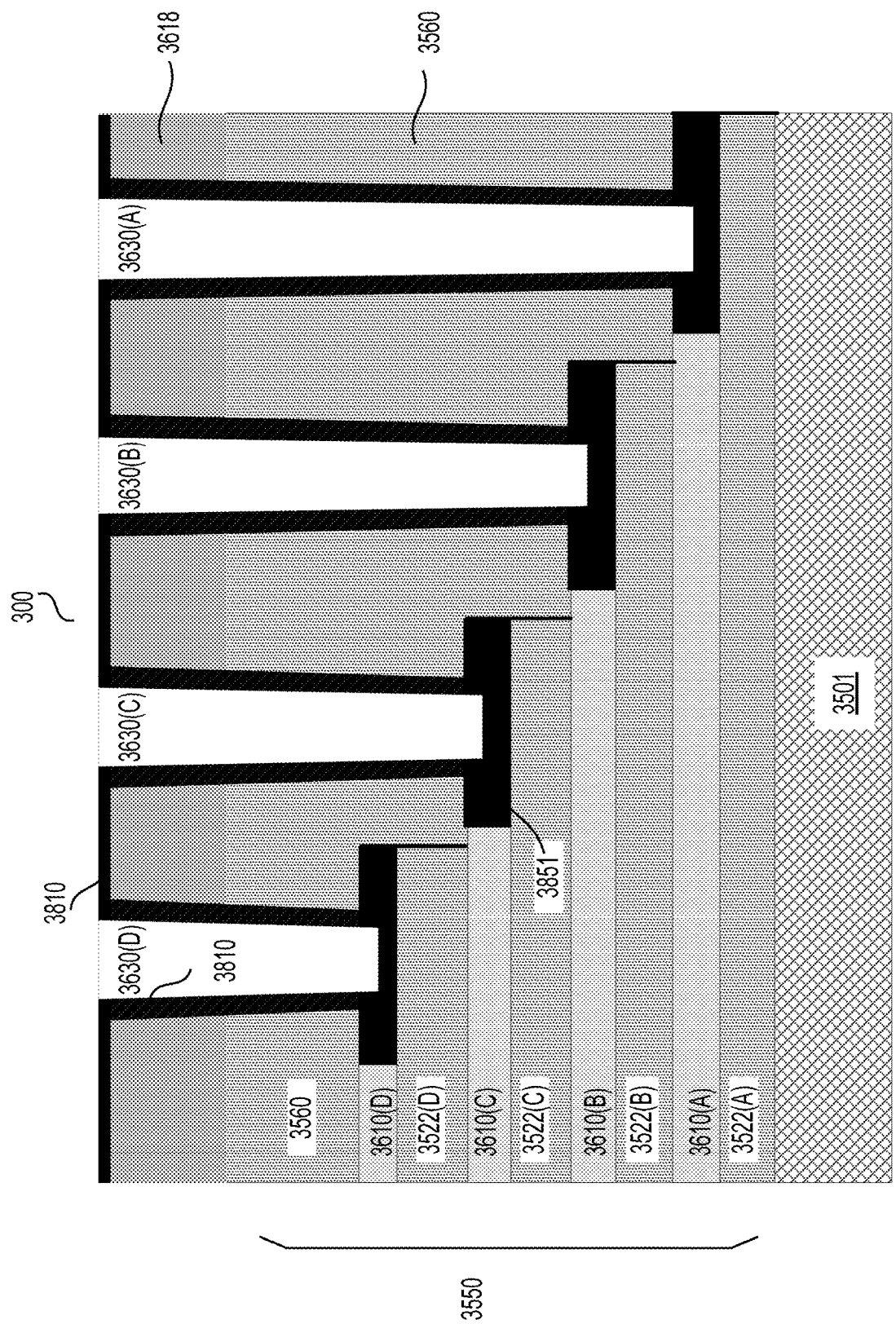

Referring to FIGS. 38 and 45, at S4506, the first recessed regions 3710 can be filled with a conductive layer 3810. The conductive layer 3810 can further cover the sidewalls of the first holes 3630 and the stack 3550. In an example, the conductive layer 3810 completely fills the first recessed regions 3710. Portions of the conductive layer 3810 that fill the first recessed regions 3710 can be referred to as the conductive portions 3851.

The conductive layer 3810 can be formed of any suitable conductive materials, such as metallic materials (e.g., W). In an example, the conductive layer 3810 is formed of W and can be referred to as a W liner. The conductive layer 3810 can be formed using any suitable deposition techniques, such as CVD, PVD, ALD, an e-beam evaporation, a sputtering, a diffusion, or any combination thereof.

Figure 39:
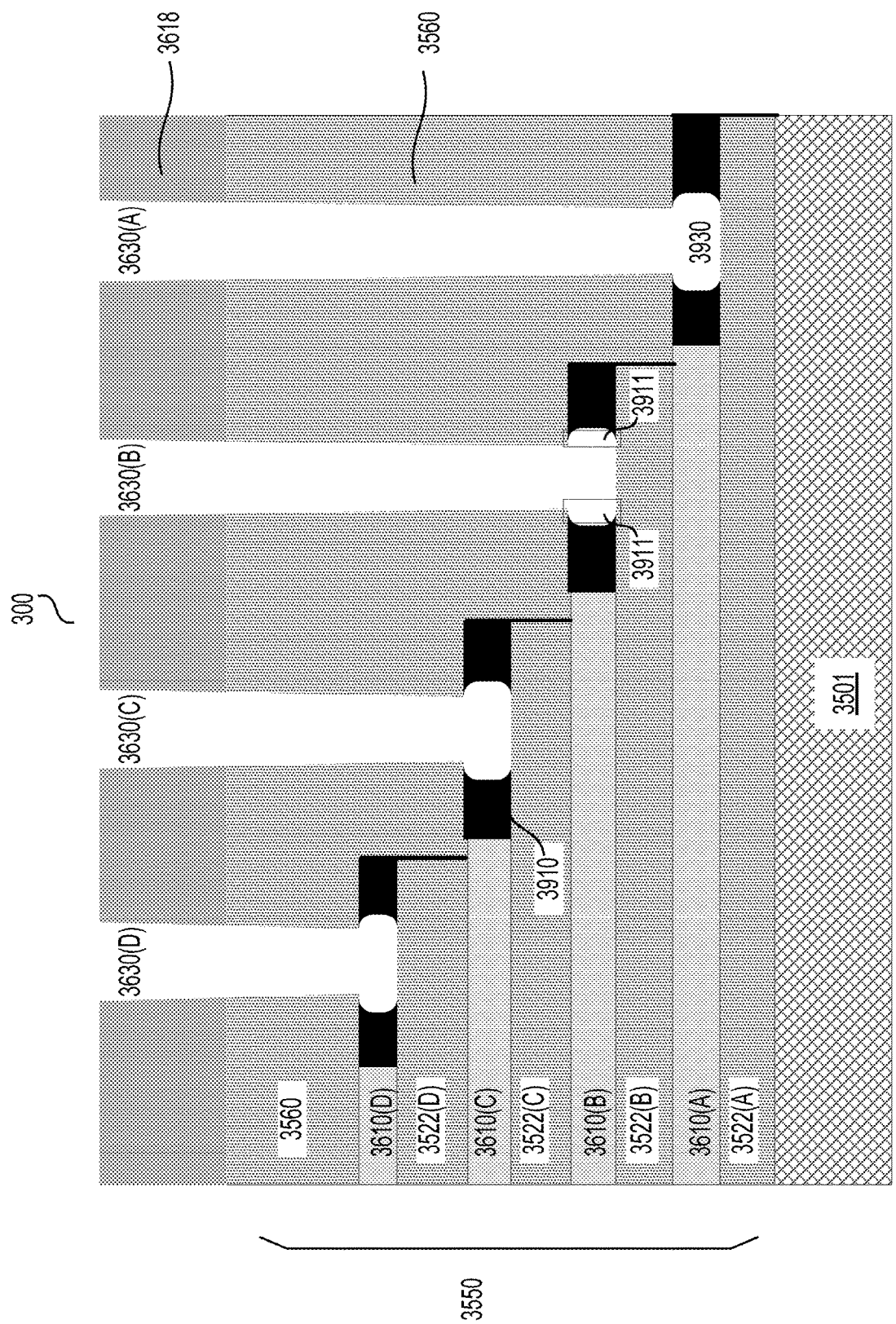

Referring to FIGS. 39 and 45, at S4508, the conductive layer 3810 over the sidewalls of the first holes 3630 and the stack 3550 are removed by an etching process. Portions of the conductive portions 3851 in the first recessed regions 3710 can be removed by the etch process at S4508. Because thicknesses of the respective conductive portions 3851 along the X direction are significantly larger than thicknesses of the conductive layer 3810 over the sidewalls of the first holes 3630, relatively large portions of the conductive portions 3851 in the first recessed regions 3710 remain intact after the etch process. The remaining portions of the conductive portions 3851 can be referred to as the remaining conductive portions 3910. Further, spaces 3930 can be formed due to removal of the conductive layer 3810 over the bottom surfaces of the first holes 3630. The first holes 3630 further include the respective spaces 3930. In an example, the spaces 3930 further include recesses 3911 formed in the remaining conductive portions 3910.

Figure 40:
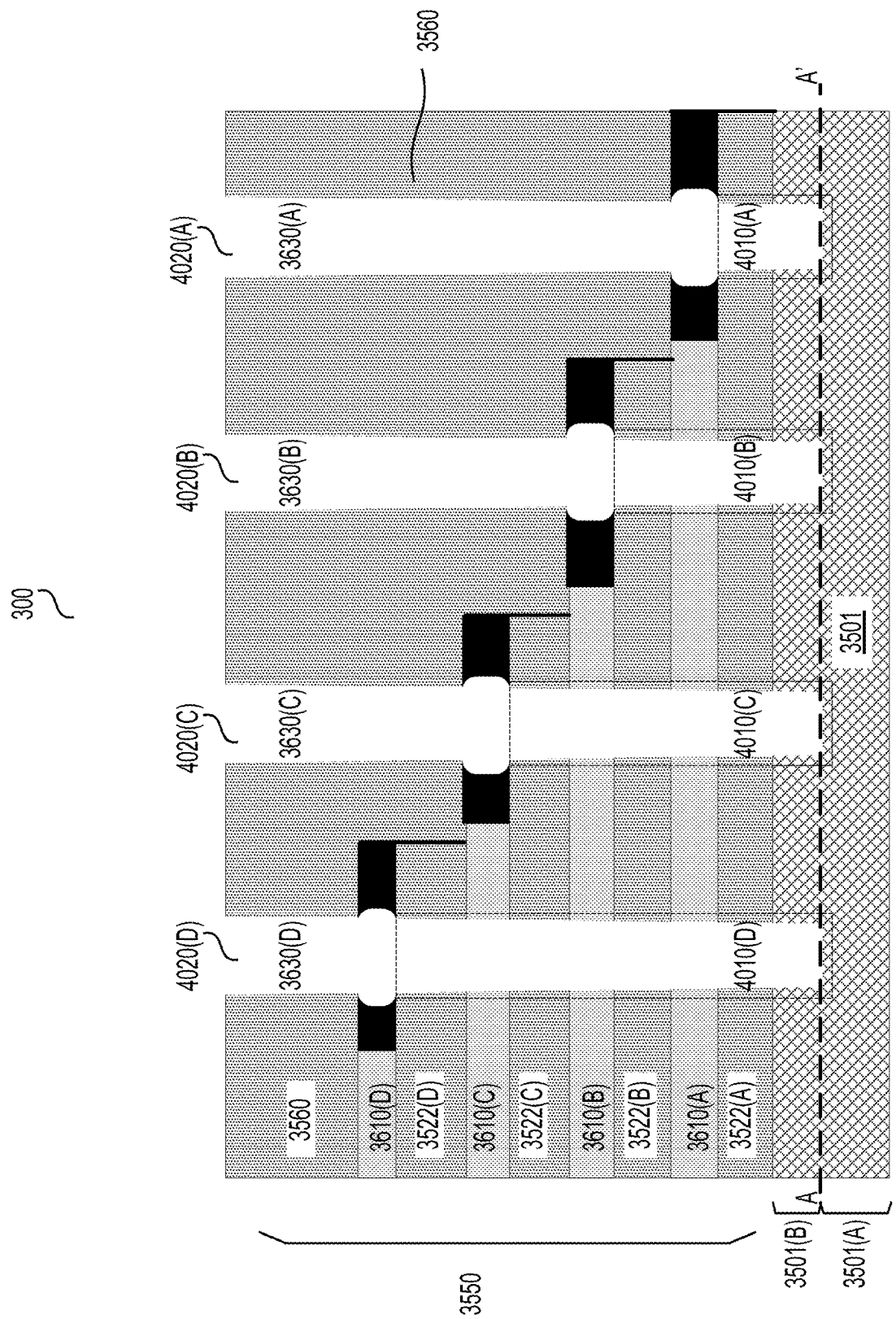

Referring to FIGS. 40 and 45, at S4510, materials between the first holes 3630 (or the spaces 3930) and the bottom portion 3501(A) of the insulating layer 3501 can be removed by an etching process (e.g., a dry etching process) to form second holes 4010 (e.g., 4010(A)-4010(D)) that are directly connected to the respective first holes 3630. Combined holes 4020 include the first holes 3630 and the respective second holes 4010 that are connected to the first holes 3630. For example, the combined hole 4020(A) includes the first hole 3630(A) and the second hole 4010(A). The combined stair-DCH-CT structures 3530 can subsequently be formed in the respective combined holes 4020.

In an example, the mask layer 3618 is removed after forming the second holes 4010, for example, by a plasma ashing and a wet clean.

Figure 41:
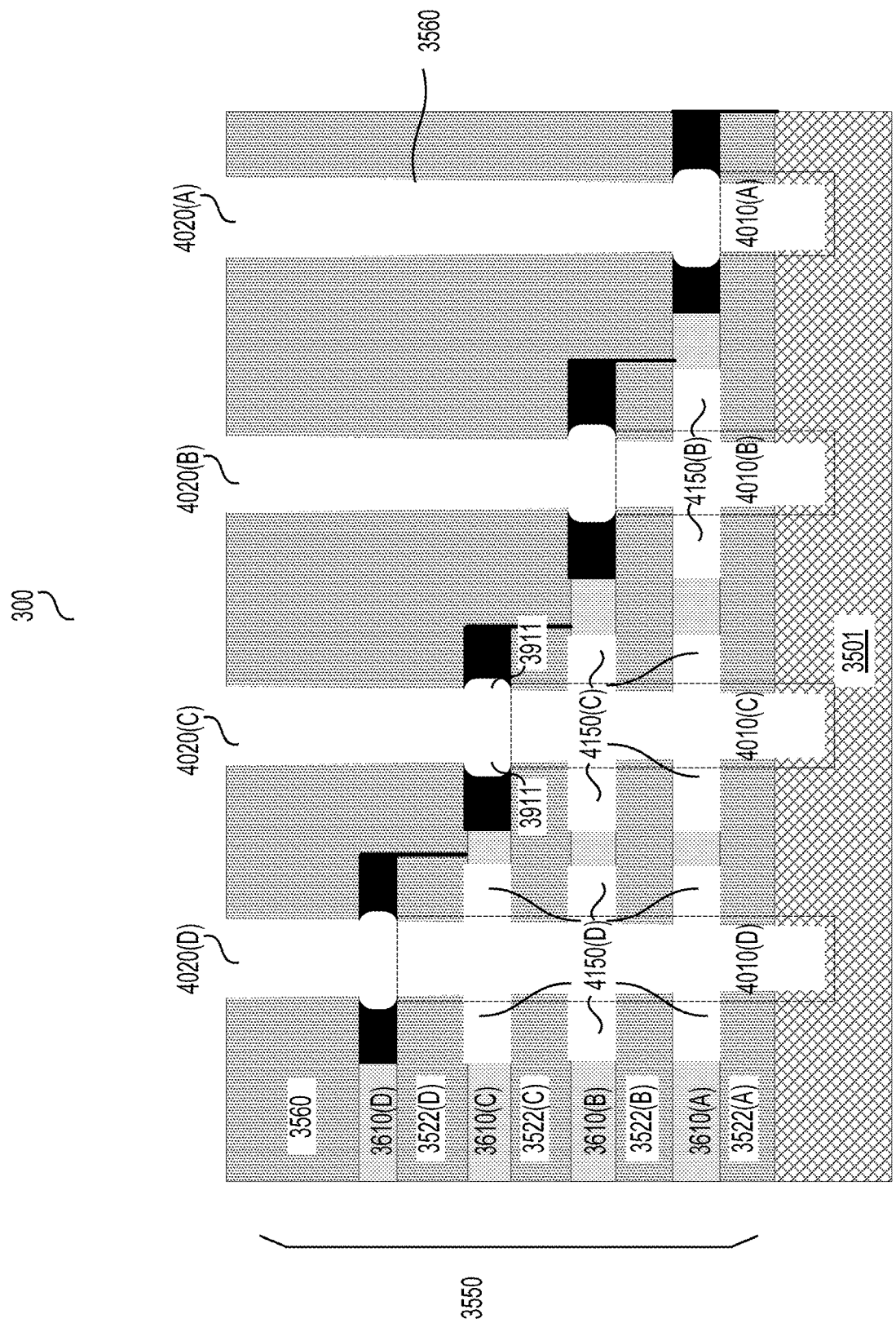

Referring to FIGS. 41 and 45, at S4512, second recessed region(s) 4150 (e.g., 4150(B)-4150(D)) are formed in the respective sacrificial layer(s) 3610 by removing portions of the respective sacrificial layer(s) 3610 using an etching process, such as a dry etching process, a wet etching process, or a combination thereof. The second recessed region(s) 4150 are formed in the respective sacrificial layer(s) 3610 that are adjacent to the second holes 4010. For example, the second recessed regions 4150(C) are formed in the sacrificial layers 3610(A)-3610(B). In an example, no second recessed region is formed adjacent to the second hole 4210(A).

Figure 42:
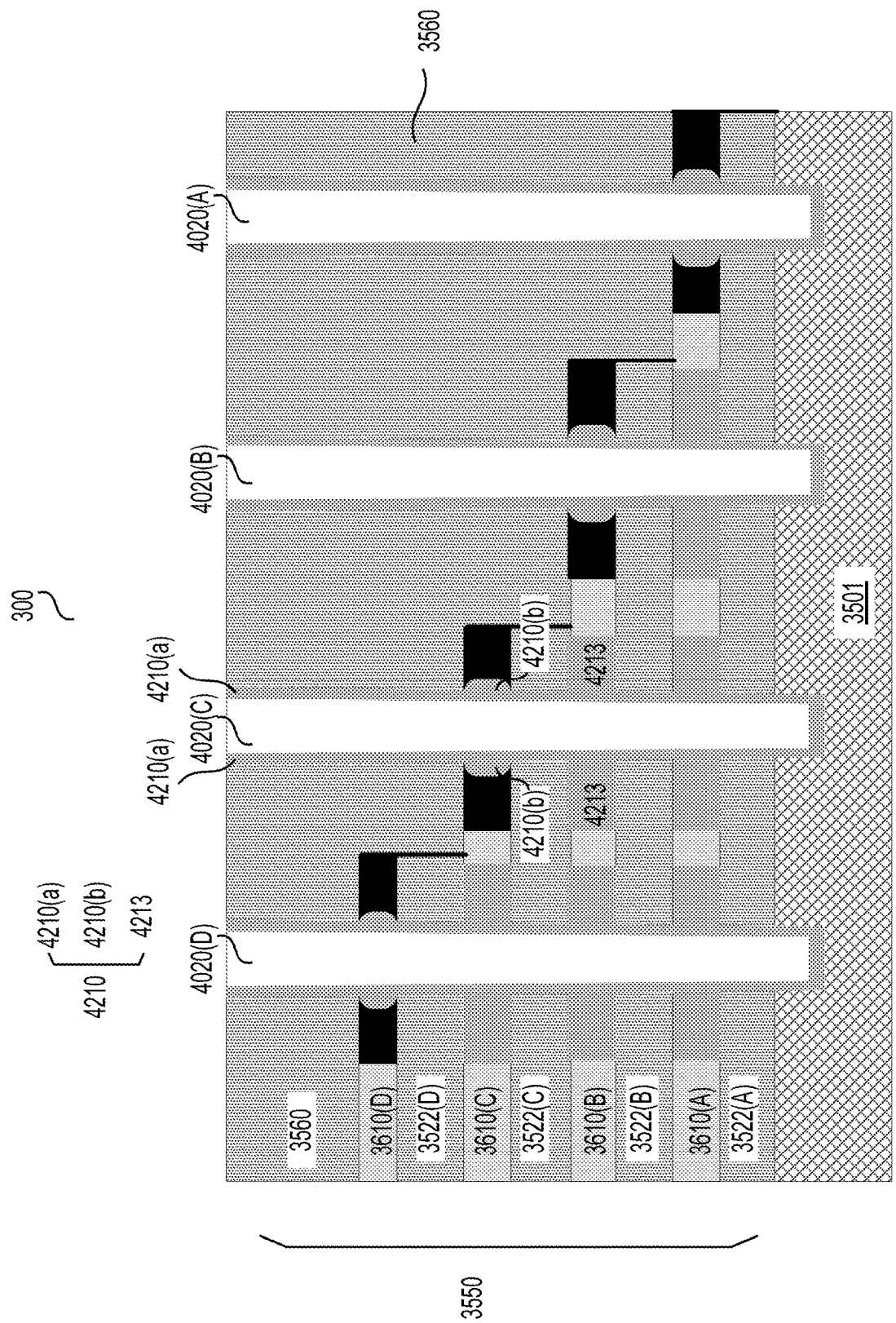

Referring to FIGS. 42 and 45, at S4514, a spacer layer 4210 is formed over sidewalls of the combined holes 4020. The spacer layer 4210 can further fill the second recessed regions 4150 and the recesses 3911. The spacer layer 4210 can include portions 4210(a) that cover the sidewalls of the combined hole 4020, portions 4210(b) that fill the recesses 3911, and portions 4213 that fill the second recessed regions 4150. Any suitable deposition techniques. such as CVD, PVD, ALD, an e-beam evaporation, a sputtering, a diffusion, or any combination thereof can be performed to form the spacer layer 4210. In an example, ALD is performed to form the spacer layer 4210. In an example, such as shown in FIG. 42, the space layer 4210 completely fills the second recessed regions 4150 to provide stronger support to the staircase region 3520 as compared to an incomplete filling.

Figure 43:
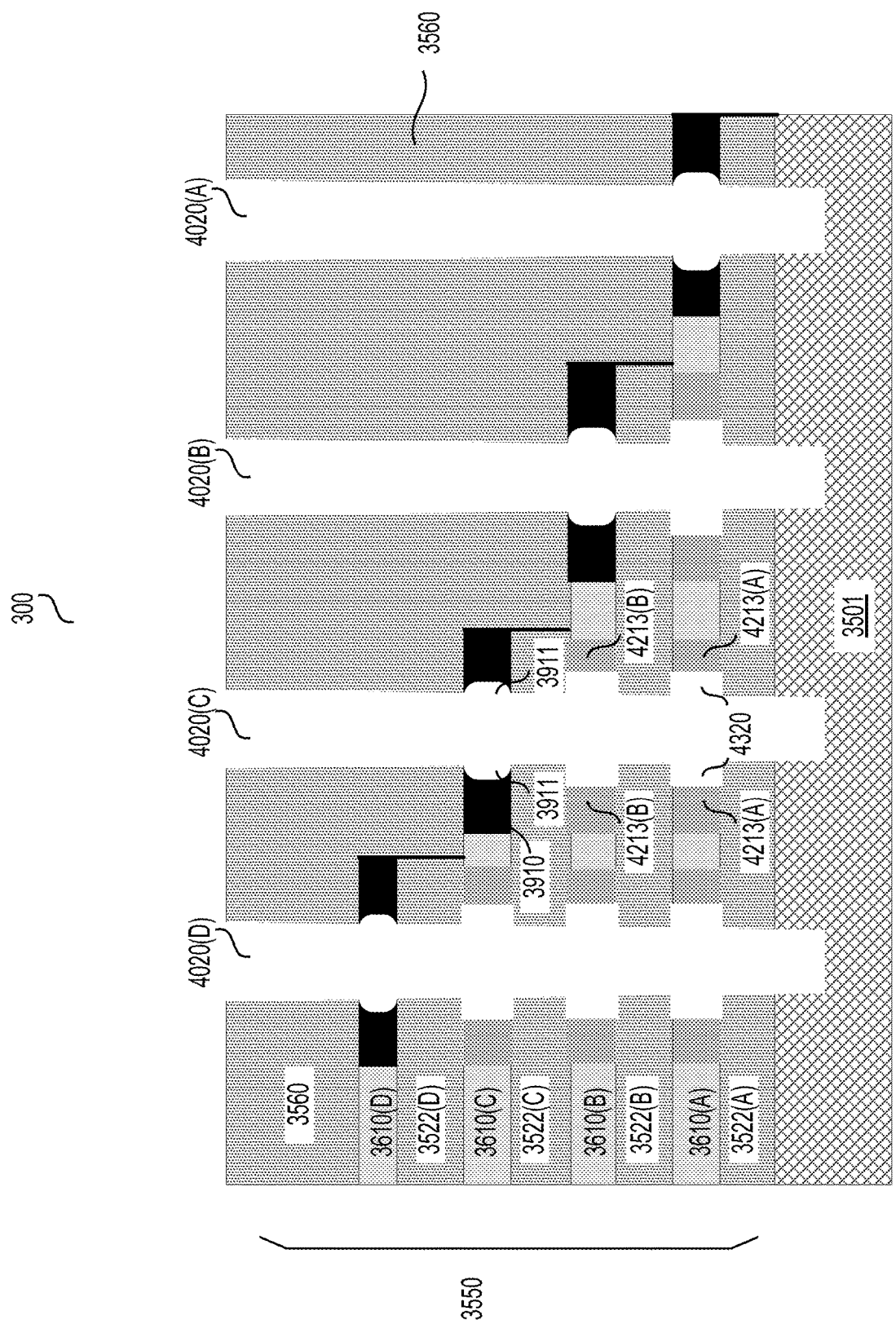

Referring to FIGS. 43 and 45, at S4516, the spacer layer 4210 (e.g., 4210(a)) over the sidewalls of the combined holes 4020 and the stack 3550 are removed by an etching process. Further, the spacer layer 4210 (e.g., the portions 4210(b) that fill the recesses 3911) is removed to expose the remaining conductive portions 3910 by an etching process. The recesses 3911 are also exposed. In an example, a part of the portions 4213 is removed, and recesses 4320 are formed in the etching process. An etching process that selectively etches the spacer layer 4210 (e.g., silicon oxide) can be performed. The remaining portions 4213 (e.g., 4213(A) and 4213(B)) that are between the insulating layers 3522 are the first insulating structures shown in FIG. 35.

Figure 44:
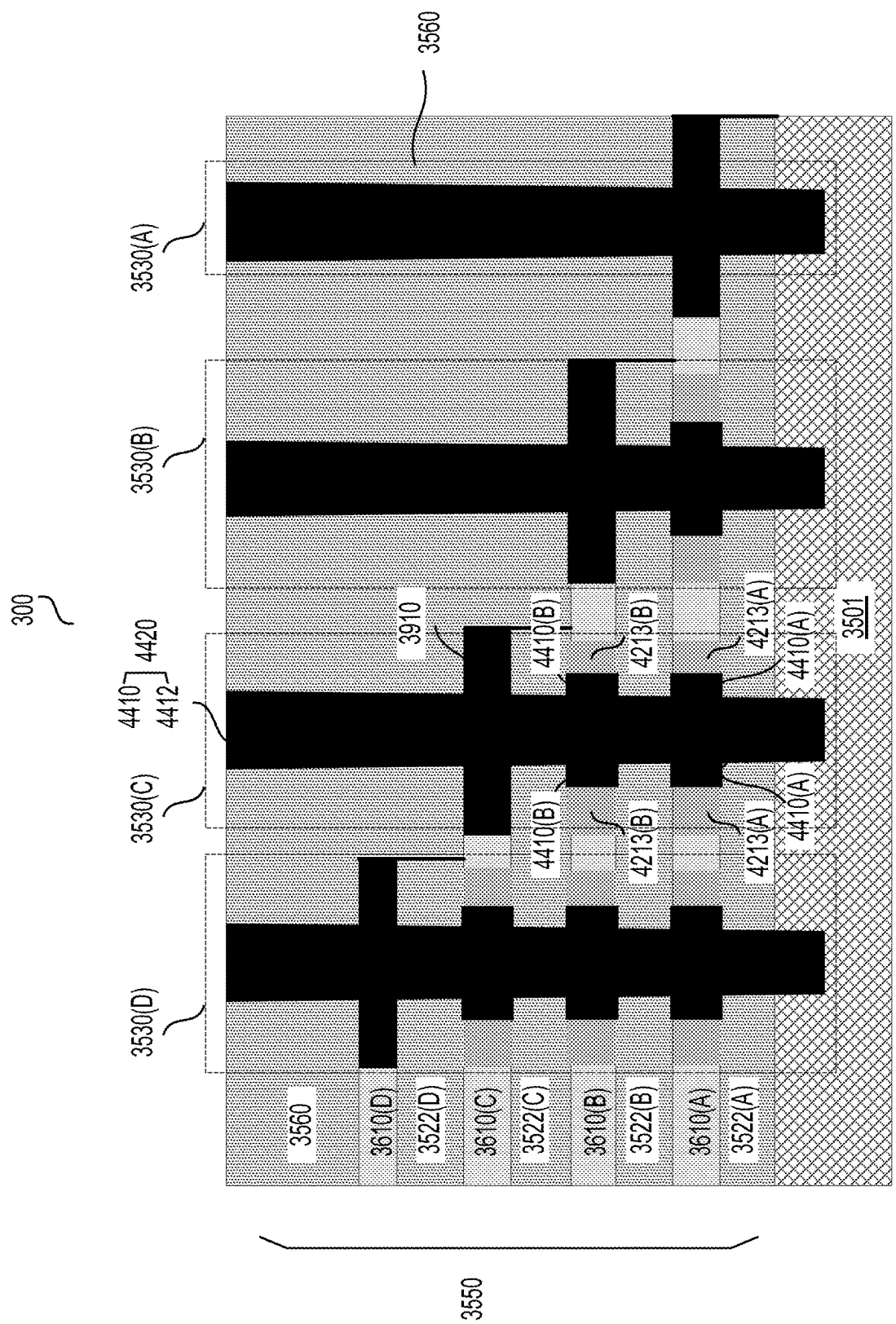

Referring to FIGS. 44 and 45, at S4518, the combined holes 4020 can be filled with metallic material(s) to form the conductive structure 4420. The conductive structure 4420 includes the metal via 4412. In an example, the metallic material(s) completely fills the combined holes 4020. Further, the metallic material(s) fills the recesses 3911 to conductively connect to the remaining conductive portions 3910 and fill the recesses 4320 to form the protrusions 4410 of the conductive structure 4420. In an example, the metallic material(s) is formed of W. Referring to FIG. 44, the combined DCH-CT structures 3530 (e.g., 3530(A)-3530(D)) are formed. In some embodiments, a CMP is performed to remove the metallic material(s) deposited over the stack 3550.

Referring to FIGS. 35 and 45, at S4520, the sacrificial layers 3610 are replaced with the gate layers 3510, similarly as described with reference to FIG. 1A and S1928 in the process 1900. In an example, the gate layers 3510 are formed of a metal layer. A material of the metal layer includes a metal or a combination of metallic materials having high conductivity, such as W, Cu, and the like. The gate layers 3510 can include additional layer(s).

When the sacrificial layers 3610 are removed, the combined DCH-CT structures 3530 support the stack of insulating layers 3522 in the staircase region 3520.

The process 4500 can be suitably adapted to include additional step(s), to omit step(s), and/or to modify step(s). For example, core structures within the metal pillars 4412 can be formed for the semiconductor device 300, similarly as described with reference to FIG. 18.

In an example, referring back to FIG. 43, at S4516, the recesses 4320 are not formed in the etching process, and thus no protrusions 4410 are formed and the conductive structure 4420 does not include the protrusions 4410.

In an example, steps S4512, S4514, and S4516 corresponding to FIGS. 41-43 can be replaced by an oxidization step. Following S4510 described with reference to FIG. 40, portions of the sacrificial layers 3610 (e.g., 3610(A)-3610(B)) that are adjacent to the second holes 4010 (e.g., 4010(C)) can be oxidized to form the first insulating structures 4213 (e.g., 4213(A)-4213(B)) directly. For example, the sacrificial layers 3610 include silicon nitride, and can be oxidized into the first insulating structures 4213 that include SiON. The combined holes 4020 can be filled with conductive (e.g., metallic) material(s) to form the conductive structure 4420. The conductive structure 4420 does not include the protrusions 4412.

In an example, the semiconductor device 300 is manufactured by the process 4500 described with reference to FIGS. 35-44 over the insulating layer 3501 and the substrate 3502.

In an example, the semiconductor device 300 is manufactured over a sacrificial substrate. The stack 3550 is formed over the sacrificial substrate instead of the insulating layer 3501, and the process 4500 can be adapted accordingly. For example, after S4520 where the sacrificial layers are replaced by the gate layers, the sacrificial substrate can be removed by an etching process. A deposition process can be used to form the insulating layer 3501 to cover the contact structures 3530. Further, a deposition process, such as an epitaxial deposition can be applied to form the semiconductor layer 3502 (e.g., a polysilicon layer) over the insulating layer 3501.

The semiconductor device 300 shown in FIG. 35 can be suitably adapted, for example, to include other structures and/or materials. For example, the gate layers 3510 in FIG. 35 include the MG electrode (or a metal layer) and do not include a high-k insulating layer. In some embodiments, the gate layers further include a high-k insulating layer, such as shown in FIG. 46, FIG. 46 shows a vertical cross-sectional view of a portion 400A of a semiconductor device (or a memory device) 400 according to an embodiment of the disclosure. The semiconductor device 400 is similar to the semiconductor device 300 except that gate layers 4610 (e.g., 4610(A)-4610(D)) in the semiconductor device 400 are different from the gate layers 3510 in the semiconductor device 300, and thus detailed descriptions of the semiconductor device 400 are omitted for purposes of brevity. Referring to FIG. 46, the gate layers 4610 in the semiconductor device 400 include MG electrodes (or metal layers) 4612 and high-k insulating layers 4611. As described above, the high-k insulating layer 4611 can be formed of any suitable material(s) that provide the relatively large dielectric constant, such as $HfO_2$, $HfSiO_4$, $HfSiON$, $Al_2O_3$, $La_2O_3$, $Ta_2O_5$, $Y_2O_3$, $ZrO_2$, $SrTiO_3$, $ZrSiO_4$, $HfZrO_4$, and the like. The MG electrodes (or metal layers) 4612 can be formed of a metal or a combination of metallic materials having high conductivity, such as W, Cu, and the like. In an example, the MG electrodes (or the metal layers) 4612 is formed of W.

FIGS. 47-58 show vertical cross-sectional views of the semiconductor device 400 at various steps of a process according to exemplary embodiments of the disclosure. For purposes of brevity, the structure 3502 is not shown in FIGS. 47-58.

Figure 59A:
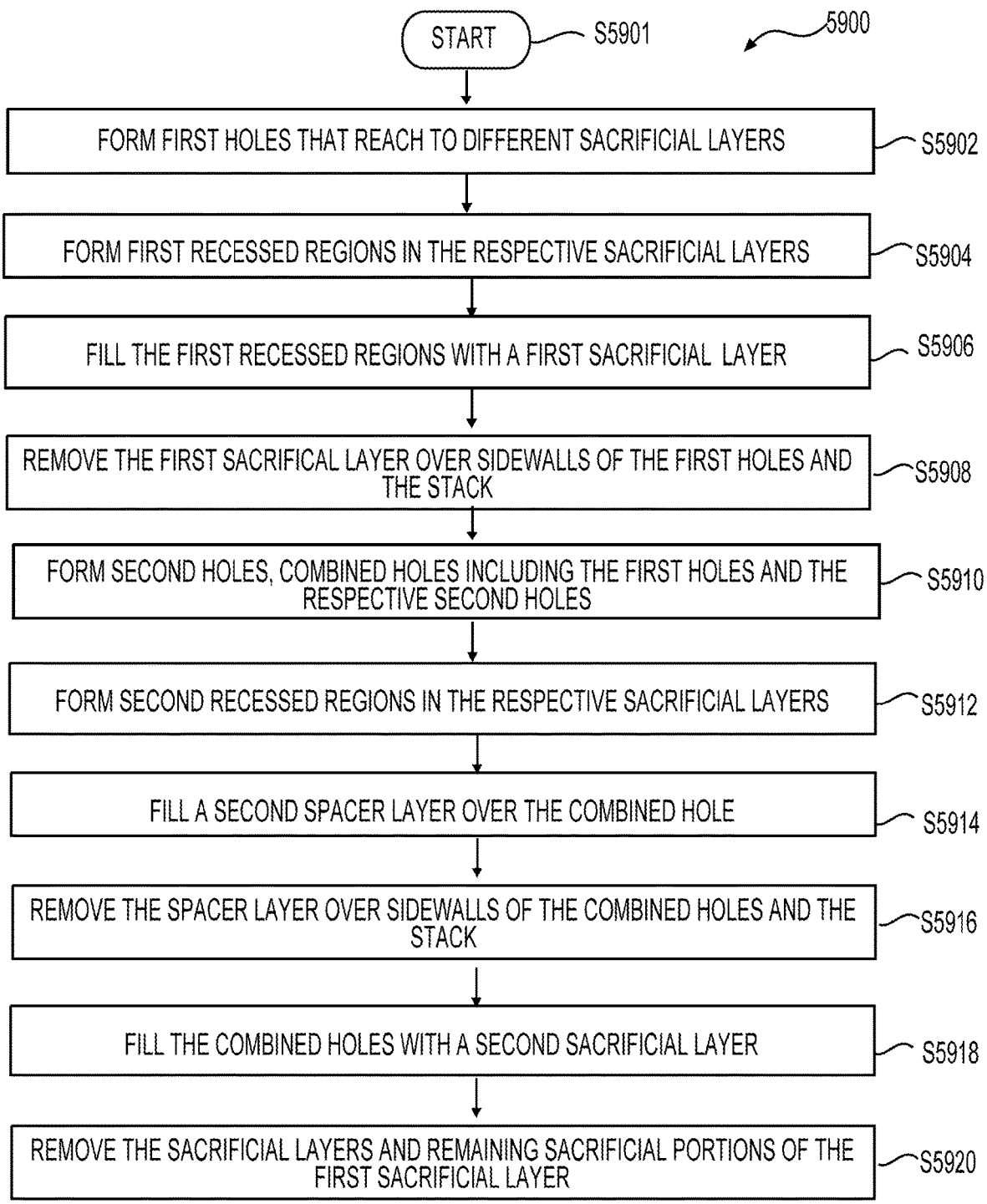
FIGS. 59A-59B show a flow chart outlining a process 5900 to manufacture the semiconductor device 400 according to an exemplary embodiment of the disclosure.
Figure 59B:
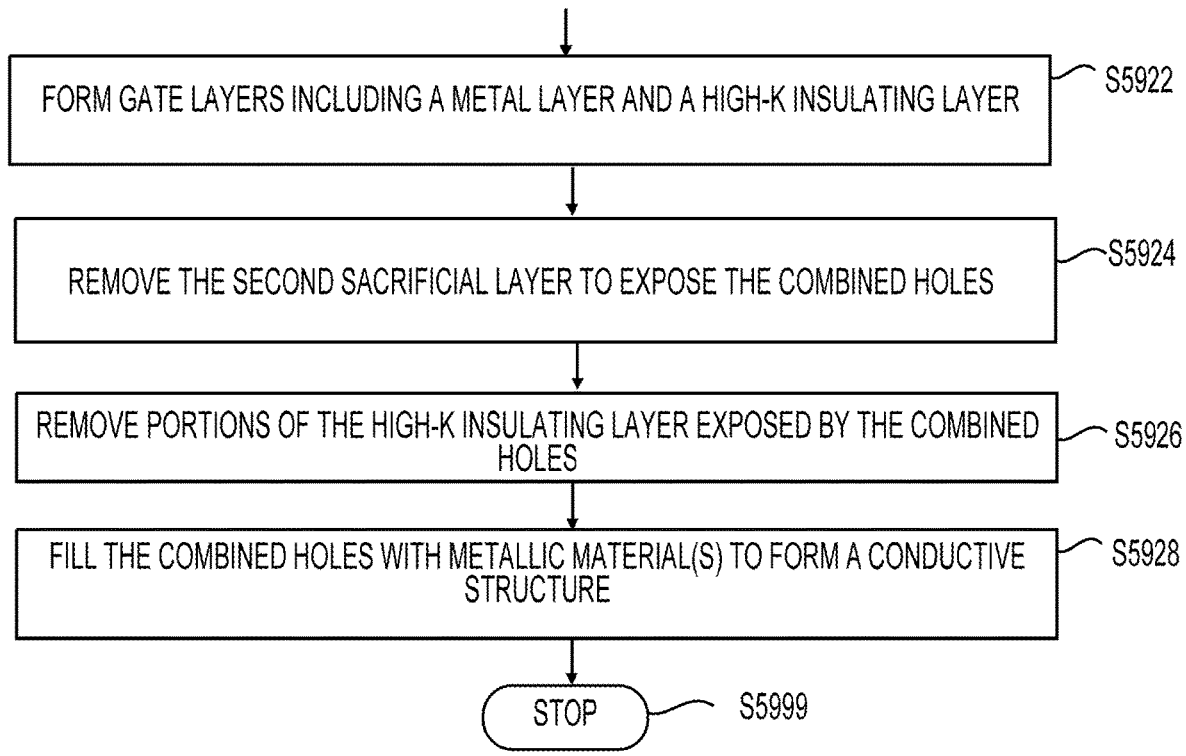

FIGS. 59A-59B show a flow chart outlining a process 5900 to manufacture the semiconductor device 400 according to an embodiment of the disclosure. The process 5900 starts at S5901 where a plurality of channel structures, such as described above, is formed in a core region of the semiconductor device 400. In some embodiments, holes are formed in the core region. A channel structure including a gate dielectric layer, a semiconductor layer, and an insulating layer can be formed within the holes. Comparing steps S4501 and S5901, prior to forming the gate dielectric layer (e.g., an ONO stack structure) of the channel structure in the semiconductor device 400, a high-k insulating layer is not formed to cover sidewalls of the holes at S5901. Thus, at S5901 in the process 5900, the channel structure of the semiconductor device 400 is formed directly over the sidewalls of the holes. On the other hand, at S4501 in the process 4500, the channel structure of the semiconductor device 300 is formed over the high-k insulating layer.

Further, referring back to FIG. 36, at S5901, the stack 3550 can include the alternating sacrificial layers 3610 (e.g., 3610(A)-3610(D)) and the insulating layers 3522 formed over the insulating layer 3501 of the semiconductor device 400. The thicknesses, material(s), and the fabrication of the sacrificial layers 3610 and the insulating layers 3522 can be similar to those described with reference to the semiconductor device 300. The stair-steps (e.g., the stair-steps 3561-3564) can be formed in the stair-case region 3520 in the stack 3550, similarly as described with reference to the semiconductor device 300 in FIG. 36.

For clarity purposes, FIGS. 47-58 illustrate the staircase region 3520 of the semiconductor device 400 and show a process used to form the combined DCH-CT structures 3530 in the staircase region 3520.

Referring to FIG. 59A, steps S5902 and S5904 in the process 5900 are similar to the steps S4502 and S4504 in the process 4500, and thus detailed descriptions are provided with references to FIGS. 36-37 and are omitted for purposes of brevity. FIGS. 36-37 show the vertical cross-sectional views of the semiconductor devices 300 and 400.

Figure 47:
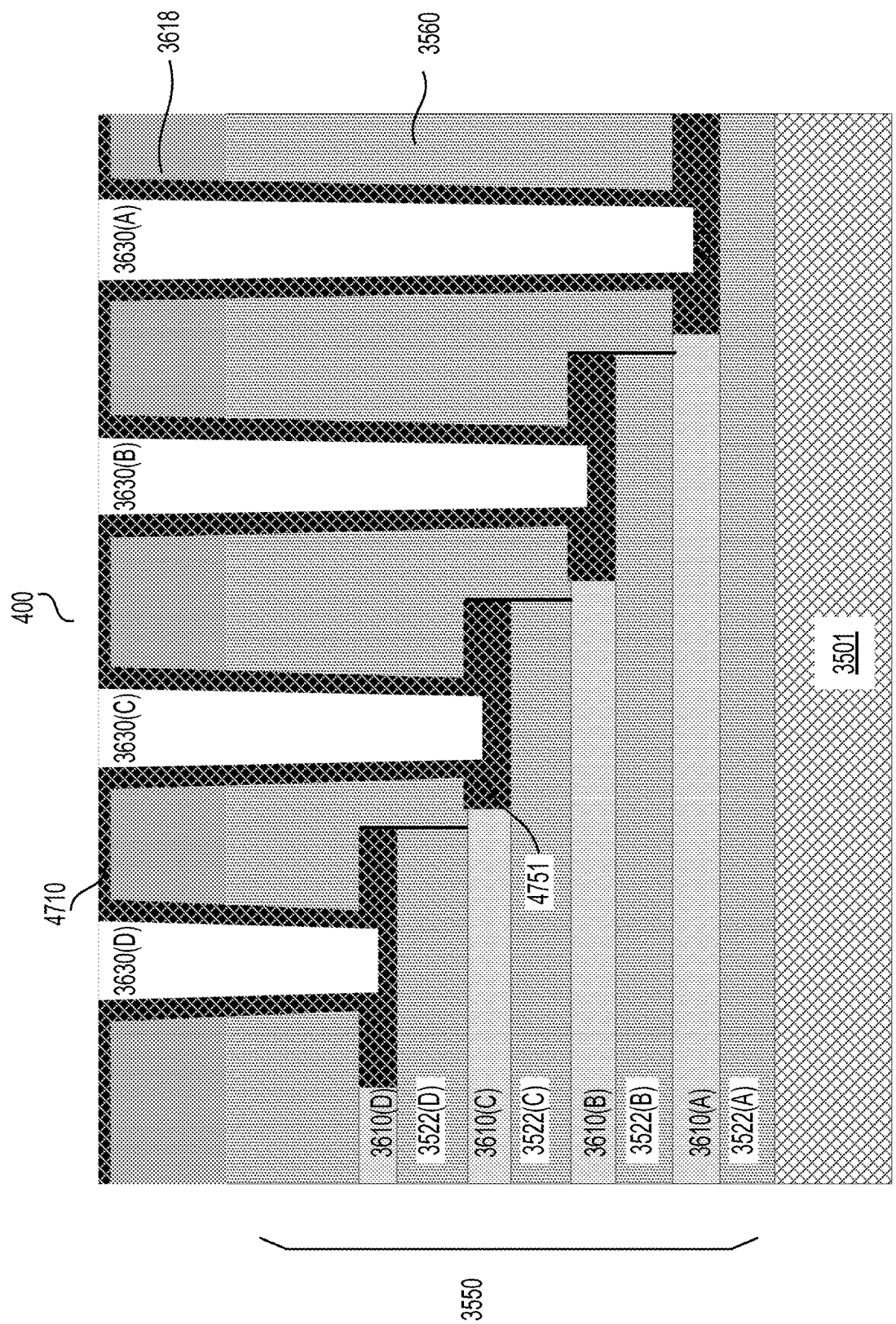
FIGS. 47-58 show vertical cross-sectional views of the semiconductor device 400 at various steps of a process according to exemplary embodiments of the disclosure.

Referring to FIGS. 47 and 59A, at S5906, the first recessed regions 3710 can be filled with a sacrificial layer 4710 (or a first sacrificial layer). The sacrificial layer 4710 can further cover the sidewalls of the first holes 3630 and the stack 3550. In an example, the sacrificial layer 4710 completely fills the first recessed regions 3710. Portions of the sacrificial layer 4710 that fill the first recessed regions 3710 can be referred to as the sacrificial portions 4751.

The sacrificial layer 4710 can include any suitable materials, such as polysilicon, metal oxide(s), or the like. In an example, a material is selected for the sacrificial layer 4710 such that an etch rate of the sacrificial layer 4710 is different from those of the insulating layers 3522 (e.g., silicon oxide) and the sacrificial layers 3610 (e.g., silicon nitride). The sacrificial layer 4710 can be formed using any suitable deposition techniques, such as CVD, PVD, ALD, an e-beam evaporation, a sputtering, a diffusion, or any combination thereof.

Figure 48:
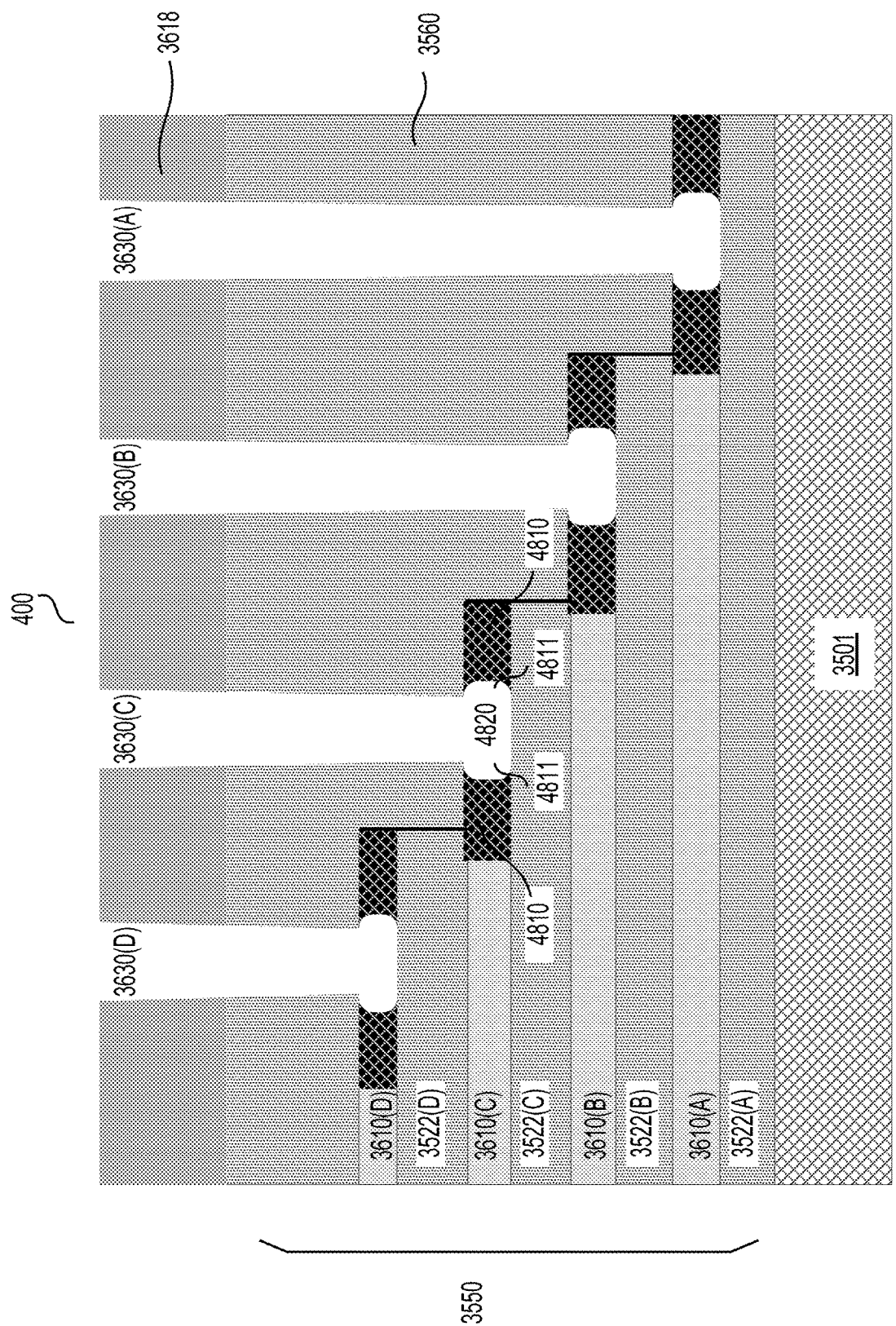

Referring to FIGS. 48 and 59A, at S5908, the sacrificial layer 4710 over the sidewalls of the first holes 3630 and the stack 3550 are removed by an etching process. Portions of the sacrificial layer 4710 in the first recessed regions 3710 can be removed by the etch process. Because thicknesses of the respective sacrificial portions 4751 along the X direction are significantly larger than thicknesses of the sacrificial layer 4710 over the sidewalls of the first holes 3630, relatively large portions of the sacrificial portions 4751 in the first recessed regions 3710 remain intact after the etch process. The remaining portions of the sacrificial portions 4751 can be referred to as the remaining sacrificial portions 4810. Further, spaces 4820 can be formed due to removal of the sacrificial layer 4710 over the bottom surfaces of the first holes 3630. The first holes 3630 further include the respective spaces 4820. In an example, the spaces 4820 further include recesses 4811 formed in the remaining sacrificial portions 4810.

Figure 49:
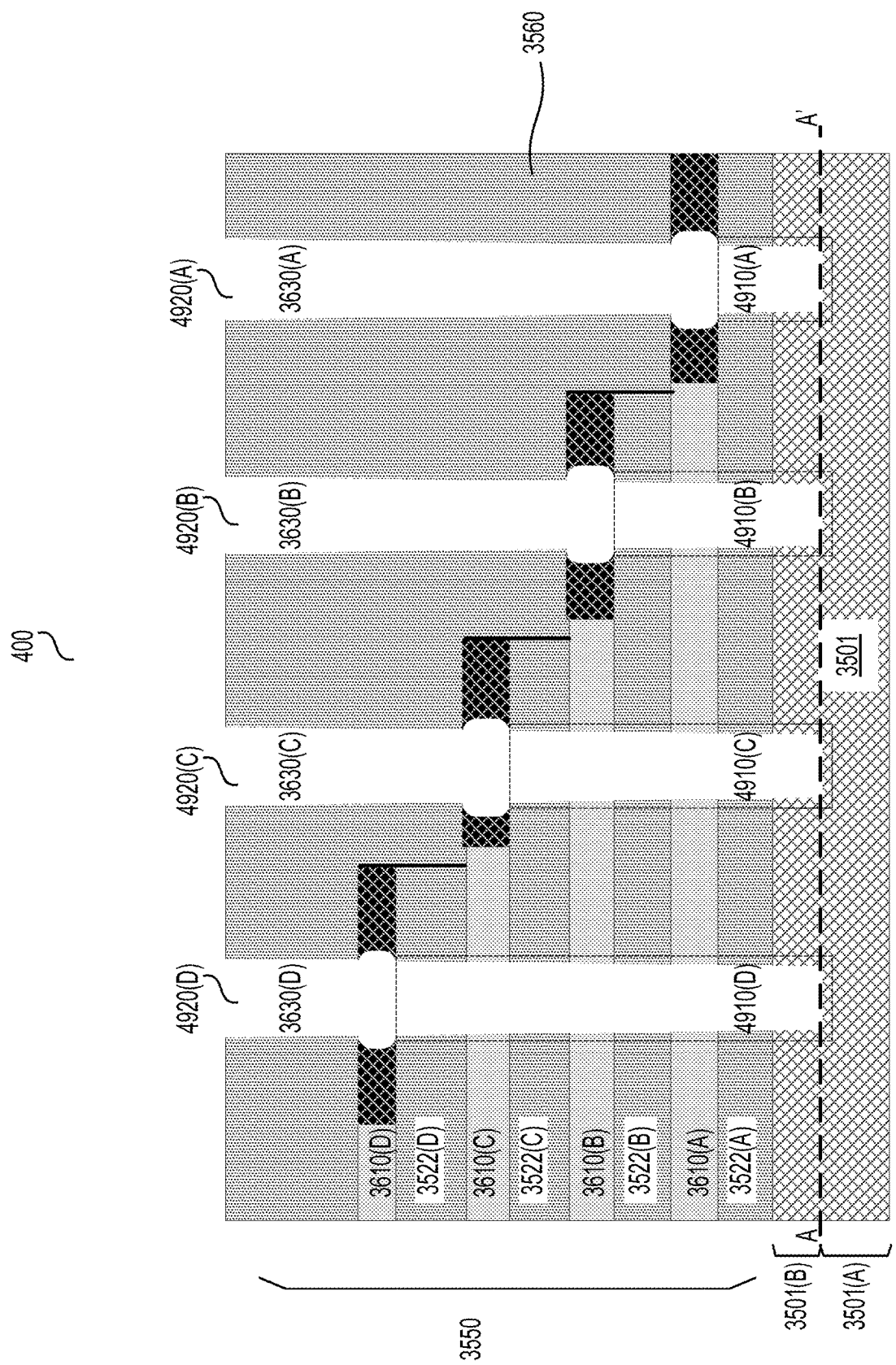

Referring to FIGS. 49 and 59A, at S5910, materials between the first holes 3630 (or the spaces 4820) and the bottom portion 3501(A) of the insulating layer 3501 can be removed by an etching process (e.g., a dry etching process) to form second holes 4910 (e.g., 4910(A)-4910(D)) that are directly connected to the respective first holes 3630. Combined holes 4920 include the first holes 3630 and the respective second holes 4910 that are connected to the first holes 3630. For example, the combined hole 4920(A) includes the first hole 3630(A) and the second hole 4910(A). The combined stair-DCH-CT structures 3530 can subsequently be formed in the respective combined holes 4920.

In an example, the mask layer 3618 is removed after forming the second holes 4910, for example, by a plasma ashing and a wet clean.

Figure 50:
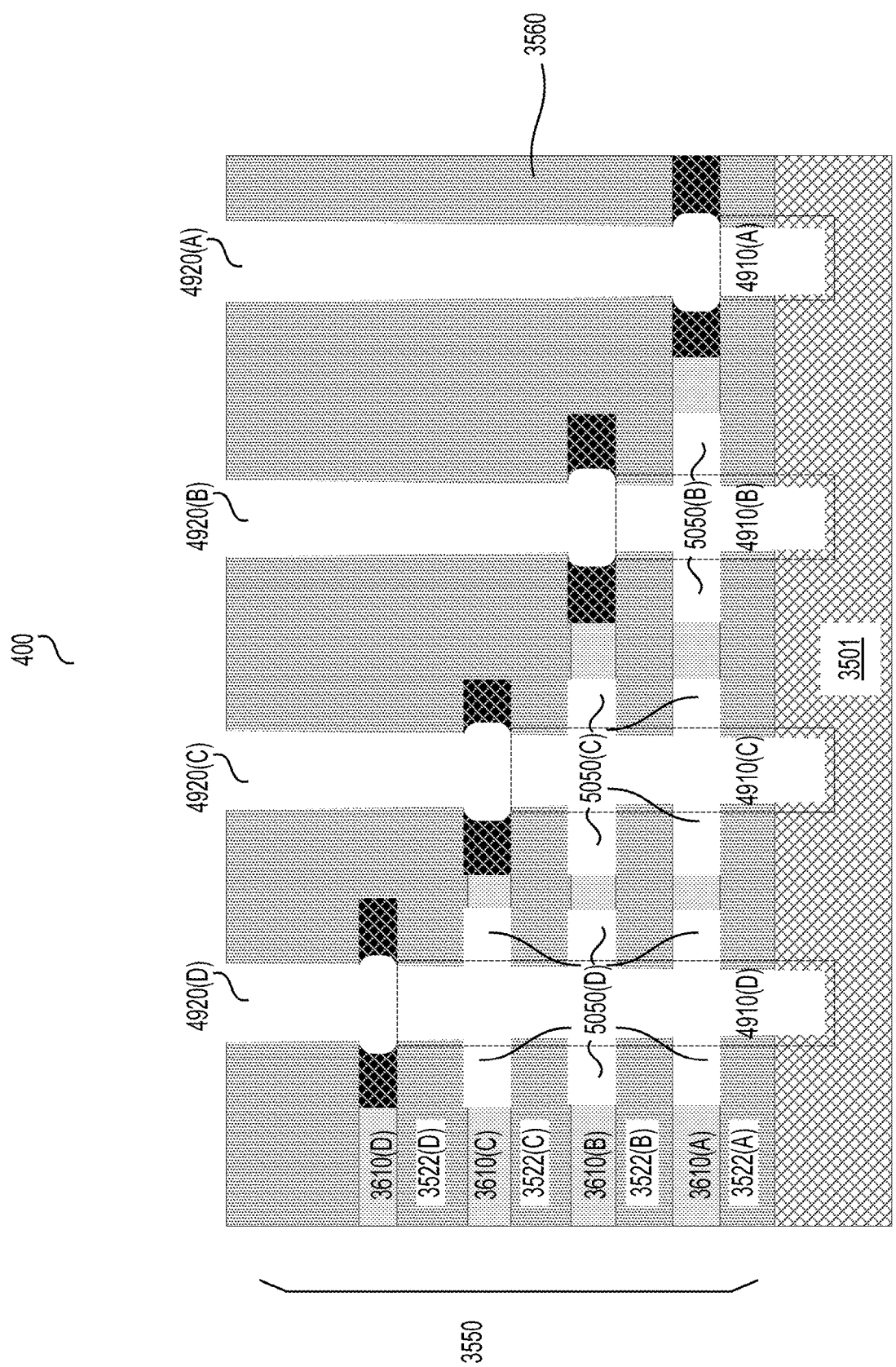

Referring to FIGS. 50 and 59A, at S5912, second recessed region(s) 5050 (e.g., 5050(B)-5050(D)) are formed in the respective sacrificial layer(s) 3610 by removing portions of the respective sacrificial layer(s) 3610 using an etching process, such as a dry etching process, a wet etching process, or a combination thereof. The second recessed region(s) 5050 are formed in the respective sacrificial layer(s) 3610 that are adjacent to the second holes 4910. For example, the second recessed regions 5050(C) are formed in the sacrificial layers 3610(A)-3610(B). In an example, no second recessed region is formed adjacent to the second hole 4910(A).

Figure 51:
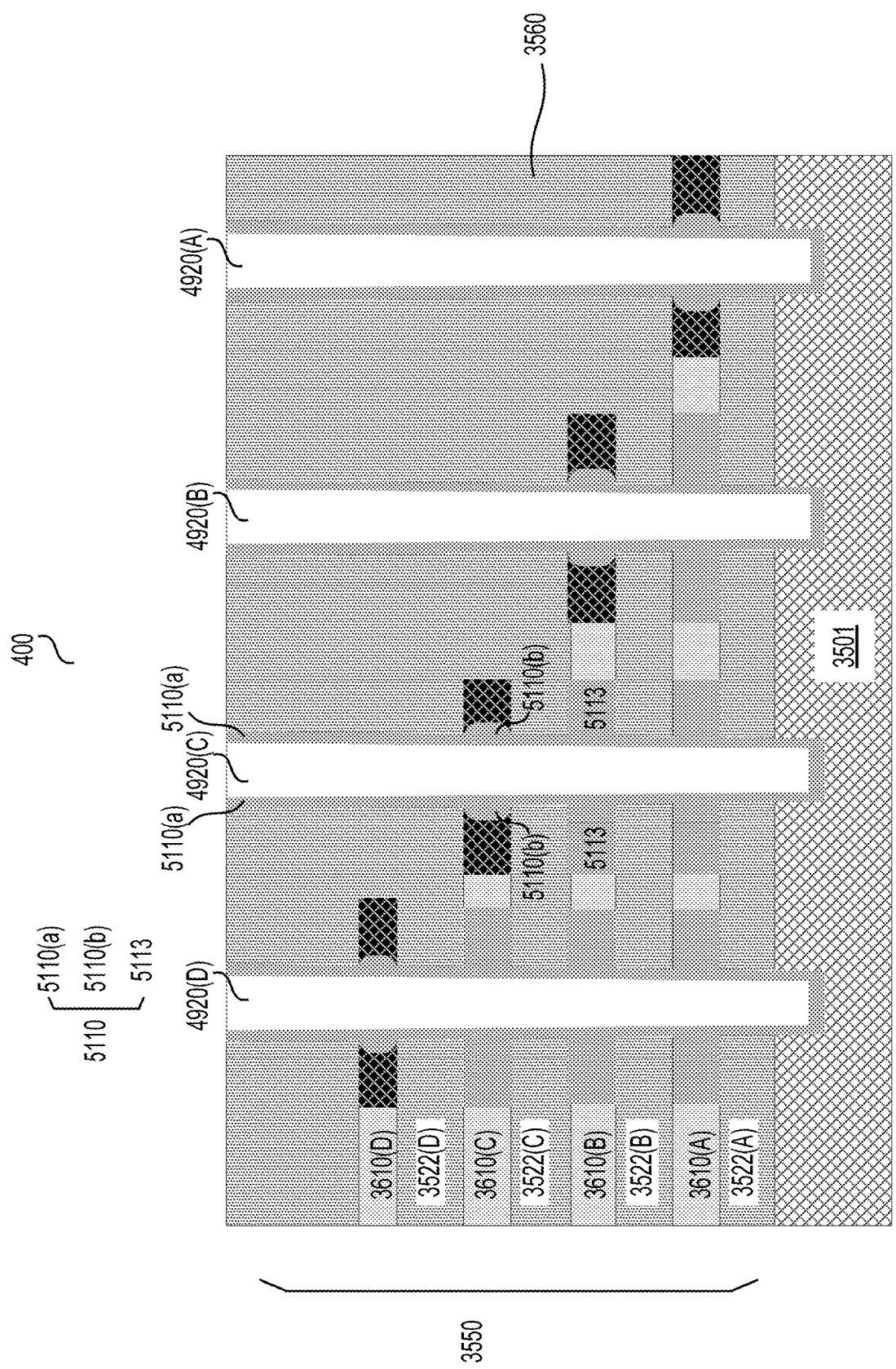

Referring to FIGS. 51 and 59A, at S5914, a second spacer layer 5110 is formed over sidewalls of the combined holes 4920. The second spacer layer 5110 can further fill the second recessed regions 5050 and the recesses 4811. The second spacer layer 5110 can include portions 5110(a) that cover the sidewalls of the combined holes 4920, portions 5110(b) that fill the recesses 4811, and portions 5113 that fill the second recessed regions 5050. Any suitable deposition techniques, such as CVD, PVD, ALD, an e-beam evaporation, a sputtering, a diffusion, or any combination thereof can be performed to form the second space layer 5110. In an example, ALD is performed to form the second space layer 5110. In an example, such as shown in FIG. 51, the space layer 5110 completely fills the second recessed regions 5050 to provide stronger support to the staircase region 3520 as compared to incomplete filling.

Figure 52:
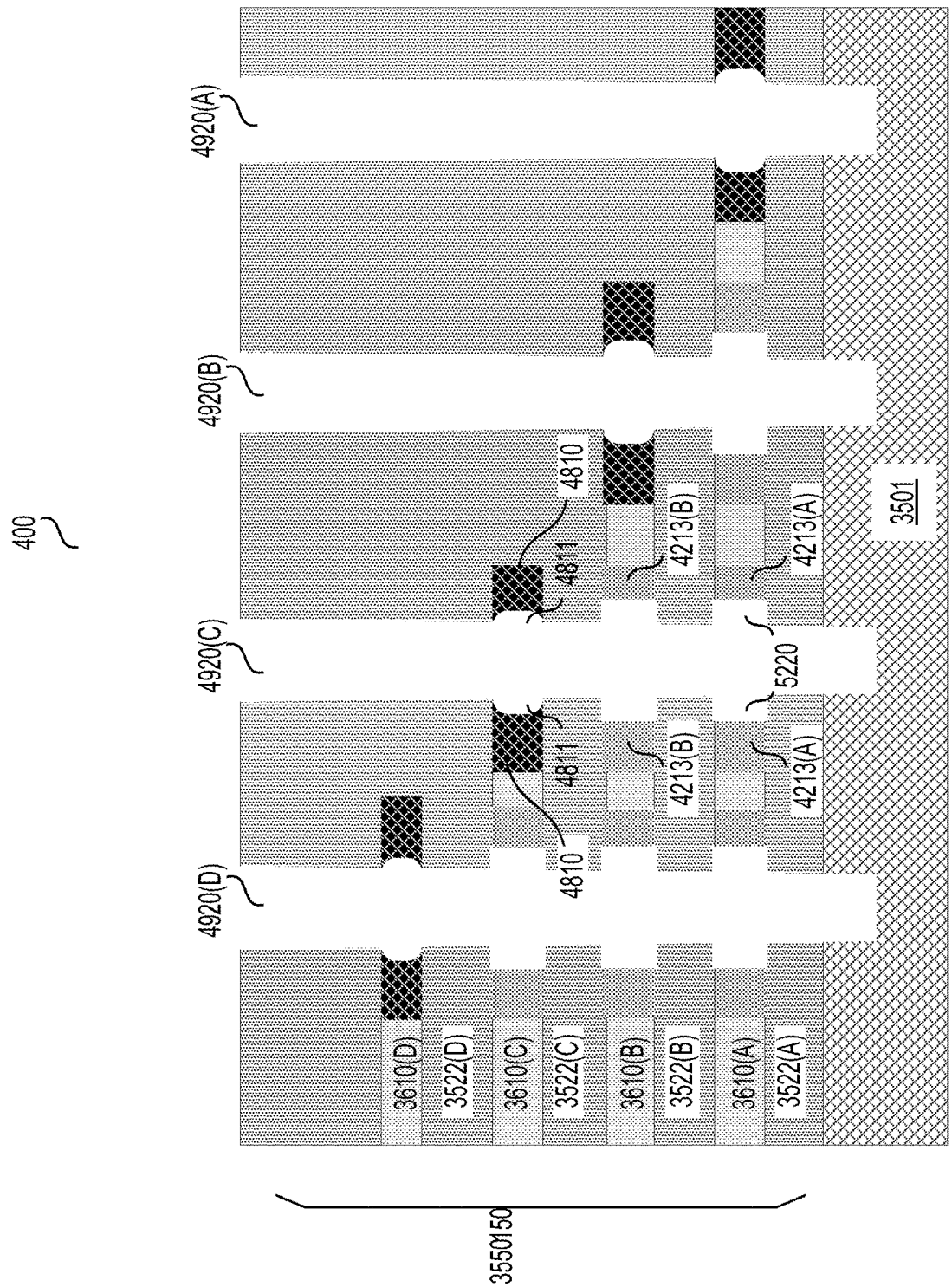

Referring to FIGS. 52 and 59A, at S5916, the second spacer layer 5110 (e.g., 5110(a)) over the sidewalls of the combined holes 4920 and the stack 3550 are removed by an etching process. Further, the second spacer layer 5110 (e.g., the portions 5110(b) that fill the recesses 4811) is removed to expose the remaining sacrificial portions 4810 by an etching process. The recesses 4811 are also exposed. In an example, a part of the portions 5113 is removed, and recesses 5220 are formed in the etching process. An etching process that selectively etches the second spacer layer 5110 (e.g., silicon oxide) can be performed. The remaining portions 5113 of the second spacer layer 5110 that are between the respective insulating layers 3522 form the first insulating structures 4213 shown in FIG. 46.

Figure 53:
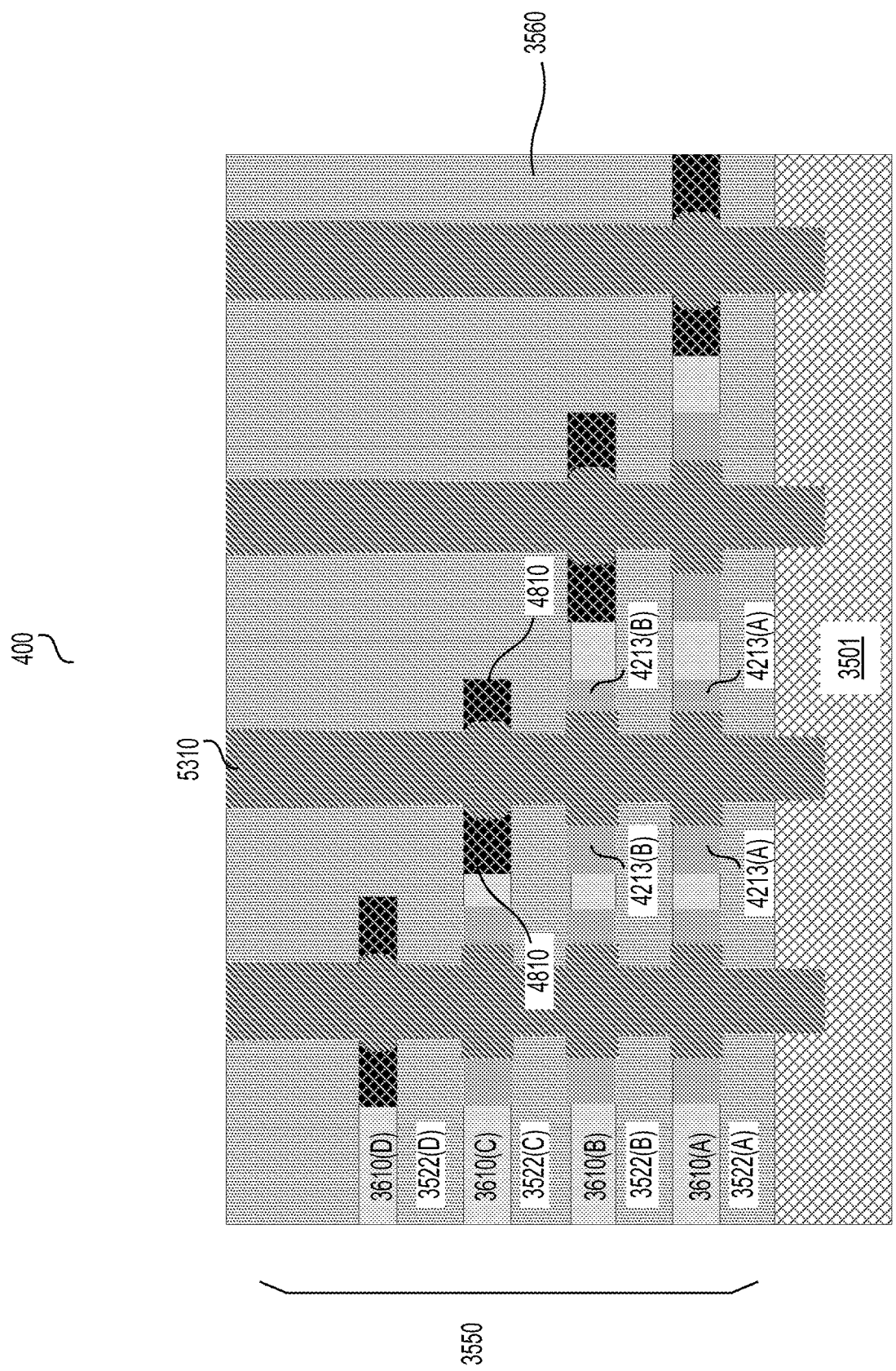

Referring to FIGS. 53 and 59A, at S5918, the combined holes 4920 can be filled with a sacrificial layer 5310 (also referred to as a second sacrificial layer). In an example, the sacrificial layer 5310 completely fills the combined holes 4920. Further, the sacrificial layer 5310 fills the recesses 4811 and 5220.

The sacrificial layer 5310 can be formed of any suitable materials, such as polysilicon, carbon (C), or the like. In an example, a material is selected for the sacrificial layer 5310 such that an etch rate of the sacrificial layer 5310 is different from the etch rate of the sacrificial layer 4710. The sacrificial layer 5310 can be formed using any suitable deposition techniques, such as CVD, PVD, ALD, an e-beam evaporation, a sputtering, a diffusion, or any combination thereof. In some embodiments, a CMP is performed to remove the sacrificial layer 5310 deposited over the stack 3550.

Figure 54:
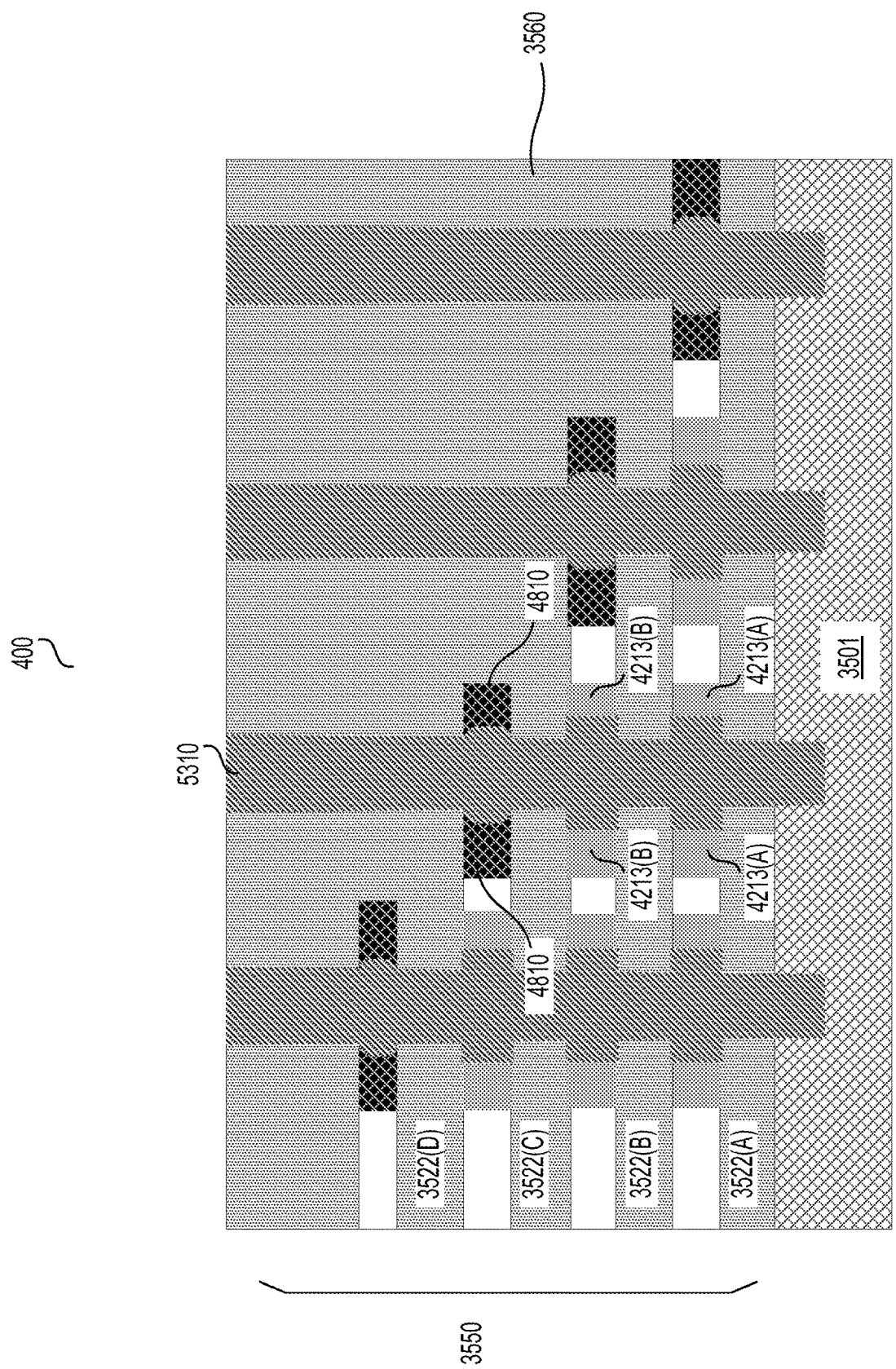
Figure 55:
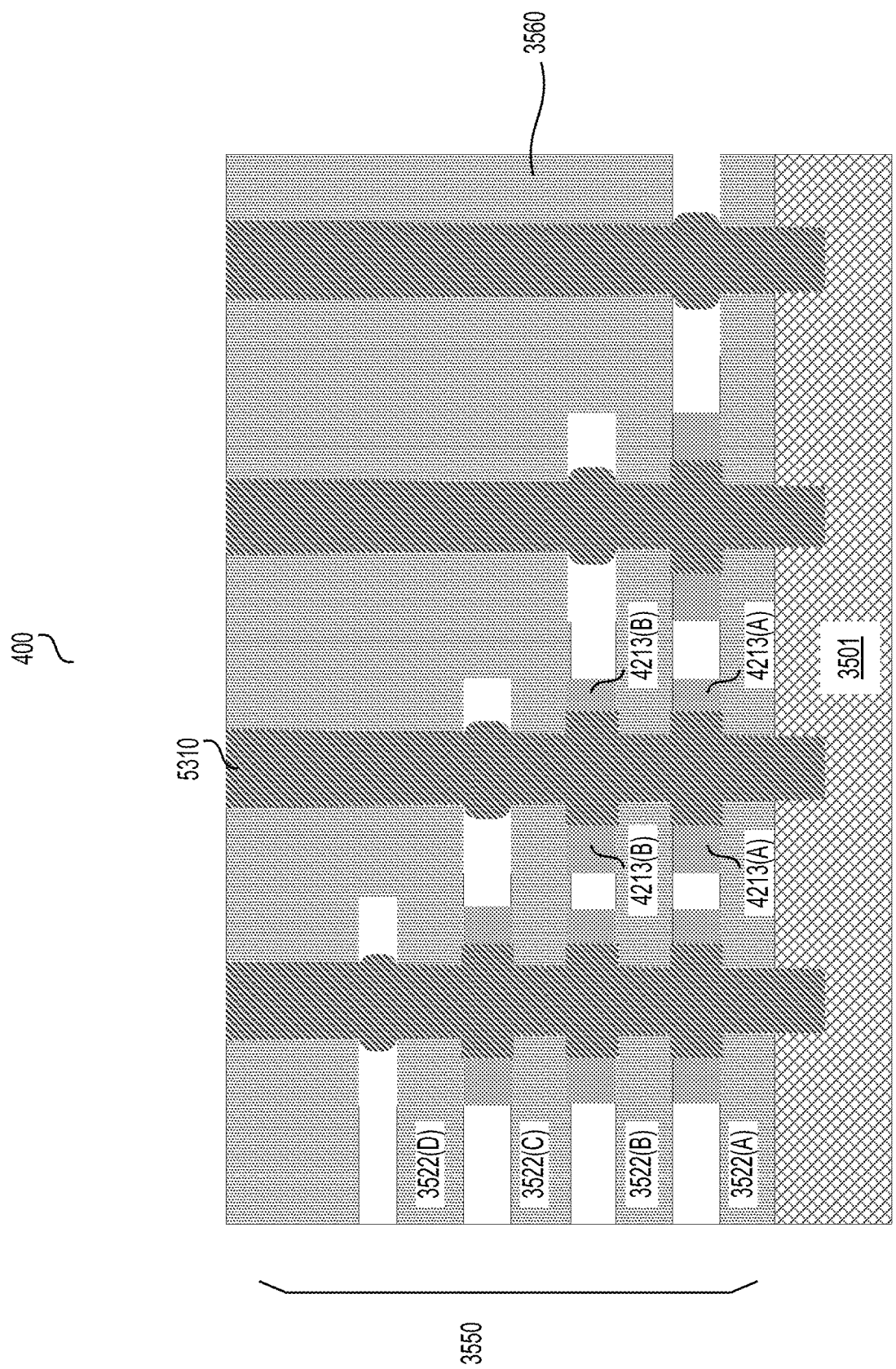

Referring to FIGS. 54, 55, and 59A, at S5920, the sacrificial layers 3610 and the remaining sacrificial portions 4810 are removed by an etching process. Referring to FIG. 54, the sacrificial layers 3610 are removed. Referring to FIG. 55, the remaining sacrificial portions 4810 are removed. When the sacrificial layers 3610 are removed, the sacrificial layer 5310 that fills the second holes 4920 and the second recessed regions 5050 support the stack of insulating layers 3522 in the staircase region 3520.

Figure 56:
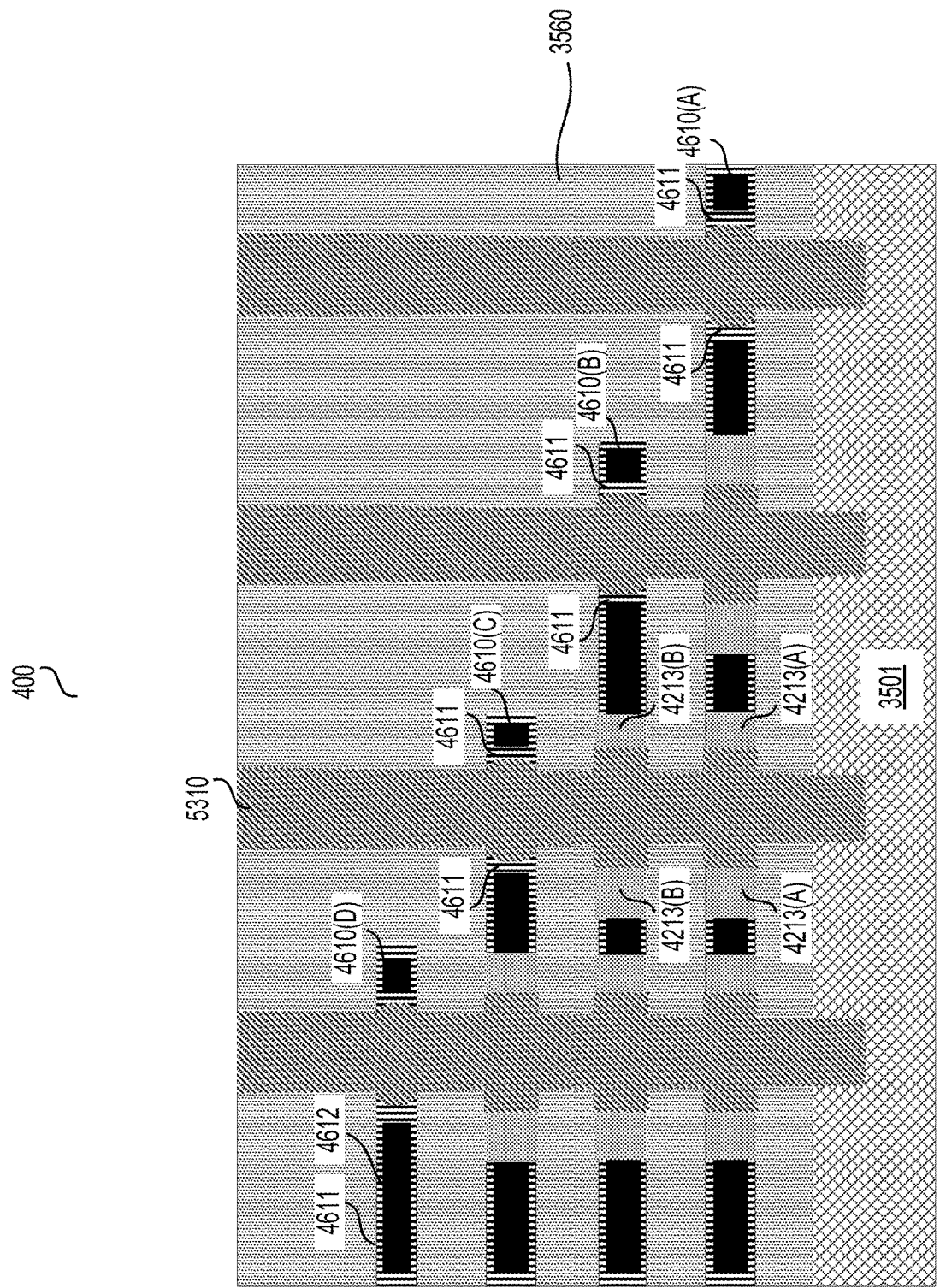

Referring to FIGS. 56 and 59B, at S5922, the gate layers 4610 (e.g., 4610(A)-4610(D)) including the metal layers 4612 and the respective high-k insulating layers 4611 are formed. In an example, the metal layer 4612 is formed of W.

Figure 57:
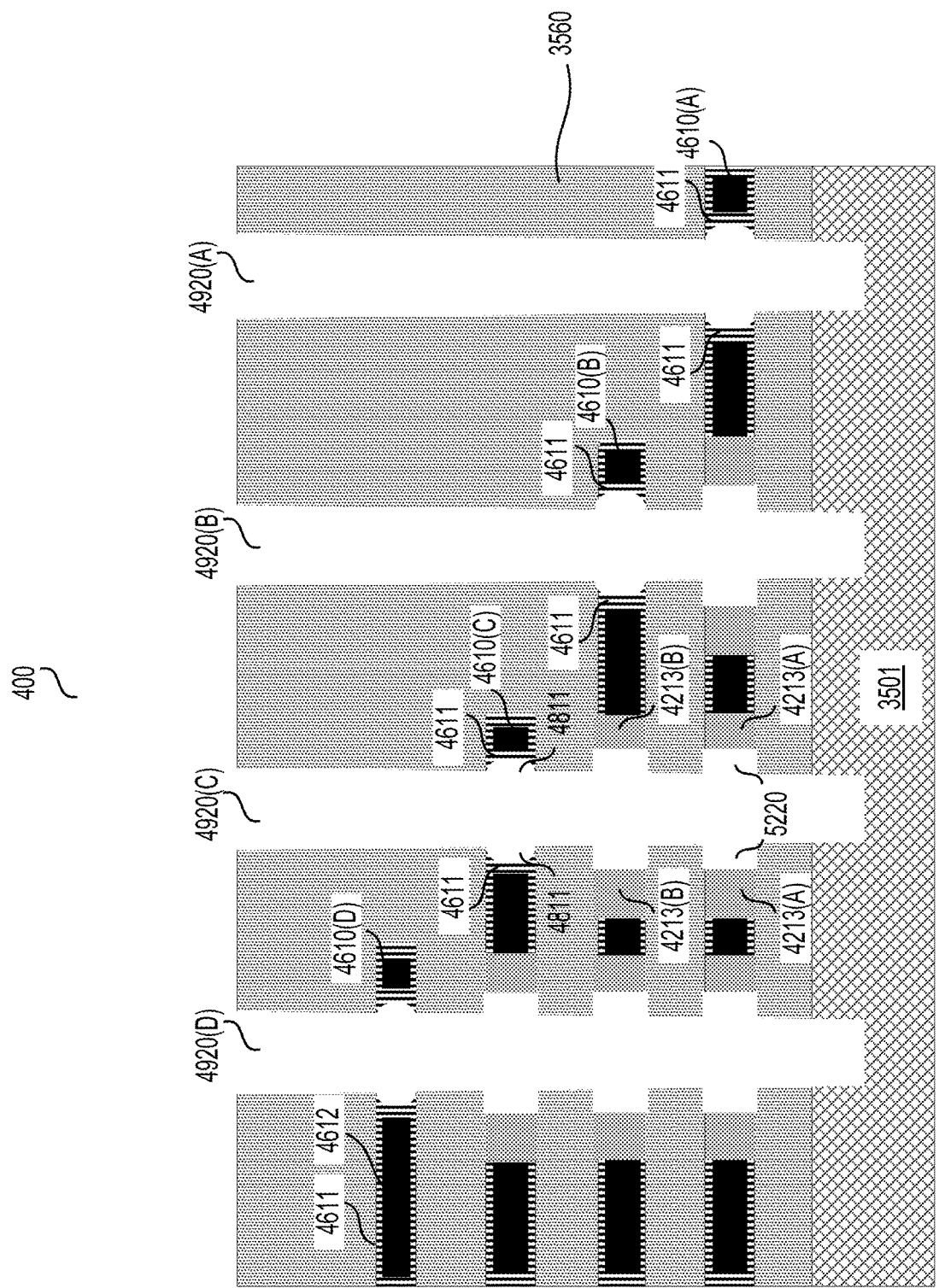

Referring to FIGS. 57 and 59B, at S5924, the sacrificial layer 5310 is removed to expose the combined holes 4920 and the recesses 4811 and 5220, for example, by an etching process. Portions of the high-k insulating layers 4611 that are adjacent to the combined holes 4920 are also exposed.

Figure 58:
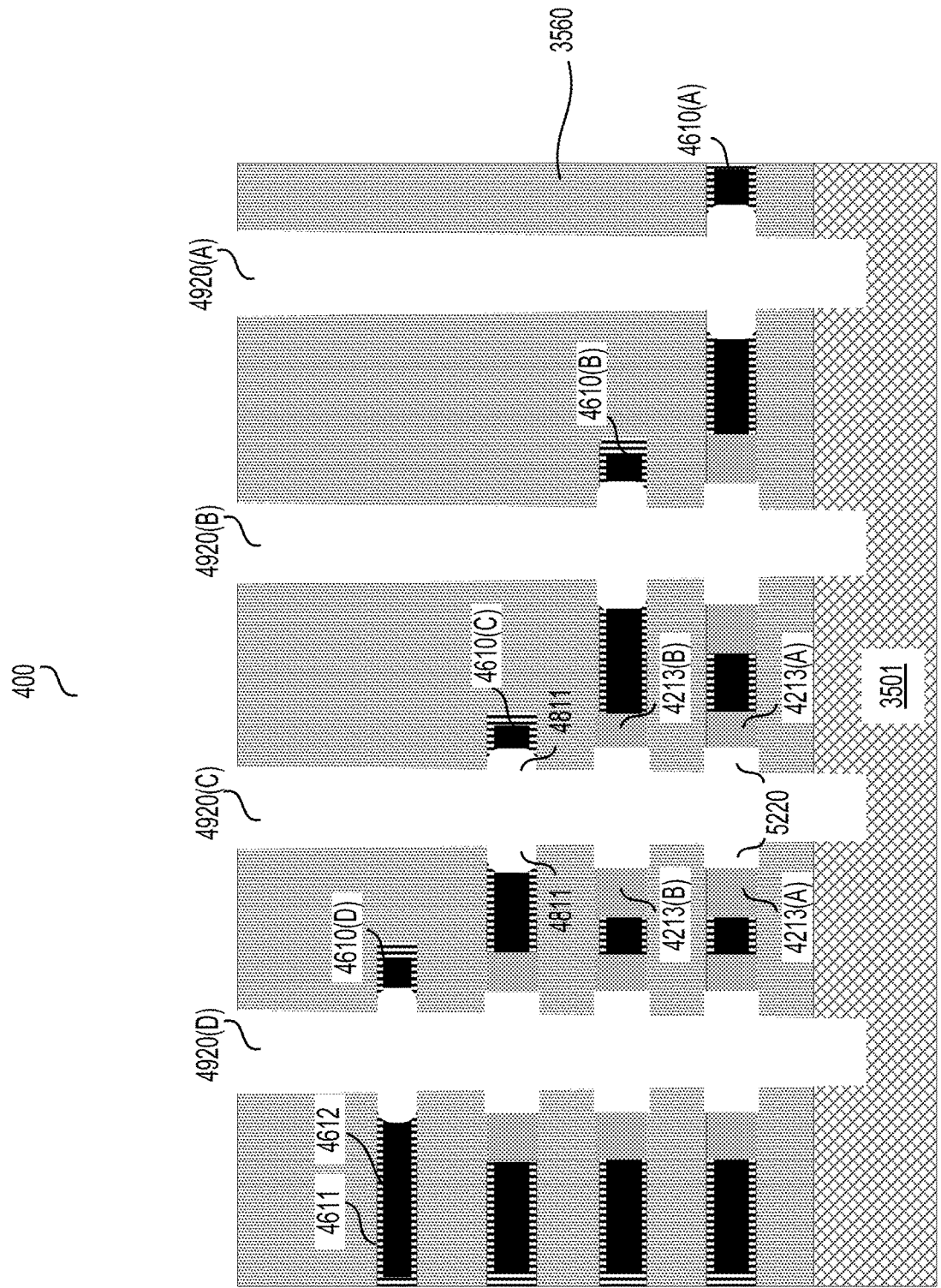

Referring to FIGS. 58 and 59B, at S5926, the portions of the high-k insulating layers 4611 that are adjacent to the combined holes 4920 are removed, for example, by an etching process (e.g., a wet etching process, a dry etching process, or a combination thereof), and thus electrical connections between the conductive structures 4420 and the respective gate layers 4610 can be formed subsequently.

Referring to FIGS. 46 and 59B, at S5928, the combined holes 4920 can be filled with metallic material(s) to form the conductive structure 4420. In an example, the metallic material(s) completely fill the combined holes 4920. Further, the metallic material(s) fill the recesses 4811 to conductively connect to the respective gate layers 4610. The metallic material(s) fill the recesses 5220 to form the protrusions 4410 of the conductive structure 4420. In an example, the metallic material(s) include W. Referring to FIG. 46, the combined DCH-CT structures 3530 (e.g., 3530(A)-3530(D)) of the semiconductor device 400 are formed. In some embodiments, a CMP is performed to remove the metallic material(s) deposited over the stack 3550.

The process 5900 can be suitably adapted to include additional step(s), to omit step(s), and/or to modify step(s). Core structures within the metal pillars 4412 can be formed. For example, middle portions of the respective metal pillars 4412 are removed by an etching process followed by depositing an insulating material (e.g., an oxide layer) to form the core structures. As described above, the core structures can include insulating material(s), such as silicon oxide and are referred to as oxide cores.

In an example, referring back to FIG. 52, at S5916, the recesses 5220 are not formed in the etching process, and thus no protrusions 4410 are formed and the conductive structure 4420 does not include the protrusions 4410.

In an example, steps S5912, S5914, and S5916 corresponding to FIGS. 50-52 can be replaced by an oxidization step. Following S5910 described with reference to FIG. 49, portions of the sacrificial layers 3610 (e.g., 3610(A)-3610(B)) that are adjacent to the second holes 4910 (e.g., 4910(C)) can be oxidized to form the first insulating structures 4213 (e.g., 4213(A)-4213(B)) directly. For example, the sacrificial layers 3610 include silicon nitride, and can be oxidized into the first insulating structures 4213 that include SiON. The combined holes 4920 can be filled with conductive (e.g., metallic) material(s) to form the conductive structure 4420. The conductive structure 4420 does not include the protrusions 4412.

In an example, the semiconductor device 400 is manufactured by the process 5900 described with reference to FIGS. 46-58 over the insulating layer 3501 and the substrate 3502.

In an example, the semiconductor device 400 is manufactured over a sacrificial substrate. The stack 3550 is formed over the sacrificial substrate instead of the insulating layer 3501, and the process 5900 can be adapted accordingly. For example, after S5928 where the conductive structures 4420 are formed, the sacrificial substrate can be removed by an etching process. A deposition process can be used to form the insulating layer 3501 to cover the contact structures 3530. Further, a deposition process, such as an epitaxial deposition can be applied to form the semiconductor layer 3502 (e.g., a polysilicon layer) over the insulating layer 3501.

Various embodiments in the disclosure can be suitably adapted to include additional step(s), to omit step(s), and/or to modify step(s). Various embodiments in the disclosure can be suitably combined in any suitable order to manufacture a semiconductor device (or a memory device), such as the semiconductor device 100, 200, 300, or 400.

According to some embodiments of the disclosure, a single structure (e.g., (i) 130(C) in the semiconductor device 100 or 200 or (ii) 3530(C) in the semiconductor device 300 or 400) that combines a dummy channel and a contact can be formed in a staircase region of a semiconductor device. The single structure can serve as a contact to a corresponding gate layer (e.g., 1710(C), 2010(C), 3510(C), or 4610(C)) and (ii) as a dummy channel that supports the staircase region during a gate-last process.

The single structure can be adapted to have different structures. In an example, the single structure further combines a staircase structure with the dummy channel and the contact to form the combined stair-DCH-CT structure, such as 130(C) shown in FIG. 1A or FIG. 20. In another example, the single structure is the combined DCH-CT structure, such as 3530(C) shown in FIG. 35 or FIG. 46, that is formed through a stair-step.

Both structures (e.g., 130 and 3530) combine multiple structures (e.g., the dummy structures and the contacts), and offer advantageous solutions to the challenges described above. The combined DCH-CT structures 130 or 3530 significantly simplify a structure of a vertical memory device by combining multiple different structures into a single structure, thus reducing a footprint of the dummy channel and the contact. The manufacturing process and the design of the single structure can be simplified and more flexible, reducing a number of manufacturing steps and cost.

As the multiple structures are combined into the single structure, design windows among the multiple structures are relaxed or no longer need to be considered, such as design windows associated with CTs and DCHs (e.g., a distance between a CT and a DCH, a distance between two DCHs, and/or the like). In the case of the combined stair-DCH-CT structure 130, a design window associated with CTs and SS (e.g., CTs are to be landed on respective SS to connect to respective gate layers) is relaxed or no longer needs to be considered.

Further, conductive material(s), such as metallic material(s) (e.g., W) are filled in the combined DCH-CT structures 130 or 3530. As the conductive material(s), such as the metal material(s) (e.g., W) have a larger Young's modulus than material(s) (e.g., insulating material(s)) used in dummy structures in a related technology, the combined DCH-CT structures 130 or 3530 can provide stronger support and mitigate bending of the gate layers. Further, the combined DCH-CT structures 130 or 3530 are formed on a face side above a substrate or a sacrificial substrate, and thus the process is performed on one side.

The combined stair-DCH-CT structure 130 can be used in different semiconductor devices. In an example, the combined stair-DCH-CT structure 130 is used in the semiconductor device 100, such as shown in FIG. 1A, where the gate layers 1710 of the semiconductor device 100 do not include a high-k insulating layer. In another example, the combined stair-DCH-CT structure 130 is used in the semiconductor device 200, such as shown in FIG. 20, where the gate layers 2010 of the semiconductor device 200 include a high-k insulating layer.

The combined stair-DCH-CT structure 3530 can be used in different semiconductor devices. In an example, the combined DCH-CT structure 3530 is used in the semiconductor device 300, such as shown in FIG. 35, where the gate layers 3510 of the semiconductor device 300 do not include a high-k insulating layer. In another example, the combined DCH-CT structure 3530 is used in the semiconductor device 400, such as shown in FIG. 46, where the gate layers 4610 of the semiconductor device 400 include a high-k insulating layer.

As described above, the semiconductor devices 100, 200, 300, and 400 can include other components, such as memory cell arrays in a core region, peripheral circuitry, pad structures, and/or the like.

Figure 60:
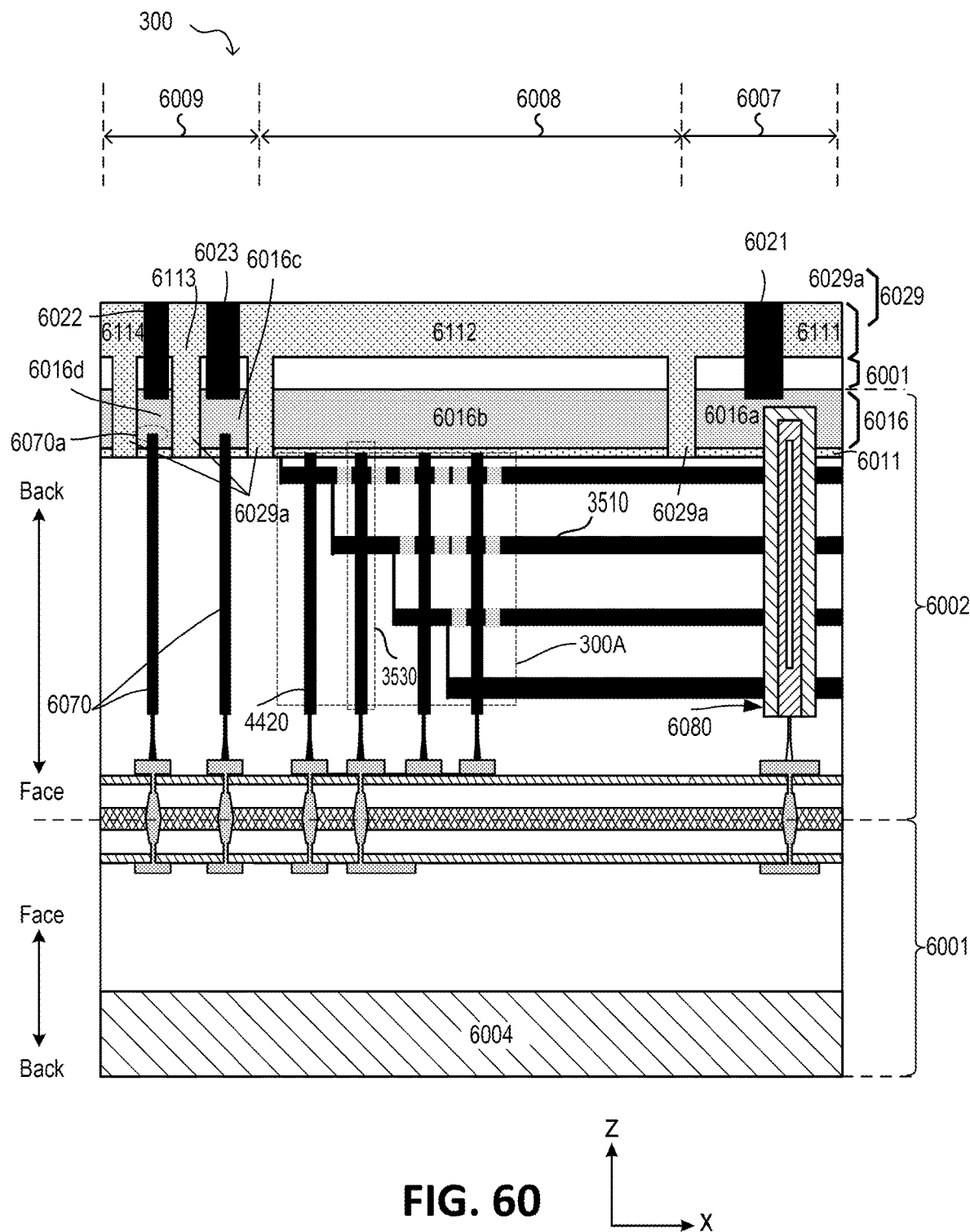
FIG. 60 shows a cross-sectional view of a semiconductor device according to an exemplary embodiment of the disclosure.

FIG. 60 shows a cross-sectional view of a semiconductor device, such as the semiconductor device 300, according to some embodiments of the disclosure. The semiconductor device 300 includes two dies that are bonded face to face. Pad structures are formed on a back side of one of the two dies.

The semiconductor device 300 includes an array die 6002 and a CMOS die 6001 bonded face to face. In some embodiments, the semiconductor device 300 can include multiple array dies and a CMOS die. The multiple array dies and the CMOS die can be stacked and bonded together. The CMOS die is respectively coupled to the multiple array dies, and can drive the respective array dies in a similar manner.

The array die 6002 includes regions 6007-6009 that are separated and electrically isolated by second isolation structures 6029*a* of an insulating layer 6029. The insulating layer 6029 is disposed on the back side of the array die 6002. Memory cell arrays can be formed in the region 6007. The region 6007 can be referred to as a core region 6007. The region 6008 can be referred to as a staircase region 6008 and can be used to facilitate making connections to, for example, gates of the memory cells in the memory cell arrays, gates of select transistors, and the like. The gates of the memory cells in the memory cell arrays correspond to the gate layers (or word lines) for a NAND memory architecture. The region 6008 includes the portion 300A of the semiconductor device 300. The conductive structure 4420, the combined DCH-CT structures 3530, and the gate layer 3510 in the portion 300A are labeled in FIG. 60. For purposes of clarity, other structures in the portion 300A are not labeled. Detailed descriptions of the portion 300A are provided with reference to FIG. 35.

The region 6009 can provide space for structures 6070 that are used for electrical connection. The CMOS die 6001 includes a substrate 6004, and the peripheral circuitry formed on the substrate 6004.

Pad structures 6021-6023 are formed on a back side of one of the two dies, such as the array die 6002, in a stack of layers.

The stack of layers on the back side of the array die 6002 includes a first etch stop layer 6011, a semiconductor layer 6016, an insulating layer 6001, and an insulating layer 6029 that are stacked over the back side of the array die 6002. In an example, the first etch stop layer 6011 is the insulating layer 3501. Further, the insulating layer 6029 separates the first etch stop layer 6011, the semiconductor layer 6016, and the insulating layer 6001 into portions of the first etch stop layer 6011, semiconductor structures 6016*a*-6016*d* of the semiconductor layer 6016, and portions of the insulating layer 6001. Referring to FIG. 60, the second isolation structures 6029*a* of the insulating layer 6029 separate the first etch stop layer 6011, the semiconductor layer 6016, and the insulating layer 6001. In an example, the insulating layer 6001 is omitted.

The pad structures (e.g., 6021-6023) are formed respectively above semiconductor structures formed using the semiconductor layer 6016, such as shown by semiconductor structures 6016*a*, 6016*c* and 6016*d*. The pad structures can be separated and electrically isolated by the insulating layer 6029. Referring to FIG. 60, the insulating layer 6029 includes the second isolation structures 6029*a* and first insulating structures 6111-6114. A set of the first insulating structures 6111-6114 separate the pad structures. For example, the pad structures 6021 and 6023 are separated by the first insulating structure 6112, and the pad structures 6022 and 6023 are separated by the first insulating structure 6113.

The semiconductor structures 6016*a*-6016*d* are above respective portions of the first etch stop layer 6011. Certain pad structures (e.g., 6022-6023) can be conductively connected with one or more of the structures 6070, and certain pad structure(s) (e.g., 6021) can be configured as connections of array common source for the vertical memory cell strings 6080 in the core region 6007.

A pad structure (e.g., one of the pad structures 6022-6023) can be disposed on the back side of the first die and can be conductively coupled with the structure(s) 6070 through a semiconductor structure that is disposed between the pad structure and the structure(s) 6070. The semiconductor structure can be conductively connected with the structure(s) 6070 on the back side of the first die. Further, the pad structure is conductively coupled with the semiconductor structure.

Referring to FIG. 60, the semiconductor structure 6016*d* is disposed between the pad structure 6022 and the structure 6070. The semiconductor structure 6016*d* conductively couples the pad structure 6022 and the structure 6070. In some examples, an end 6070a of the structure 6070 protrudes into the semiconductor structure 6016d without connecting to the pad structure 6022. Accordingly, the pad structure 6022 does not connect to the structure 6070 directly. The electrical connection or coupling between the pad structure 6022 and the structure 6070 is formed using the semiconductor structure 6016d. In an example, the structures 6070 have similar structures and/or materials as the combined DCH-CT structures 3530.

Other pad structures (e.g., 6021, 6023) can have similar or identical structure and material(s) as those described for the pad structure 6022, and thus detailed descriptions are omitted for purposes of brevity.

The pad structures (e.g., 6021-6023) can include any suitable conductive materials, such as metallic material(s) (e.g., aluminum, Cu, W). In an example, the metallic material(s) used in the pad structures (e.g., 6021-6023) facilitates attachment of bonding wires. The pad structures can be formed using any suitable method, such as PVD and plating (or electroplating).

The semiconductor structures (e.g., 6016a-6016d) can include any suitable semiconductor material or a combination of semiconductor materials. In an example, the semiconductor structures (e.g., 6016a-6016d) have good conductivity.

The semiconductor structures (e.g., 6016c and 6016d) underneath the two respective pad structures (e.g., 6022-6023) are physically separated and electrically isolated by the second isolation structure (e.g., 6029a). The second isolation structure (e.g., 6029a) is disposed between the semiconductor structures (e.g., 6016c and 6016d).

In the FIG. 60 example, the pad structure 6021 is above the semiconductor structure 6016a. Thus, the pad structure 6021 is conductively connected or coupled with a source terminal of the vertical memory cell string 6080 in the region 6007 through the semiconductor structure 6016a. The semiconductor structure 6016a is disposed between the pad structure 6021 and the vertical memory cell string 6080.

In some examples, the semiconductor structure 6016a is coupled to source terminals of multiple vertical memory cell strings 6080, and can be an array common source (ACS) for the multiple vertical memory cell strings 6080. In some example, the pad structure 6021 is formed of one or more metal layers of relatively low resistivity, and when the pad structure 6021 covers a relatively large portion of the semiconductor structure 6016a, the pad structure 6021 can connect the ACS of the block of the memory cell arrays with very small parasitic resistance. The pad structure 6021 can include a portion that is configured as a pad structure for ACS to receive ACS signal from an external source. The pad structure 6021 can have any suitable metallic material(s). In an example, the pad structure 6021 is formed together with the pad structures 6022-6023 in a same process, and has identical material(s) (e.g., Al, Cu, W, and/or the like) as used in the pad structures 6022-6023.

In some examples, the region 6008 includes the portion 100A of the semiconductor device 100 instead of the portion 300A of the semiconductor device 300, and thus FIG. 60 and the description can be suitably adapted to describe the semiconductor device 100.

In some examples, the region 6008 includes the portion 200A of the semiconductor device 200 instead of the portion 300A of the semiconductor device 300, and thus FIG. 60 and the description can be suitably adapted to describe the semiconductor device 200.

In some examples, the region 6008 includes the portion 400A of the semiconductor device 400 instead of the portion 300A of the semiconductor device 300, and thus FIG. 60 and the description can be suitably adapted to describe the semiconductor device 400.

Figure 61:
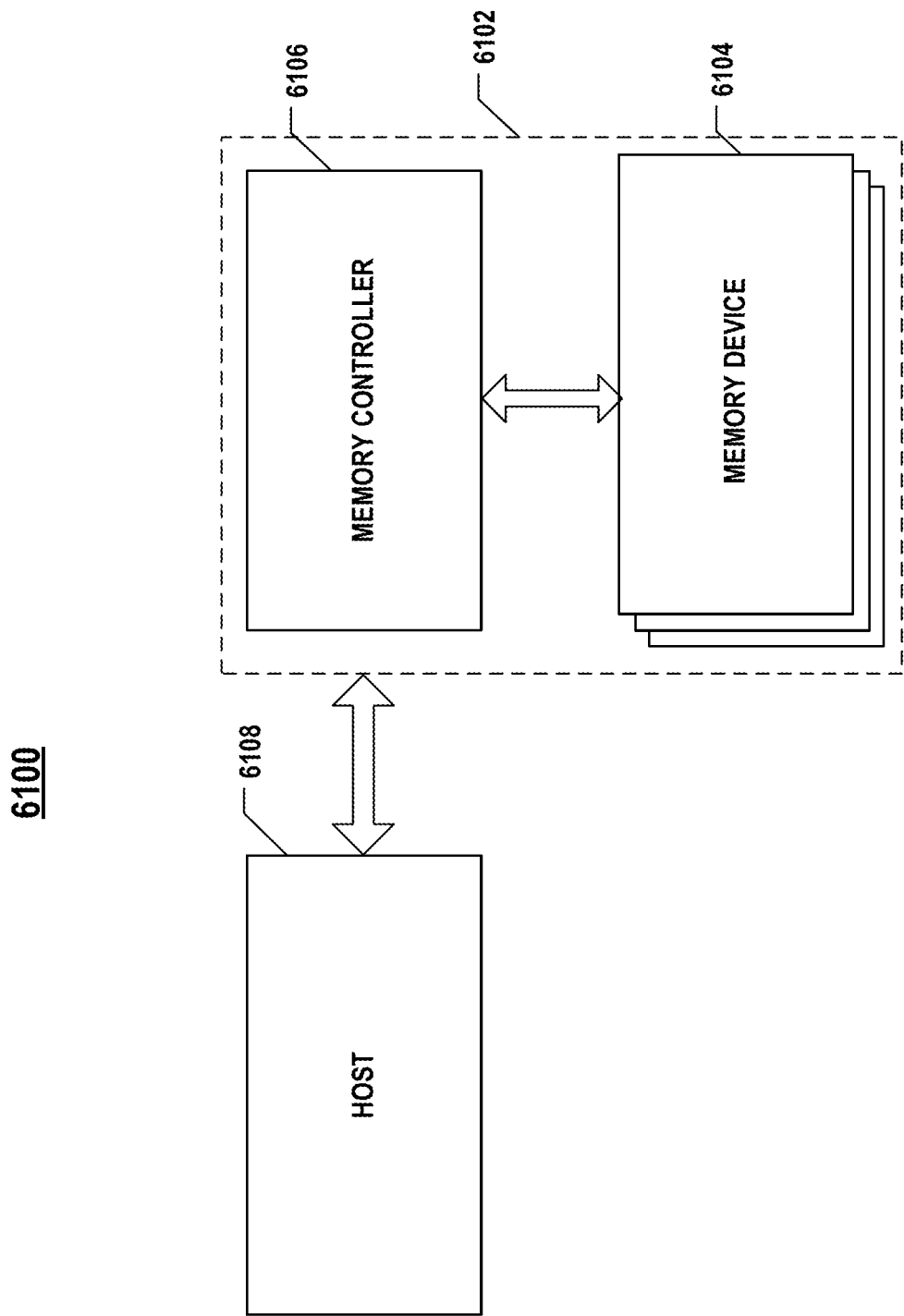
FIG. 61 illustrates a block diagram of an exemplary system 6100 having a semiconductor device, according to some aspects of the present disclosure.

FIG. 61 illustrates a block diagram of an exemplary system 6100 having a memory device, according to some aspects of the present disclosure. The system 6100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 61, the system 6100 can include a host 6108 and a memory system 6102 having one or more memory devices 6104 and a memory controller 6106. The host 6108 can be a processor of an electronic device, such as a central processing unit (CPU), or a system-on-chip (SoC), such as an application processor (AP). The host 6108 can be configured to send or receive data to or from the memory devices 6104.

The memory device 6104 can be any memory device disclosed in the present disclosure, such as the semiconductor device 100, 200, 300, or 400 that includes the respective contact structures (e.g., 130, 3530) in a staircase region. Each of the contact structures can connect the driving circuitry to one gate of the memory cells while providing support for the staircase region. Combining multiple structures (e.g., a dummy channel and a contact) into a single structure (i.e., the contact structure) can relax a design window associated with the dummy channels and the contacts, resulting in simpler structures, a reduction of manufacturing steps, and thus cost reduction.

The memory controller 6106 is coupled to the memory device 6104 and the host 6108 and is configured to control the memory device 6104, according to some implementations. The memory controller 6106 can manage the data stored in the memory device 6104 and communicate with the host 6108. In some implementations, the memory controller 6106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, the memory controller 6106 is designed for operating in a high duty-cycle environment SSDs or embedded multi-media-cards (eMMCs) used as data storage for mobile devices, such as smartphones, tablets, laptop computers, etc., and enterprise storage arrays. The memory controller 6106 can be configured to control operations of the memory device 6104, such as read, erase, and program operations.

The memory controller 6106 can also be configured to manage various functions with respect to the data stored or to be stored in memory device 6104 including, but not limited to bad-block management, garbage collection, logical-to-physical address conversion, wear leveling, etc. In some implementations, memory controller 6106 is further configured to process error correction codes (ECCs) with respect to the data read from or written to memory device 6104. Any other suitable functions may be performed by memory controller 6106 as well, for example, formatting memory device 6104. Memory controller 6106 can communicate with an external device (e.g., host 6108) according to a particular communication protocol. For example, memory controller 6106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 62B:
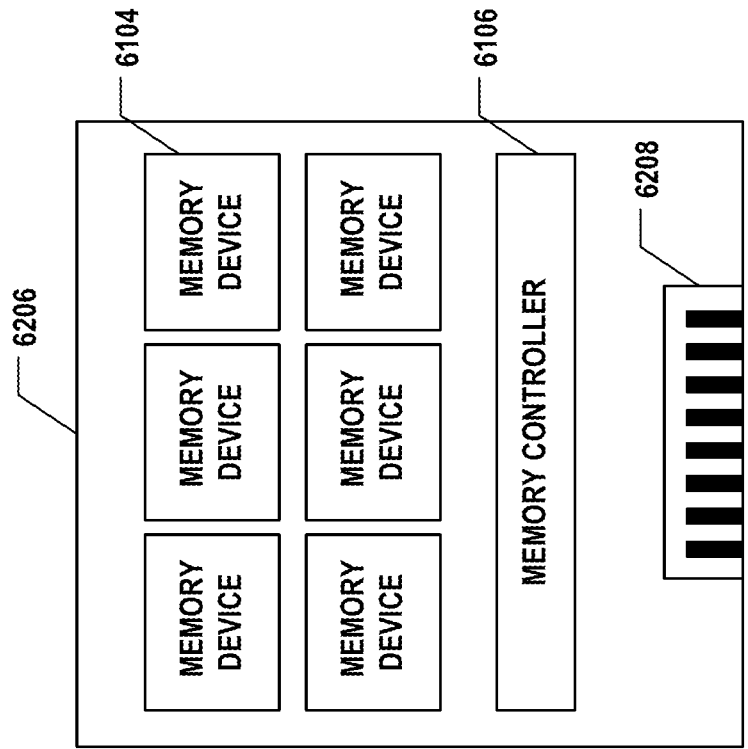
FIG. 62B illustrates a diagram of an exemplary solid-state drive (SSD) having a semiconductor device, according to an exemplary embodiment of the disclosure.
Figure 62A:
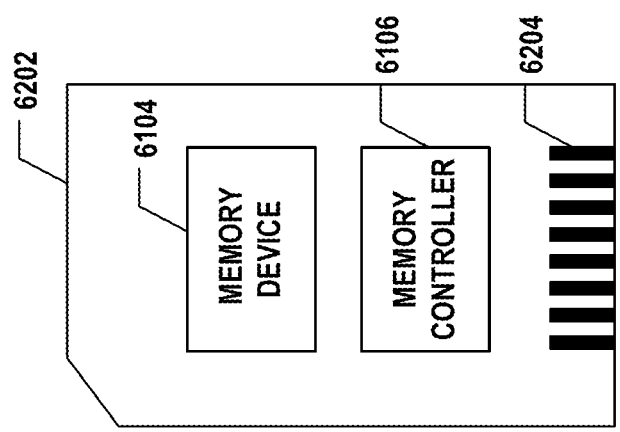
FIG. 62A illustrates a diagram of an exemplary memory card having a semiconductor device according to an exemplary embodiment of the disclosure.

Memory controller 6106 and one or more memory devices 6104 can be integrated into various types of storage devices, for example, be included in the same package, such as a universal Flash storage (UFS) package or an eMMC package. That is, memory system 6102 can be implemented and packaged into different types of end electronic products. In one example as shown in FIG. 62A, memory controller 6106 and a single memory device 6104 may be integrated into a memory card 6202. Memory card 6202 can include a PC card (PCMCIA, personal computer memory card international association), a CF card, a smart media (SM) card, a memory stick, a multimedia card (MMC. RS-MMC, MMCmicro), an SD card (SD, miniSD, microSD, SDHC), a UFS, etc. Memory card 6202 can further include a memory card connector 6204 configured to couple memory card 6202 to a host (e.g., host 6108 in FIG. 61). In another example as shown in FIG. 62B, memory controller 6106 and multiple memory devices 6104 may be integrated into an SSD 6206. SSD 6206 can further include an SSD connector 6208 configured to couple SSD 6206 to a host (e.g., host 6108 in FIG. 61). In some implementations, the storage capacity and/or the operation speed of SSD 6206 is greater than those of memory card 6202.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a stack structure comprising interleaved gate layers and insulating layers, and
 a contact structure, comprising:
 a conductive structure extending through the stack structure and forming a conductive connection with one of the gate layers,
 a core structure disposed within the conductive structure, a material of the core structure being different from a material of the conductive structure, and
 one or more insulating structures surrounding the conductive structure and electrically isolating the conductive structure from remaining ones of the gate layers.

2. The semiconductor device of claim 1, wherein the core structure extends through the stack structure.

3. The semiconductor device of claim 1, wherein the one or more insulating structures further include one or more first insulating structures,
 each of the one or more first insulating structures is disposed between an adjacent pair of the insulating layers, and
 the one or more first insulating structures are disposed on a first side of the one of the gate layers.

4. The semiconductor device of claim 1, wherein
 the one or more insulating structures further include a second insulating structure, and
 the second insulating structure extends through one or more of the gate layers that are on a second side of the one of the gate layers.

5. The semiconductor device of claim 3, wherein the conductive structure further includes protrusions,
 each of the protrusions is surrounded by a respective one of the one or more first insulating structures.

6. The semiconductor device of claim 3, wherein:
 the one or more insulating structures further include a second insulating structure, and
 the second insulating structure extends through one or more of the gate layers that are on a second side of the one of the gate layers.

7. The semiconductor device of claim 1, wherein each of the gate layers further comprises a high dielectric constant (high-k) gate insulator layer and a metal layer.

8. The semiconductor device of claim 1, wherein
 the stack structure includes pairs of gate layers and insulating layers formed along a vertical direction,
 each pair includes a gate layer and an adjacent insulating layer that is on a first side along the vertical direction,
 the pairs of gate layers and insulating layers are stacked in a stair-step form such that for each pair, an adjacent pair that is on the first side along the vertical direction extends beyond the pair along a direction that is perpendicular to the vertical direction, and
 the conductive structure forms the conductive connection with the one of the gate layers at a stair-step portion of the one of the gate layers.

9. The semiconductor device of claim 8, wherein:
 the one or more insulating structures further include one or more first insulating structures,
 each of the one or more first insulating structures is disposed between an adjacent pair of the insulating layers, and
 the one or more first insulating structures are disposed on the first side of the one of the gate layers.

10. The semiconductor device of claim 8, wherein each of the gate layers further comprises a high dielectric constant (high-k) gate insulator layer and a metal layer.

11. The semiconductor device of claim 8, wherein the contact structure further comprises a core structure disposed within the conductive structure, the core structure extending through the stack structure, and a material of the core structure being different from a material of the conductive structure.

12. A memory system, comprising:
 controller coupled with a semiconductor device; and
 the semiconductor device including:
 a stack structure comprising interleaved gate layers and insulating layers, and
 a contact structure, comprising:
 a conductive structure extending through the stack structure and forming a conductive connection with one of the gate layers,
 a core structure disposed within the conductive structure, a material of the core structure being different from a material of the conductive structure, and
 one or more insulating structures surrounding the conductive structure and electrically isolating the conductive structure from remaining ones of the gate layers.

13. The memory system of claim 12, wherein the core structure extends through the stack structure.

14. The memory system of claim 12, wherein
the one or more insulating structures further include one or more first insulating structures,
each of the one or more first insulating structures is disposed between an adjacent pair of the insulating layers, and
the one or more first insulating structures are disposed on a first side of the one of the gate layers.

15. The memory system of claim 12, wherein
the one or more insulating structures further include a second insulating structure, and
the second insulating structure extends through one or more of the gate layers that are on a second side of the one of the gate layers.

16. The memory system of claim 14, wherein
the conductive structure further includes protrusions,
each of the protrusions is surrounded by a respective one of the one or more first insulating structures.

17. The memory system of claim 14, wherein:
the one or more insulating structures further include a second insulating structure, and
the second insulating structure extends through one or more of the gate layers that are on a second side of the one of the gate layers.

18. The memory system of claim 12, wherein each of the gate layers further comprises a high dielectric constant (high-k) gate insulator layer and a metal layer.

19. The memory system of claim 12, wherein
the stack structure includes pairs of gate layers and insulating layers formed along a vertical direction,
each pair includes a gate layer and an adjacent insulating layer that is on a first side along the vertical direction,
the pairs of gate layers and insulating layers are stacked in a stair-step form such that for each pair, an adjacent pair that is on the first side along the vertical direction extends beyond the pair along a direction that is perpendicular to the vertical direction, and
the conductive structure forms the conductive connection with the one of the gate layers at a stair-step portion of the one of the gate layers.

20. The memory system of claim 19, wherein:
the one or more insulating structures further include one or more first insulating structures,
each of the one or more first insulating structures is disposed between an adjacent pair of the insulating layers, and
the one or more first insulating structures are disposed on the first side of the one of the gate layers.

* * * * *